(12) United States Patent
Hong et al.

(10) Patent No.: US 12,308,738 B2
(45) Date of Patent: May 20, 2025

(54) POWER MODULE

(71) Applicant: Delta Electronics (Shanghai) Co., Ltd., Shanghai (CN)

(72) Inventors: Shouyu Hong, Shanghai (CN); Qingdong Chen, Shanghai (CN); Xin Zou, Shanghai (CN); Mingzhun Zhang, Shanghai (CN); Jiaoping Huang, Shanghai (CN); Jinping Zhou, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 856 days.

(21) Appl. No.: 17/527,920

(22) Filed: Nov. 16, 2021

(65) Prior Publication Data

US 2022/0077772 A1   Mar. 10, 2022

Related U.S. Application Data

(63) Continuation-in-part of application No. 17/015,770, filed on Sep. 9, 2020, now Pat. No. 11,901,114.

(30) Foreign Application Priority Data

Dec. 18, 2019   (CN) .......................... 201911310057.0
Dec. 17, 2020   (CN) .......................... 202011496240.7

(51) Int. Cl.
*H01F 5/00*    (2006.01)
*H01L 25/16*   (2023.01)
(Continued)

(52) U.S. Cl.
CPC ............ *H02M 3/003* (2021.05); *H01L 25/16* (2013.01); *H02M 1/0064* (2021.05); *H02M 3/158* (2013.01)

(58) Field of Classification Search
CPC ....................................................... H01F 27/34
(Continued)

(56) References Cited

U.S. PATENT DOCUMENTS 8,225,503 B2 * 7/2012 Kariya .................. H05K 1/187
29/846
9,729,059 B1 * 8/2017 Parto ..................... H02M 3/158
(Continued)

FOREIGN PATENT DOCUMENTS

CN        108140616 A     6/2018
JP        2005129899 A    5/2005
(Continued)

*Primary Examiner* — Ronald Hinson
(74) *Attorney, Agent, or Firm* — KIRTON McCONKIE; Evan R. Witt

(57) ABSTRACT

A power module includes a substrate, at least one power unit, a first carrier plate and at least one input capacitor. The power unit is disposed on the substrate and includes at least one half-bridge circuit including a first power switch and a second power switch connected in series. A second terminal of the first power switch and a first terminal of the second power switch are connected to a node. The first carrier plate and the input capacitor are arranged between the power unit and the substrate. A first electrode of the substrate is connected with the node through the first carrier plate. A top surface of a first terminal of the input capacitor is connected with a first terminal of the first power switch, and a top surface of a second terminal of the input capacitor is connected with a second terminal of the second power switch.

10 Claims, 43 Drawing Sheets

(51) Int. Cl.
*H02M 1/00* (2006.01)
*H02M 3/00* (2006.01)
*H02M 3/158* (2006.01)

(58) Field of Classification Search
USPC .......................................................... 336/200
See application file for complete search history.

(56) References Cited

U.S. PATENT DOCUMENTS

| | | | |
|---|---|---|---|
| 10,224,143 | B2 | 3/2019 | Kneller et al. |
| 10,410,782 | B2 | 9/2019 | Otsubo et al. |
| 10,553,347 | B2 | 2/2020 | Banba et al. |
| 11,696,407 | B2 | 7/2023 | Zhang et al. |
| 2005/0212642 | A1 | 9/2005 | Pleskach et al. |
| 2007/0257761 | A1* | 11/2007 | Mano ...................... H01F 17/06 336/200 |
| 2009/0266594 | A1 | 10/2009 | Yoshikawa |
| 2011/0291786 | A1* | 12/2011 | Li ........................ H01L 23/645 336/200 |
| 2012/0043123 | A1* | 2/2012 | Takada .............. H01L 23/49822 174/262 |
| 2014/0043130 | A1 | 2/2014 | Dalmia et al. |
| 2015/0145145 | A1* | 5/2015 | Tsuyutani ............. H01L 21/561 438/126 |
| 2015/0213946 | A1 | 7/2015 | Mano et al. |
| 2016/0016479 | A1* | 1/2016 | Khaligh ............... H02M 1/4258 336/170 |
| 2016/0057863 | A1* | 2/2016 | Kyozuka ................ H01L 25/105 361/764 |
| 2016/0062428 | A1* | 3/2016 | Zeng ........................ G06F 1/26 713/300 |
| 2019/0272936 | A1 | 9/2019 | Zhang et al. |
| 2019/0279806 | A1 | 9/2019 | Darmawikarta et al. |
| 2020/0035396 | A1 | 1/2020 | Weis |
| 2020/0220474 | A1* | 7/2020 | Ji ........................ H01M 50/579 |
| 2020/0260586 | A1* | 8/2020 | Hong .................... H05K 1/181 |
| 2021/0350977 | A1* | 11/2021 | Ji ........................... H01F 27/306 |

FOREIGN PATENT DOCUMENTS

| | | |
|---|---|---|
| JP | 2013105992 A | 5/2013 |
| TW | 201445696 A | 12/2014 |
| WO | 2009050829 A1 | 4/2009 |

\* cited by examiner

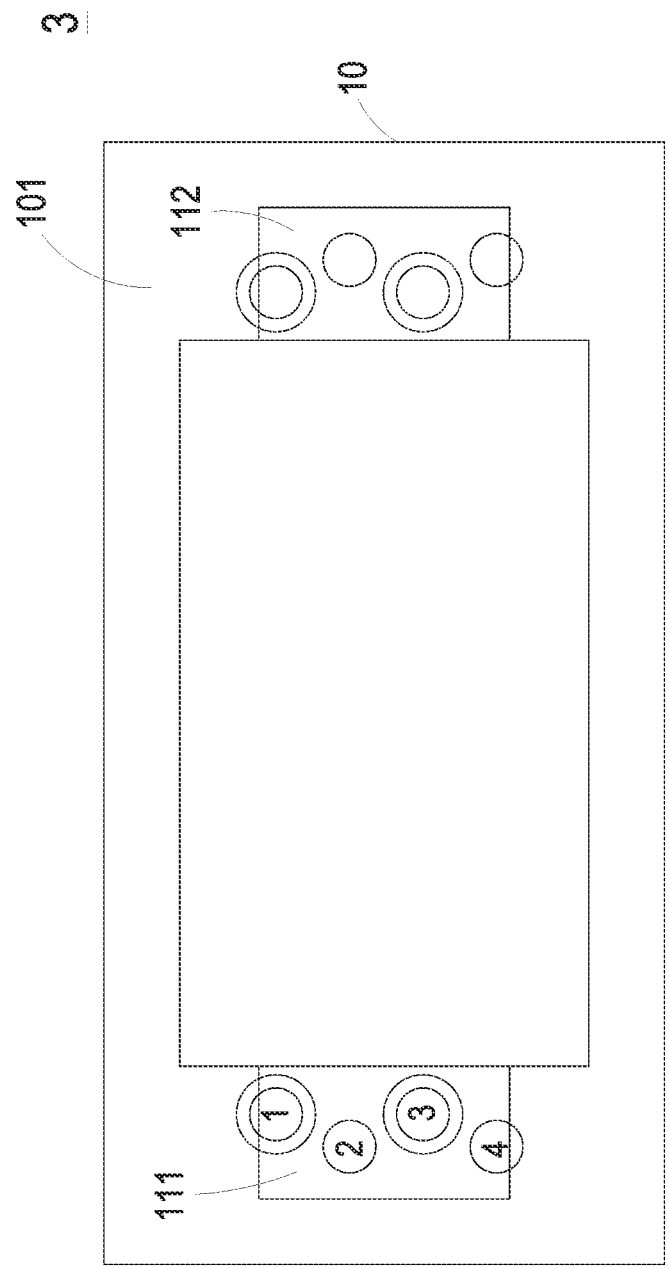

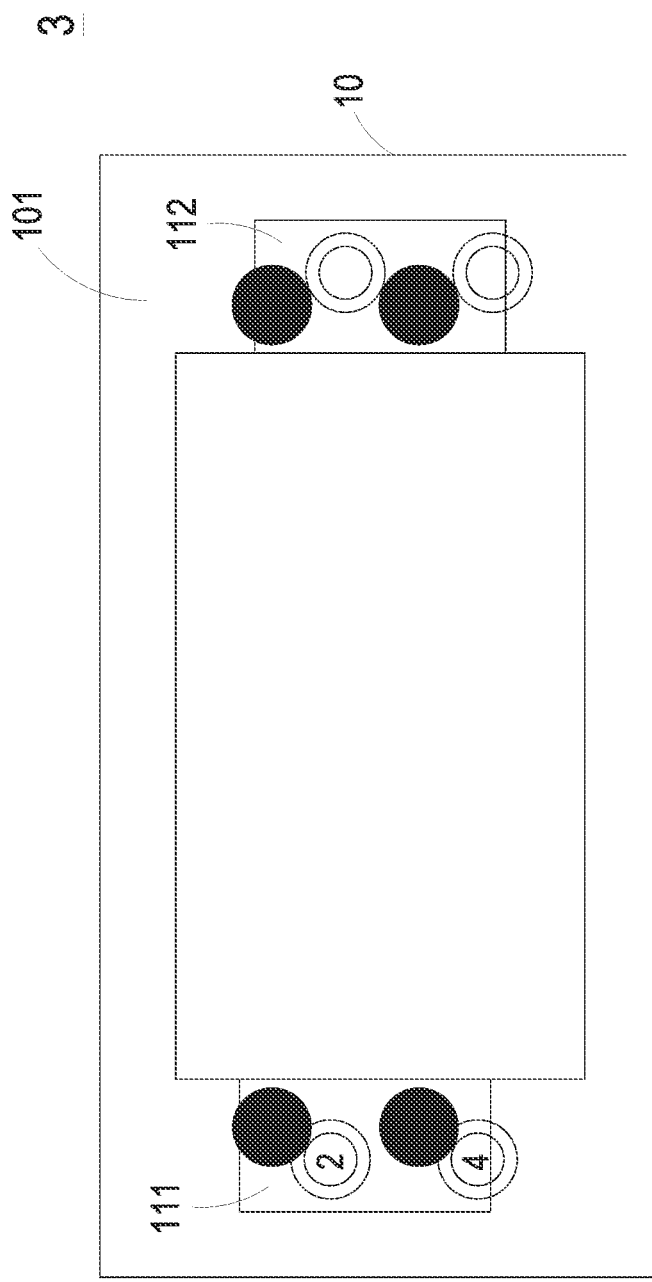

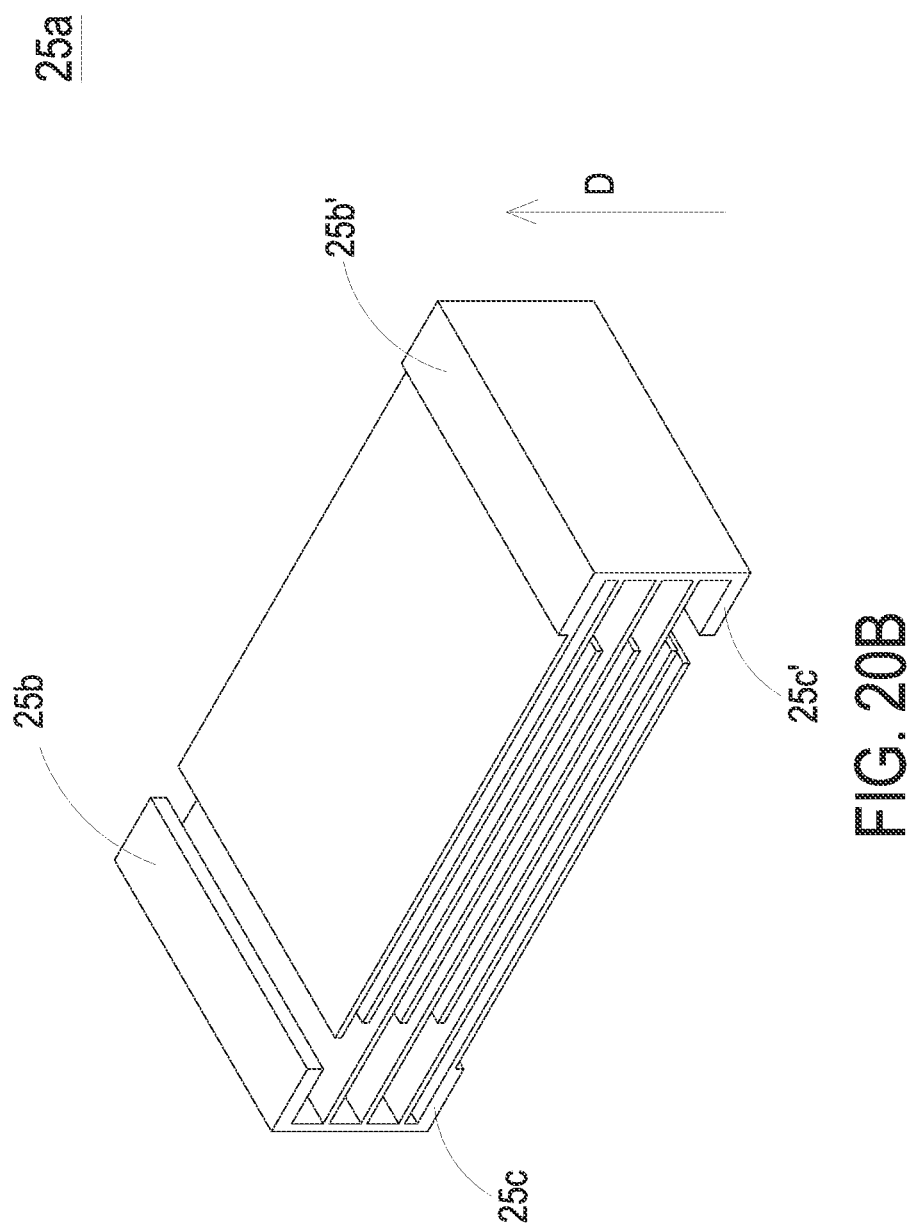

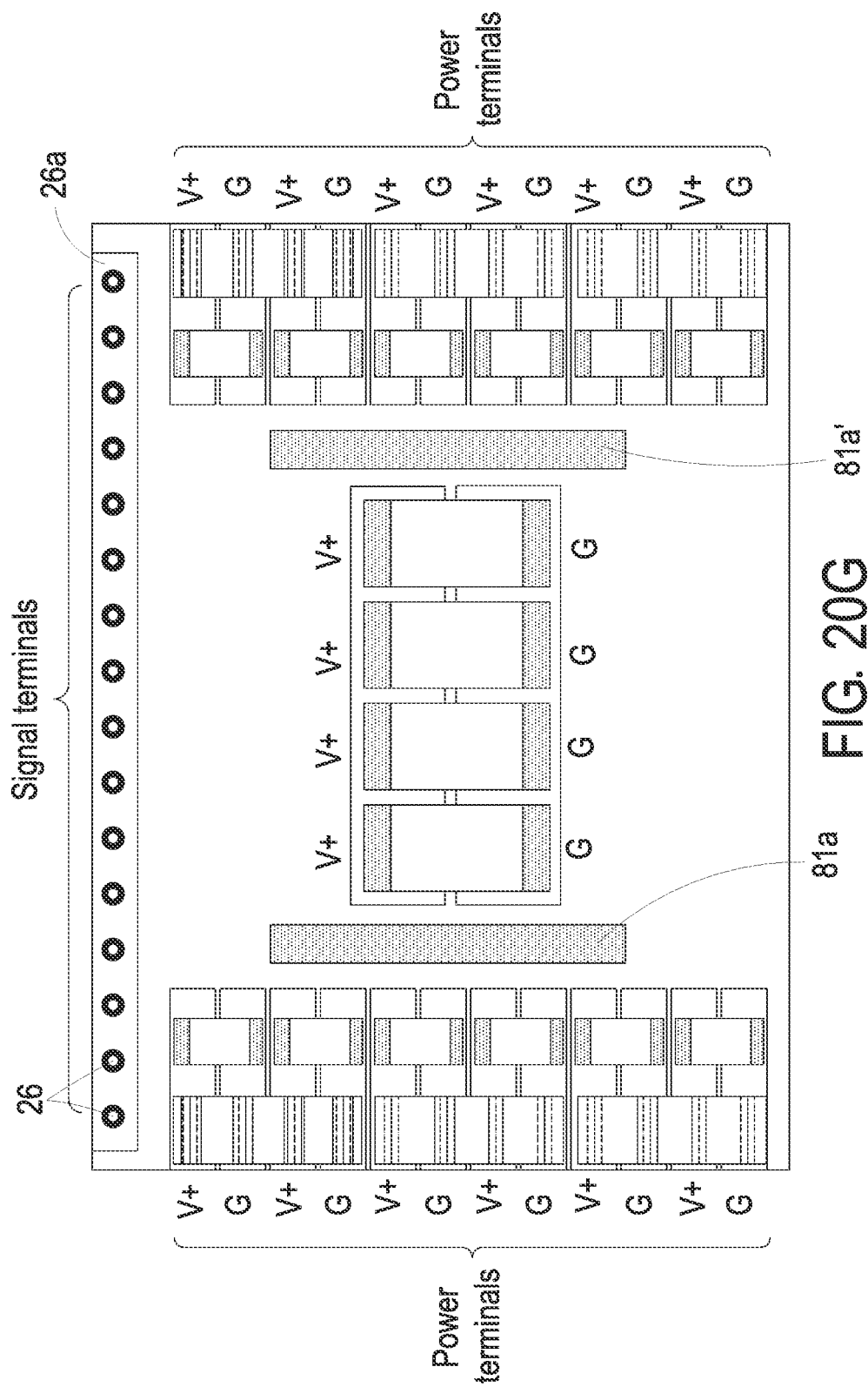

POWER MODULE

CROSS-REFERENCE TO RELATED APPLICATION

This application claims priority to China Patent Application No. 202011496240.7 filed on Dec. 17, 2020. This application is a continuation-in-part application of U.S. application Ser. No. 17/015,770 filed on Sep. 9, 2020 and entitled "SUBSTRATE, MANUFACTURING METHOD, AND POWER MODULE WITH SAME", which claims priority to China Patent Application No. 201911310057.0 filed on Dec. 18, 2019. The entire contents of the above-mentioned patent applications are incorporated herein by reference for all purposes.

FIELD OF THE INVENTION

The present disclosure relates to a substrate, and more particularly to a substrate having a passive component embedded in an insulation layer thereof and having reduced thickness and enhanced heat dissipation efficiency. The present disclosure also relates to a manufacturing method of the substrate and a power module with the substrate.

BACKGROUND OF THE INVENTION

As the demands on human intelligent lives and intelligent products are gradually increased and the Internet of Things are gradually popular, the society's demands on the information transfer and the data processing performance are gradually increased. For a centralized data processing center, the server is the most important key unit. The motherboard of the server usually includes data processing chips such as central processing units (CPU), chipset and memories, power supply apparatuses and essential peripheral components. However, as the processing capacity of the server per unit volume increases, the number and the integration of the digital chips gradually increase and the space occupancy and power consumption of the server increase. Therefore, the power converters for providing electric power to the digital chips are expected to have higher efficiency, higher power density and smaller size to achieve the power-saving purpose and the area reduction of the whole server and the whole data center.

Generally, a power converter comprises a magnetic element, a passive component, a bare chip, a capacitor and associated components. For improving the power performance, the magnetic element, the passive component, the bare chip, the capacitor and the associated components are mounted on a main printed circuit board to form a power module. For further increasing the conversion efficiency and the power density, the passive component (e.g., the magnetic element or the capacitor) and the bare chip are individually optimized. However, the technology of individually optimizing the component has limitations. That is, it is difficult to increase the efficiency, the power density and the heat dissipating capacity of the power module.

Therefore, there is a need of providing an improved substrate, a manufacturing method of the substrate and a power module with the substrate in order to overcome the drawbacks of the conventional technologies.

SUMMARY OF THE INVENTION

An object of the present disclosure provides a substrate, a manufacturing method of the substrate and a power module with the substrate. The use of the substrate can save the layout area of the system board. Moreover, thickness of the substrate is reduced, the connection impedance is reduced, and the heat dissipation efficiency is enhanced.

In accordance with an aspect of the present disclosure, a substrate is provided. The substrate includes a first insulation layer, at least one passive component, at least one first through-hole structure, a second insulation layer and a second electrode. The first insulation layer has a top surface and a bottom surface. The at least one passive component is embedded in the first insulation layer, and includes a first conducting terminal. The at least one first through-hole structure is formed in the first insulation layer and arranged beside a first side of the passive component. The first through-hole structure runs through the first insulation layer. The first through-hole structure includes a conductive part and an insulation part. The insulation part is disposed within the conductive part. The conductive part of the first through-hole structure is in contact with the first conducting terminal and formed as a first electrode. The second insulation layer is disposed on portion of the conductive part of the first through-hole structure that is close to the bottom surface of the first insulation layer. At least part of the second electrode is disposed on the second insulation layer. The second electrode is in contact with the bottom surface of the first insulation layer. A projected area of the second electrode and a projected area of the first electrode along a direction perpendicular to the top surface of the first insulation layer are at least partially overlapped with each other. The second electrode and the first electrode are different electrodes.

In accordance with another aspect of the present disclosure, a manufacturing method of a substrate is provided. The manufacturing method includes the following steps. In a step (S1), a passive component with at least one first conducting terminal is provided. In a step (S2), a first insulation layer around the passive component is formed, so that the passive component is embedded in the first insulation layer. In a step (S3), at least one first hole is formed in the first insulation layer. The first hole runs through the first conducting terminal. In a step (S4), a first metal layer is formed on a top surface of the first insulation layer, a bottom surface of the first insulation layer and an inner wall of the first hole. In a step (S5), a hole-plugging process is performed to fill an insulation material in the first hole, and a removing process is performed to remove a portion of the first metal layer, so that a first through-hole structure and a wiring layer are produced. The first through-hole structure includes a conductive part and an insulation part. The insulation part is disposed within the conductive part. The wiring layer is separated from the conductive part of the first through-hole structure and formed on the bottom surface of the first insulation layer. The conductive part of the first through-hole structure is in contact with the first conducting terminal and formed as a first electrode. In a step (S6), a second insulation layer is formed on portion of the conductive part of the first through-hole structure that is close to the bottom surface of the first insulation layer. The second insulation layer covers the portion of the conductive part of the first through-hole structure. In a step (S7), a second metal layer is formed on the second insulation layer to increase a thickness of the wiring layer. The second metal layer and the wiring layer are collaboratively formed as a second electrode. The second electrode is in contact with the bottom surface of the first insulation layer. A projected area of the second electrode and a projected area of the first electrode along a direction perpendicular to the top surface of the first insulation layer are at least partially overlapped with each other. The second electrode and the first electrode are different electrodes.

In accordance with a further aspect of the present disclosure, a power module is provided. The power module includes a substrate and at least one power unit. The substrate includes a first insulation layer, at least one passive component, at least one first through-hole structure, a second insulation layer and a second electrode. The first insulation layer has a top surface and a bottom surface. The at least one passive component is embedded in the first insulation layer, and includes a first conducting terminal. The at least one first through-hole structure is formed in the first insulation layer and arranged beside a first side of the passive component. The first through-hole structure runs through the first insulation layer. The first through-hole structure includes a conductive part and an insulation part. The insulation part is disposed within the conductive part. The conductive part of the first through-hole structure is in contact with the first conducting terminal and formed as a first electrode. The second insulation layer is disposed on portion of the conductive part of the first through-hole structure that is close to the bottom surface of the first insulation layer. At least part of the second electrode is disposed on the second insulation layer. The second electrode is in contact with the bottom surface of the first insulation layer. A projected area of the second electrode and a projected area of the first electrode along a direction perpendicular to the top surface of the first insulation layer are at least partially overlapped with each other. The second electrode and the first electrode are different electrodes. The at least one power unit is disposed on the substrate. The power unit includes at least one half-bridge circuit. The half-bridge circuit includes a first power switch and a second power switch, which are connected with each other in series. A second terminal of the first power switch and a first terminal of the second power switch are connected to a node, and the node is connected to the first electrode.

In accordance with a further aspect of the present disclosure, a power module is provided. The power module includes a substrate, at least one power unit, a first carrier plate and at least one input capacitor. The substrate includes a first insulation layer, at least one passive component, at least one first through-hole structure, a second insulation layer, a first electrode and a second electrode. The first insulation layer has a top surface and a bottom surface. The at least one passive component is embedded in the first insulation layer, and includes a first conducting terminal. The at least one first through-hole structure is formed in the first insulation layer and arranged beside a first side of the passive component. The first through-hole structure runs through the first insulation layer. The first through-hole structure includes a conductive part and an insulation part. The insulation part is disposed within the conductive part. The conductive part of the first through-hole structure is in contact with the first conducting terminal and formed as the first electrode. The second insulation layer is disposed on portion of the conductive part of the first through-hole structure that is close to the bottom surface of the first insulation layer. At least part of the second electrode is disposed on the second insulation layer. The second electrode is in contact with the bottom surface of the first insulation layer. A projected area of the second electrode and a projected area of the first electrode along a direction perpendicular to the top surface of the first insulation layer are at least partially overlapped with each other. The second electrode and the first electrode are different electrodes. The at least one power unit is disposed on the substrate. The power unit includes at least one half-bridge circuit. The half-bridge circuit includes a first power switch and a second power switch connected in series. A second terminal of the first power switch and a first terminal of the second power switch are connected to a node. The first carrier plate is disposed between the power unit and the substrate. The first electrode is connected to the node through the first carrier plate. The at least one input capacitor includes a first terminal and a second terminal. A top surface of the first terminal of the at least one input capacitor is connected with a first terminal of the first power switch, a top surface of the second terminal of the at least one input capacitor is connected with a second terminal of the second power switch, and the at least one input capacitor is disposed between the power unit and the substrate.

The beneficial effects of the present disclosure are that the present disclosure provides a substrate, a manufacturing method of the substrate and a power module with the substrate. The first electrode connected with the node between the first power switch and the second power switch is disposed on the top surface of the first insulation layer of the substrate. Consequently, it is not necessary to retain a space on the system board for connecting the first electrode with the node. In such way, the layout area of the system board is saved. Moreover, since the node between the first power switch and the second power switch is a jumper point, the use of the substrate can avoid the influence of electromagnetic interference effectively. The passive component is embedded in the first insulation layer of the substrate. The first conducting terminal and the second conducting terminal of the inductor are protruded along the horizontal direction and arranged between the top surface and the bottom surface of the main body of the inductor. Since the thickness of the first insulation layer is small, the substrate is thin. Moreover, since the second electrode is in contact with the bottom surface of the first insulation layer, the thickness of the substrate is further reduced and the connection impedance is reduced.

The above contents of the present disclosure will become more readily apparent to those ordinarily skilled in the art after reviewing the following detailed description and accompanying drawings.

BRIEF DESCRIPTION OF THE DRAWINGS

FIGS. 15A and 15B are schematic horizontally cross-sectional views illustrating a third example of the hole-drilling process in the second removing step of the method of manufacturing the substrate according to the embodiment of the present disclosure;

FIG. 20B is a schematic perspective view illustrating an input capacitor between a first carrier plate and the substrate of the power module of FIG. 20A;

FIG. 20G is a cross-sectional view illustrating the power module of FIG. 20F and taken along the line c2-c2';

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

The present disclosure provides a substrate. The substrate includes a first insulation layer, at least one passive component, at least one first through-hole structure, a second insulation layer and a second electrode. The first insulation layer has a top surface and a bottom surface. The at least one passive component is embedded in the first insulation layer. Each passive component includes a first conducting terminal. The at least one first through-hole structure is formed in the first insulation layer and arranged beside a first side of the passive component. The first through-hole structure runs through the first insulation layer. The first through-hole structure includes a conductive part and an insulation part. The insulation part is disposed within the conductive part. The conductive part of the first through-hole structure is in contact with the first conducting terminal and formed as a first electrode. The second insulation layer is disposed on portion of the conductive part of the first through-hole structure that is close to the bottom surface of the first insulation layer. At least part of the second electrode is disposed on the second insulation layer. The second electrode is in contact with the bottom surface of the first insulation layer. A projected area of the second electrode and a projected area of the first electrode along a direction perpendicular to the top surface of the first insulation layer are at least partially overlapped with each other. The second electrode and the first electrode are different electrodes. When the substrate is applied to a specified circuit, the first electrode and the second electrode are connected to different nodes of the specified circuit. The substrate has various embodiments. Components corresponding to the similar components of different embodiment are designated by identical numeral references.

Figure 1:
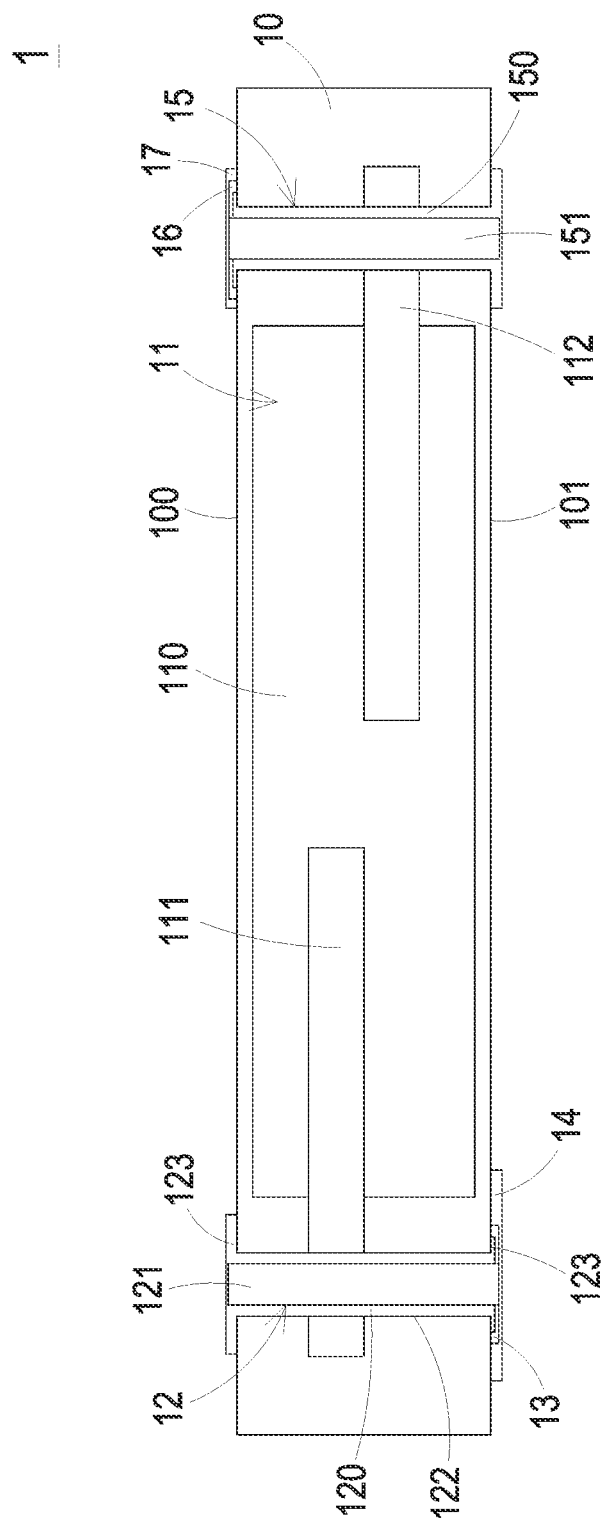
FIG. 1 is a schematic cross-sectional view illustrating a substrate according to a first embodiment of the present disclosure.

FIG. 1 is a schematic cross-sectional view illustrating a substrate according to a first embodiment of the present disclosure. The substrate 1 includes a first insulation layer 10, at least one passive component 11, at least one first through-hole structure 12, a second insulation layer 13 and a second electrode 14. The first insulation layer 10 has a top surface 100 and a bottom surface 101. The passive component 11 is embedded in the first insulation layer 10. In the embodiment of FIG. 1, the substrate 1 includes one passive component 11. In some other embodiments, the substrate 1 includes a plurality of passive components 11. The passive component 11 includes a main body 110 and at least one first conducting terminal 111. As shown in FIG. 1, the passive component 11 further includes a second conducting terminal 112. In the embodiment of FIG. 1, the passive component 11 includes one first conducting terminal 111 and one second conducting terminal 112. In some other embodiments, the passive component 11 includes a plurality of first conducting terminals 111 and a plurality of second conducting terminals 112. The second conducting terminal 112 and the first conducting terminal 111 are connected with the main body 110. As shown in FIG. 1, the second conducting terminal 112 and the first conducting terminal 111 are protruded from two opposite sides of the main body 110. In some other embodiments, the second conducting terminal 112 and the first conducting terminal 111 are protruded from two adjacent sides of the main body 110 or protruded from the same side of the main body 110.

The first through-hole structure 12 is formed in the first insulation layer 10. Moreover, the first through-hole structure 12 is aligned with the first conducting terminal 111 and arranged beside a first side of the passive component 11. The first through-hole structure 12 runs through the first insulation layer 10. The first through-hole structure 12 includes a conductive part 120 and an insulation part 121. The insulation part 121 is disposed within the conductive part 120. The conductive part 120 of the first through-hole structure 12 is in contact with the first conducting terminal 111 and formed as a first electrode. In this embodiment, the first through-hole structure 12 is in contact with the top surface 100 and the bottom surface 101 of the first insulation layer 10. Especially, a first portion of the conductive part 120 of the first through-hole structure 12 is protruded from the top surface 100 of the first insulation layer 10, and a second portion of the conductive part 120 of the first through-hole structure 12 is protruded from the bottom surface 101 of the first insulation layer 10.

The second insulation layer 13 is disposed on the bottom of the portion of the conductive part 120 of the first through-hole structure 12 that is close to the bottom surface 101 of the first insulation layer 10. At least part of the second electrode 14 is disposed on the bottom of the second insulation layer 13, and the second electrode 14 is in contact with the bottom surface 101 of the first insulation layer 10. The projected area of the second electrode 14 and the projected area of the first electrode along a direction perpendicular to the top surface 100 of the first insulation layer 10 are at least partially overlapped with each other. The second electrode 14 and the first electrode are different electrodes.

In an embodiment, the conductive part 120 of the first through-hole structure 12 includes a lateral metal layer 122. The lateral metal layer 122 is formed on a lateral surface of the first through-hole structure 12. The conductive part 120 of the first through-hole structure 12 further includes at least one surficial metal layer 123 on the top surface 100 and/or the bottom surface 101 of the first insulation layer 10. The at least one surficial metal layer 123 is in contact with the lateral metal layer 122. In the embodiment of FIG. 1, the conductive part 120 of the first through-hole structure 12 further includes two surficial metal layers 123. The two surficial metal layers 123 are disposed on the top surface 100 and the bottom surface 101 of the first insulation layer 10, respectively. The surficial metal layer 123 on the bottom surface 101 of the first insulation layer 10 is enclosed by the second insulation layer 13.

In some embodiments, the substrate 1 further includes at least one second through-hole structure 15, a third insulation layer 16 and a third electrode 17. The second through-hole structure 15 is formed in the first insulation layer 10 and arranged beside a second side of the passive component 11. The second through-hole structure 15 runs through the first insulation layer 10. The second through-hole structure 15 includes a conductive part 150 and an insulation part 151. The insulation part 151 is disposed within the conductive part 150. The conductive part 150 of the second through-hole structure 15 is in contact with the second conducting terminal 112 and formed as a fourth electrode. The third insulation layer 16 is disposed on portion of the conductive part 150 of the second through-hole structure 15 that is close to the top surface 100 of the first insulation layer 10. At least part of the third electrode 17 is disposed on the third insulation layer 16. The third electrode 17 is in contact with the top surface 100 of the first insulation layer 10. The projected area of the fourth electrode and the projected area of the third electrode 17 along the direction perpendicular to the top surface 100 of the first insulation layer 10 are at least partially overlapped with each other. The fourth electrode and the third electrode 17 are different electrodes.

In an embodiment, the passive component 11 includes at least one inductor, the main body 110 is a magnetic core, and the first conducting terminal 111 and the second conducting terminal 112 are portions of the windings of the inductor. The windings may be one-turn or multi-turn windings.

Figure 2:
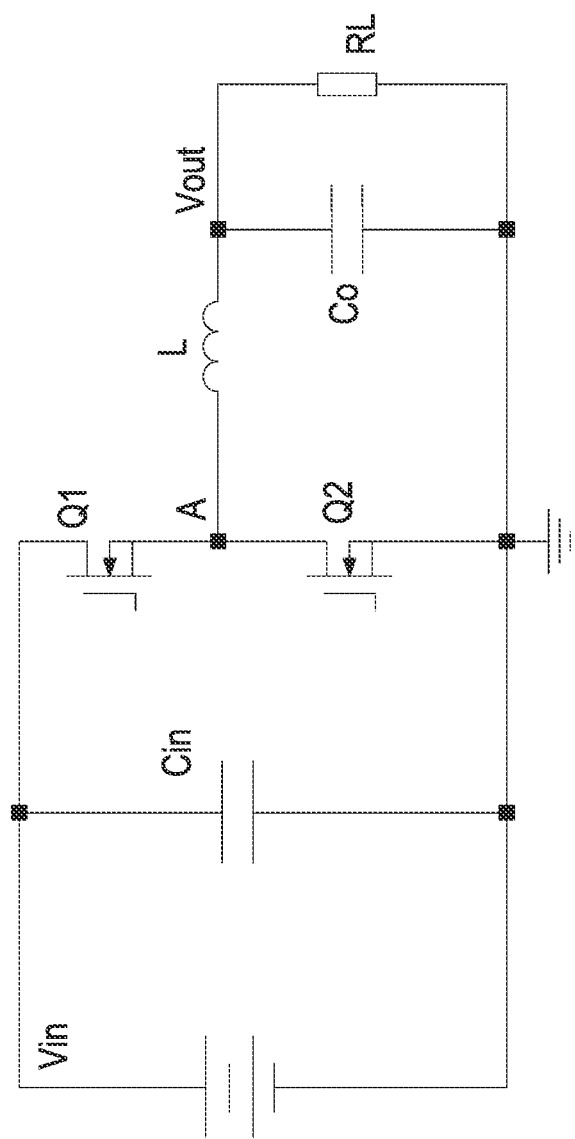
FIG. 2 is a schematic circuit diagram illustrating a voltage conversion circuit using the substrate of FIG. 1.

FIG. 2 is a schematic circuit diagram illustrating a voltage conversion circuit using the substrate of FIG. 1. As mentioned above, the passive component 11 is embedded in the substrate 1. Consequently, the substrate 1 of the present disclosure can be applied to any voltage conversion circuit with passive components. In the embodiment of FIG. 2, the voltage conversion circuit 18 is a buck-type voltage conversion circuit. The voltage conversion circuit 18 includes an input filter capacitor Cin, a power unit, an inductor L, and an output capacitor Co. The input filter capacitor Cin is connected to a power source to receive an input voltage Vin from the power source. The power unit includes at least one half-bridge circuit. In the embodiment of FIG. 2, the power unit includes a half-bridge circuit, which includes a first power switch Q1 and a second power switch Q2. A first terminal of the first power switch Q1 is connected with the input filter capacitor Cin. A second terminal of the first power switch Q1, a first terminal of the inductor L and a first terminal of the second power switch Q2 are connected to a node A. The first power switch Q1 is alternately turned on and turned off. Consequently, the energy transferred from the input terminal of the voltage conversion circuit 18 to the output terminal of the voltage conversion circuit 18 is adjusted, and the voltage and the current outputted from the output terminal of the voltage conversion circuit 18 are correspondingly adjusted. A second terminal of the second power switch Q2 is connected with a ground terminal. The second power switch Q2 provides a channel for the inductor L to release the freewheeling energy. A second terminal of the inductor L is connected with the output capacitor Co. Due to the cooperation of the first power switch Q1 and the second power switch Q2, a square output voltage is generated. By the inductor L and the output capacitor Co, the square output voltage is filtered to an average value. Consequently, an output voltage Vout is generated and provided to a load RL. In this embodiment, the inductor L is the passive component 11 of the substrate 1 as shown in FIG. 1. The current ripple from the inductor L is absorbed by the output capacitor Co. Consequently, the ripple of the output voltage Vout is lower than the predetermined value.

Please refer to FIGS. 1 and 2 again. The first electrode and the first conducting terminal 111 of the passive component 11 (i.e., the inductor L) are connected with each other. That is, the first electrode is connected with the node A between the first power switch Q1 and the second power switch Q2. The fourth electrode and the second conducting terminal 112 of the passive component 11 (i.e., the inductor L) are connected with each other. That is, the fourth electrode is connected with the output terminal of the voltage conversion circuit 18. The second electrode 14 is connected with the input terminal of the voltage conversion circuit 18. The third electrode 17 is connected with the ground terminal.

In this embodiment, the second electrode 14 and portion of the fourth electrode are disposed on the bottom surface 101 of the first insulation layer 10 of the substrate 1, so that the substrate 1 can be directly mounted on a system board (not shown). Moreover, the first electrode is connected with the node A between the first power switch Q1 and the second power switch Q2 and portion of the first electrode is disposed on the top surface 100 of the first insulation layer 10 of the substrate 1. Consequently, it is not necessary to retain a space on the system board for connecting the first electrode with the node A. In such way, the layout area of the system board is saved. Moreover, since the node A between the first power switch Q1 and the second power switch Q2 is a jumper point, the use of the substrate 1 is capable of avoiding the influence of electromagnetic interference effectively.

In this embodiment, the first conducting terminal 111 and the second conducting terminal 112 of the inductor L are protruded along the horizontal direction and arranged between the top surface and the bottom surface of the main body 110 of the inductor L. Moreover, the main body 110 of the inductor L is formed through a mold. Consequently, the tolerance is small. In case that the thickness of the portions of the first insulation layer 10 on the top surface and the bottom surface of the main body 110 of the inductor L envelops the thickness tolerance of the main body 110 of the inductor L, the design is acceptable. In other words, the portions of the first insulation layer 10 on the top surface and the bottom surface of the main body 110 of the inductor L may be very thin. Since the second electrode 14 is in contact with the bottom surface 101 of the first insulation layer 10, the thickness of the substrate 1 is reduced and the connection impedance is decreased. Moreover, since the substrate 1 is slim and the top surface 100 and the bottom surface 101 of the first insulation layer 10 are connected with each other through the first through-hole structure 12, the substrate 1 has a good heat transfer path and the heat dissipation efficiency is enhanced.

Figure 3:
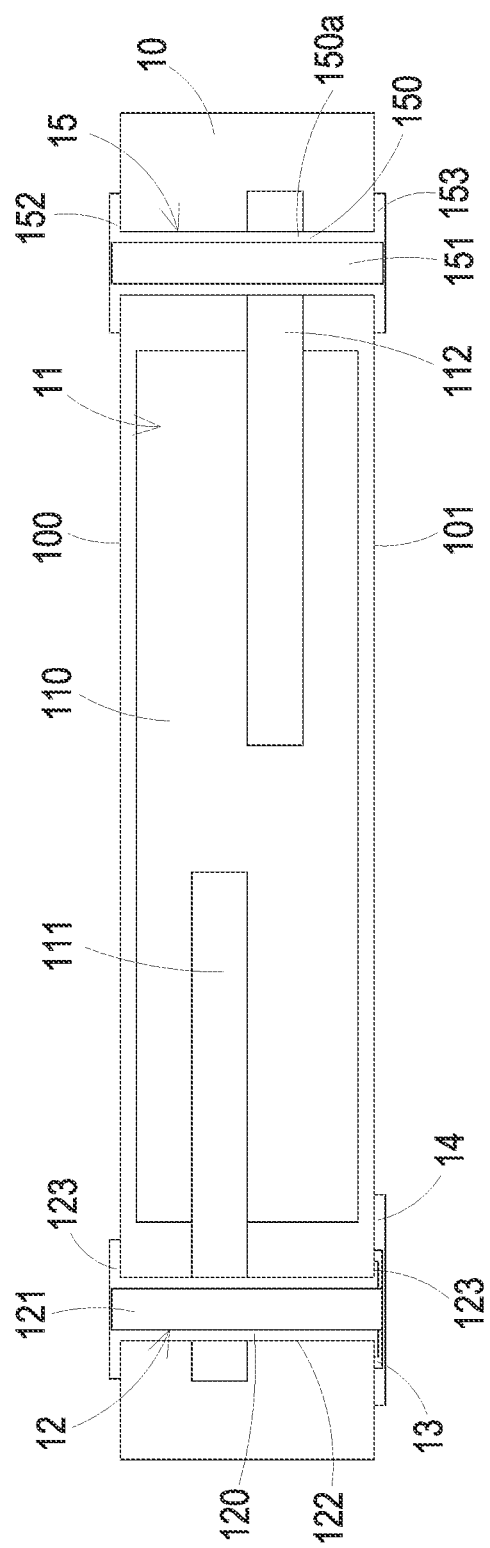
FIG. 3 is a schematic cross-sectional view illustrating a substrate according to a second embodiment of the present disclosure.

FIG. 3 is a schematic cross-sectional view illustrating a substrate according to a second embodiment of the present disclosure. The structure of the substrate 2 of this embodiment is similar to that of the substrate 1 as shown in FIG. 1. Component parts and elements corresponding to those of the first embodiment are designated by identical numeral references, and detailed descriptions thereof are omitted. In comparison with the substrate 1 as shown in FIG. 1, the substrate 2 of this embodiment does not have the third insulation layer. The second through-hole structure 15 includes a conductive part 150 and an insulation part 151. The conductive part 150 includes a lateral metal layer 150*a*, a top surficial metal layer 152 and a bottom surficial metal layer 153. The conductive part 150 of the second through-hole structure 15 is in contact with the second conducting terminal 112 and formed as a fourth electrode.

Figure 4:
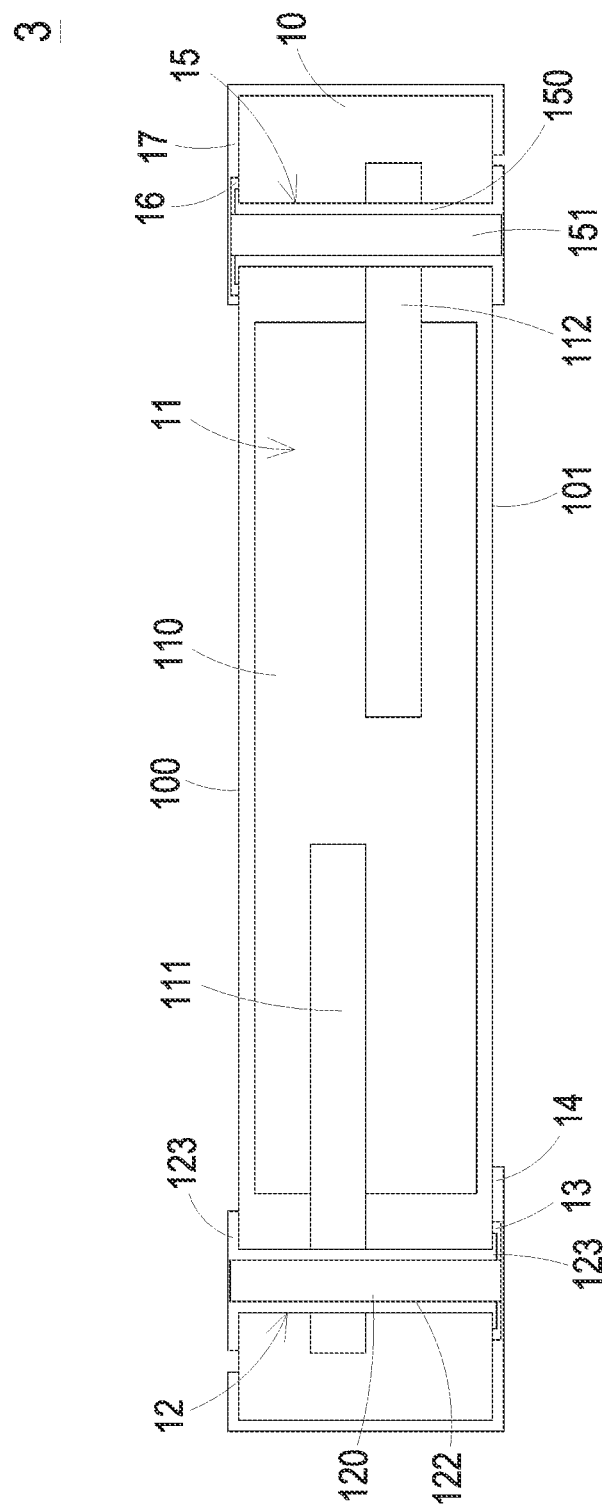
FIG. 4 is a schematic cross-sectional view illustrating a substrate according to a third embodiment of the present disclosure.

FIG. 4 is a schematic cross-sectional view illustrating a substrate according to a third embodiment of the present disclosure. The structure of the substrate 3 of this embodiment is similar to that of the substrate 1 as shown in FIG. 1. Component parts and elements corresponding to those of the first embodiment are designated by identical numeral references, and detailed descriptions thereof are omitted. In comparison with the first embodiment, the second electrode 14 and the third electrode 17 of the substrate 3 are distinguished. In this embodiment, the second electrode 14 is extended from the bottom surface 101 of the first insulation layer 10 to the top surface 100 of the first insulation layer 10 through the lateral wall of the substrate 3. Consequently, the segment of the second electrode 14 on the bottom surface 101 of the first insulation layer 10 and the segment of the second electrode 14 on the top surface 100 of the first insulation layer 10 can be electrically connected with each other to meet the practical requirements. Similarly, the third electrode 17 is extended from the top surface 100 of the first insulation layer 10 to the bottom surface 101 of the first insulation layer 10 through the lateral wall of the substrate 3.

Figure 5:
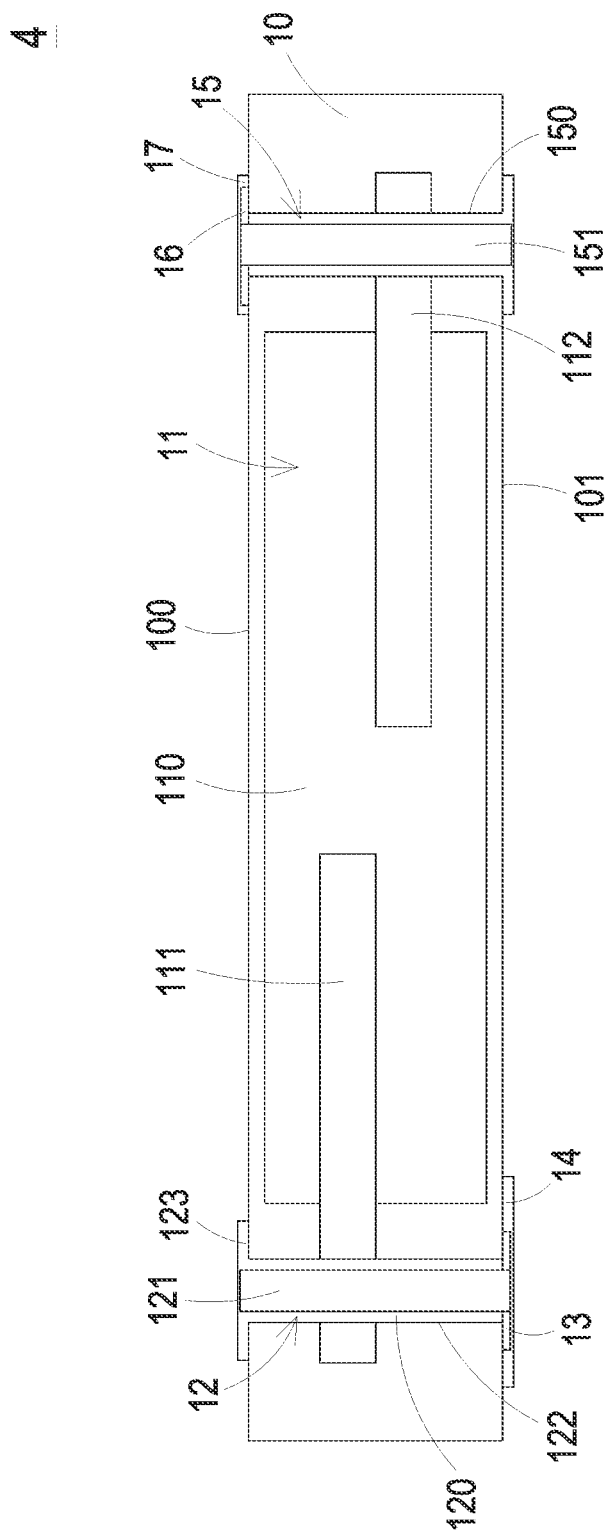
FIG. 5 is a schematic cross-sectional view illustrating a substrate according to a fourth embodiment of the present disclosure.

FIG. 5 is a schematic cross-sectional view illustrating a substrate according to a fourth embodiment of the present disclosure. The structure of the substrate 4 of this embodiment is similar to that of the substrate 1 as shown in FIG. 1. Component parts and elements corresponding to those of the first embodiment are designated by identical numeral references, and detailed descriptions thereof are omitted. In comparison with the first embodiment, the surficial metal layer 123 on the bottom surface 101 of the first insulation layer 10 is omitted and not included in the conductive part 120 of the first through-hole structure 12 of the substrate 4 of this embodiment. As the second insulation layer 13 is disposed on portion of the conductive part 120 of the first through-hole structure 12 that is close to the bottom surface 101 of the first insulation layer 10, the bottom end of the lateral metal layer 122 is covered by the second insulation layer 13. In this embodiment, the bottom end of the lateral metal layer 122 is in contact with the second insulation layer 13. In other words, there is a contact surface between the second insulation layer 13 and the lateral metal layer 122. As shown in FIG. 5, the contact surface is substantially at the same level with the bottom surface 101 of the first insulation layer 10. Moreover, a portion of the second insulation layer 13 is disposed on the bottom surface 101 of the first insulation layer 10 directly. The relationship between the second through-hole structure 15 and the third insulation layer 16 is similar to the relationship between the first through-hole structure 12 and the second insulation layer 13, and detailed descriptions thereof are omitted.

Figure 6:
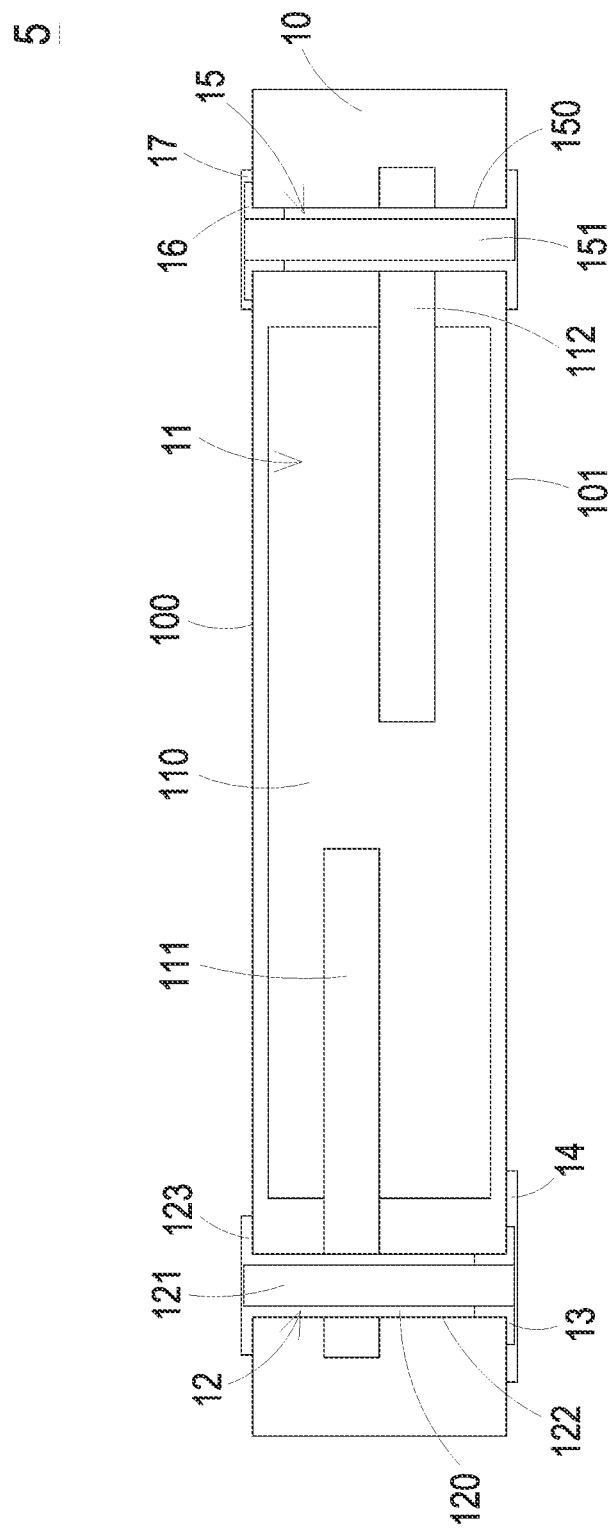
FIG. 6 is a schematic cross-sectional view illustrating a substrate according to a fifth embodiment of the present disclosure.

FIG. 6 is a schematic cross-sectional view illustrating a substrate according to a fifth embodiment of the present disclosure. The structure of the substrate 5 of this embodiment is similar to that of the substrate 4 as shown in FIG. 5.

Component parts and elements corresponding to those of the fourth embodiment of FIG. 5 are designated by identical numeral references, and detailed descriptions thereof are omitted. In comparison with the fourth embodiment, the position of the contact surface between the second insulation layer 13 and the lateral metal layer 122 of the substrate 5 is arranged between the top surface 100 and the bottom surface 101 of the first insulation layer 10.

Figure 7:
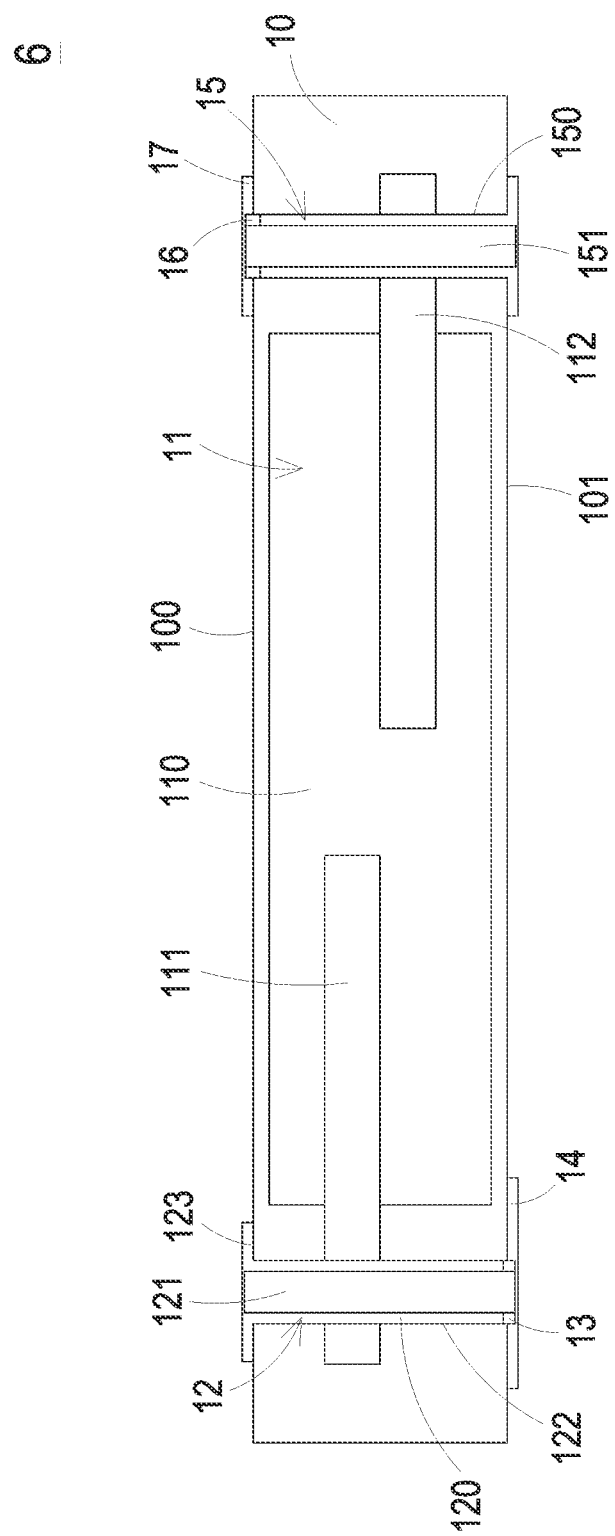
FIG. 7 is a schematic cross-sectional view illustrating a substrate according to a sixth embodiment of the present disclosure.

FIG. 7 is a schematic cross-sectional view illustrating a substrate according to a sixth embodiment of the present disclosure. The structure of the substrate 6 of this embodiment is similar to that of the substrate 4 as shown in FIG. 5. Component parts and elements corresponding to those of the fourth embodiment of FIG. 5 are designated by identical numeral references, and detailed descriptions thereof are omitted. In comparison with the fourth embodiment, the second insulation layer 13 of the substrate 6 of this embodiment is not disposed on the bottom surface 101 of the first insulation layer 10. That is, the second insulation layer 13 is disposed on the bottom surface of the first through-hole structure 12 only.

Figure 8:
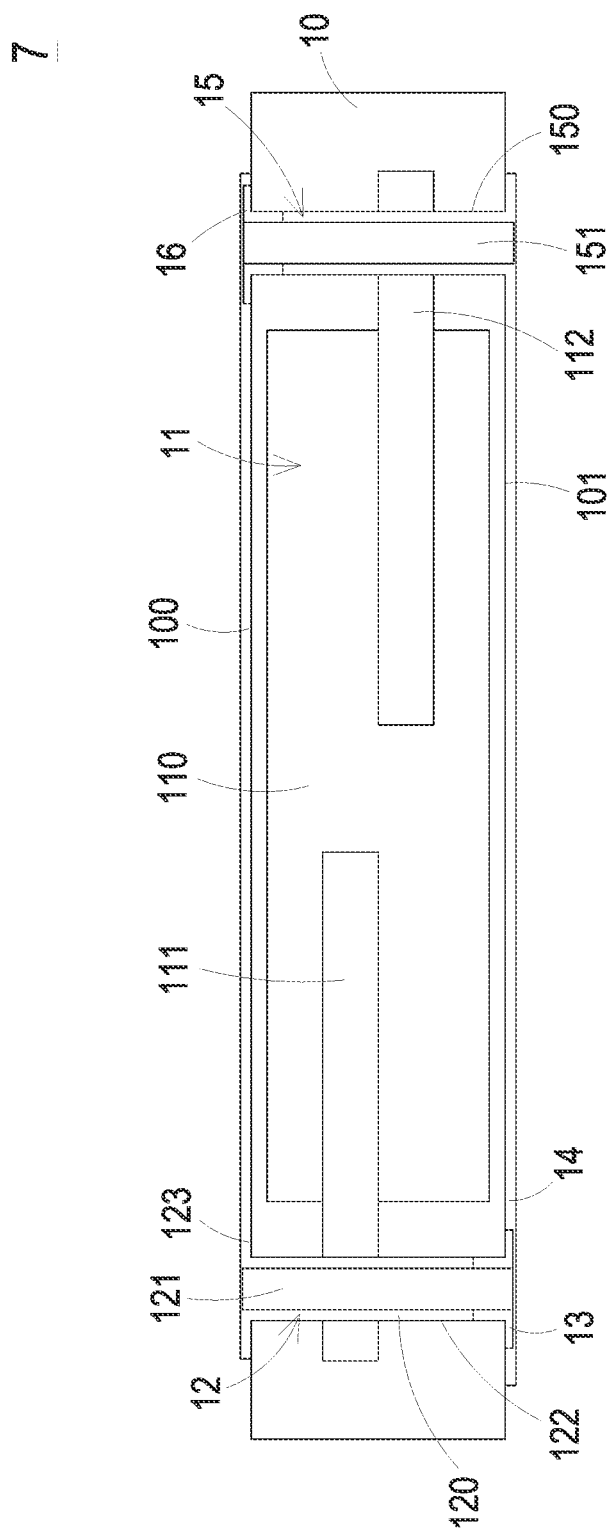
FIG. 8 is a schematic cross-sectional view illustrating a substrate according to a seventh embodiment of the present disclosure.

FIG. 8 is a schematic cross-sectional view illustrating a substrate according to a seventh embodiment of the present disclosure. The structure of the substrate 7 of this embodiment is similar to that of the substrate 5 as shown in FIG. 6. Component parts and elements corresponding to those of the fifth embodiment of FIG. 6 are designated by identical numeral references, and detailed descriptions thereof are omitted. In comparison with the fifth embodiment, the structures of the first electrode and the second electrode 14 of the substrate 7 of this embodiment are distinguished. As shown in FIG. 8, the first electrode is extended to the position over the second through-hole structure 15 and the third insulation layer 16 along the top surface 100 of the first insulation layer 10, and the second electrode 14 is extended to the position under the second through-hole structure 15 along the bottom surface 101 of the first insulation layer 10 and in contact with the conductive part 150 of the second through-hole structure 15.

In the above embodiments, at least a portion of the surficial metal layer 123 disposed on the bottom surface 101 of the first insulation layer 10 and aligned with the first through-hole structure 12 is removed by an etching process for disposing the second insulation layer 13 and the second electrode 14.

Figure 9:
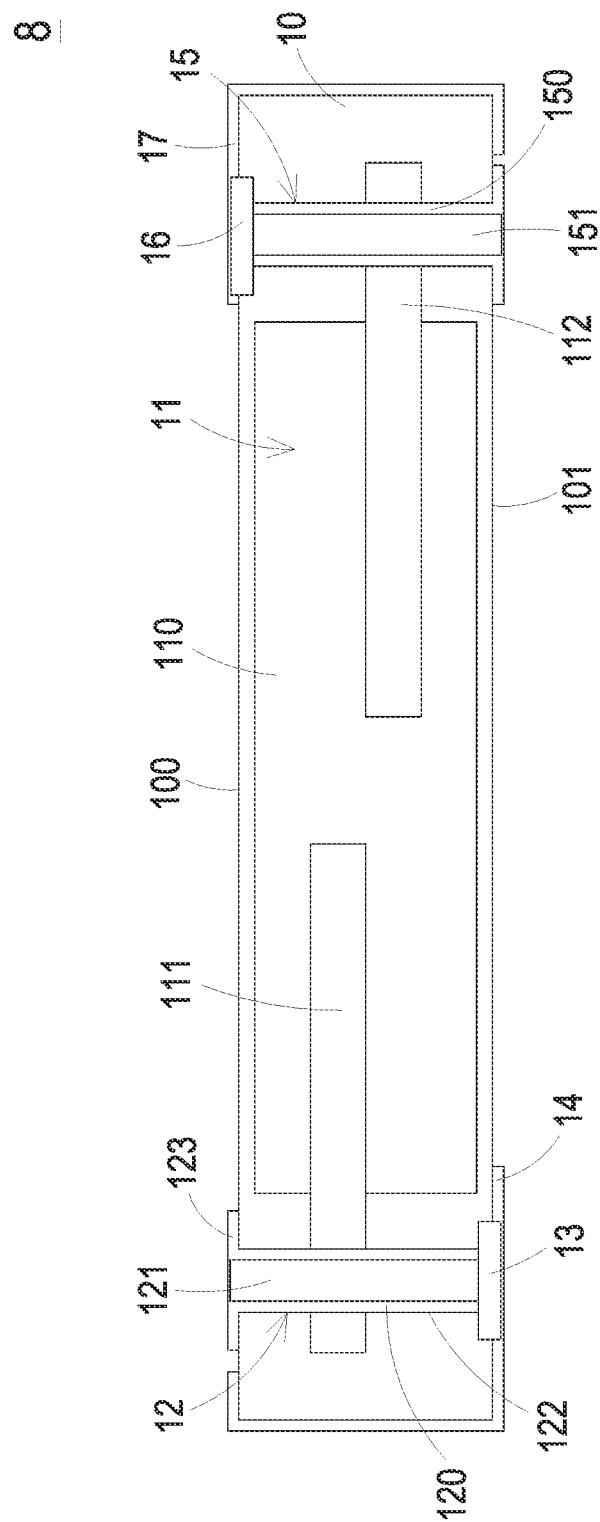
FIG. 9 is a schematic cross-sectional view illustrating a substrate according to an eighth embodiment of the present disclosure.

In some other embodiments, the etching process is replaced by a hole-drilling process. FIG. 9 is a schematic cross-sectional view illustrating a substrate according to an eighth embodiment of the present disclosure. The structure of the substrate 8 of this embodiment is similar to that of the substrate 3 as shown in FIG. 4. Component parts and elements corresponding to those of the third embodiment of FIG. 4 are designated by identical numeral references, and detailed descriptions thereof are omitted. As mentioned above in FIG. 4, the portion of the surficial metal layer 123 disposed on the bottom surface 101 of the first insulation layer 10 and aligned with the first through-hole structure 12 is removed by an etching process. In this embodiment, the etching process is replaced by a hole-drilling process. That is, the portion of the surficial metal layer 123 disposed on the bottom surface 101 of the first insulation layer 10 and aligned with the first through-hole structure 12 is removed by a hole-drilling process. During the hole-drilling process, a portion of lateral metal layer 122 near the bottom surface 101 of the first insulation layer 10 is also removed. Consequently, the disposing position of the second insulation layer 13 of the substrate 8 of this embodiment is distinguished from that of FIG. 4. The detailed procedures of the etching process and the hole-drilling process will be described later.

Figure 10:
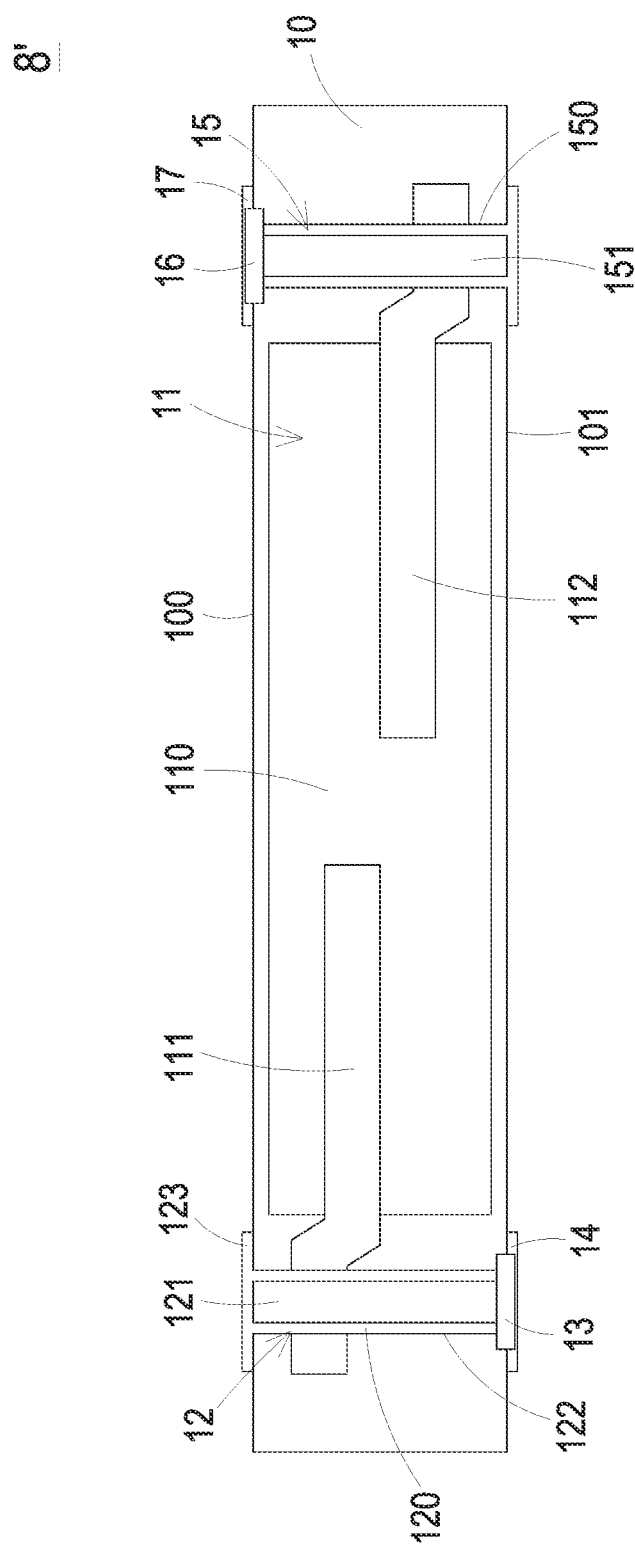
FIG. 10 is a schematic cross-sectional view illustrating a substrate according to a ninth embodiment of the present disclosure.

FIG. 10 is a schematic cross-sectional view illustrating a substrate according to a ninth embodiment of the present disclosure. According to the practical requirements, the portion of the passive component 11 overlying the first conducting terminal 111 and the portion of the passive component 11 underlying the second conducting terminal 112 should have specified thicknesses. Therefore, the outer segment of the first conducting terminal 111 is bent in the direction toward the top surface 100 of the first insulation layer 10 and the outer segment of the second conducting terminal 112 is bent in the direction toward the bottom surface 101 of the first insulation layer 10 when compared with the embodiment of FIG. 9. Since the outer segments of the first conducting terminal 111 and the second conducting terminal 112 of the substrate 8' of this embodiment are bent toward the top surface 100 and the bottom surface 101 of the first insulation layer 10, respectively, the current transfer path is shortened. Therefore, the impedance is reduced, and the operating efficiency is enhanced.

Figure 11:
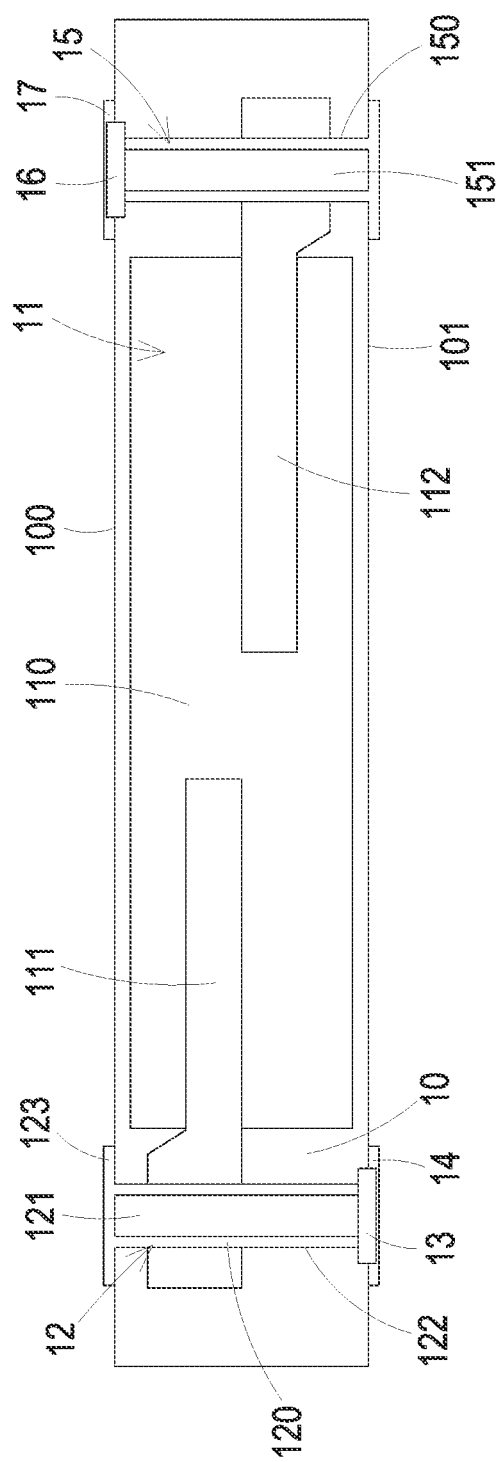
FIG. 11 is a schematic cross-sectional view illustrating a substrate according to a tenth embodiment of the present disclosure.

FIG. 11 is a schematic cross-sectional view illustrating a substrate according to a tenth embodiment of the present disclosure. According to the practical requirements, the portion of the passive component 11 overlying the first conducting terminal 111 and the portion of the passive component 11 underlying the second conducting terminal 112 should have specified thicknesses. For shortening the current path, the structures of the first conducting terminal 111 and the second conducting terminal 112 of the substrate 9 of this embodiment are specially designed. As shown in FIG. 11, the outer segment of the first conducting terminal 111 that is located outside the main body 110 of the passive component 11 is thicker than the inner segment of the first conducting terminal 111 that is located inside the main body 110 of the passive component 11, and the outer segment of the second conducting terminal 112 that is located outside the main body 110 of the passive component 11 is thicker than the inner segment of the second conducting terminal 112 that is located inside the main body 110 of the passive component 11. Since the area of flowing the current is increased, the conduction impedance is reduced and the operating efficiency is enhanced.

A method of manufacturing the substrate 3 as shown in FIG. 4 will be described as follows. The methods of manufacturing the substrates as shown in FIG. 1, FIG. 3 and FIGS. 5 to 11 are similar to the method of manufacturing the substrate 3 as shown in FIG. 4.

FIGS. 12A to 12E are schematic cross-sectional views illustrating a method of manufacturing a substrate according to an embodiment of the present disclosure.

Figure 12A:
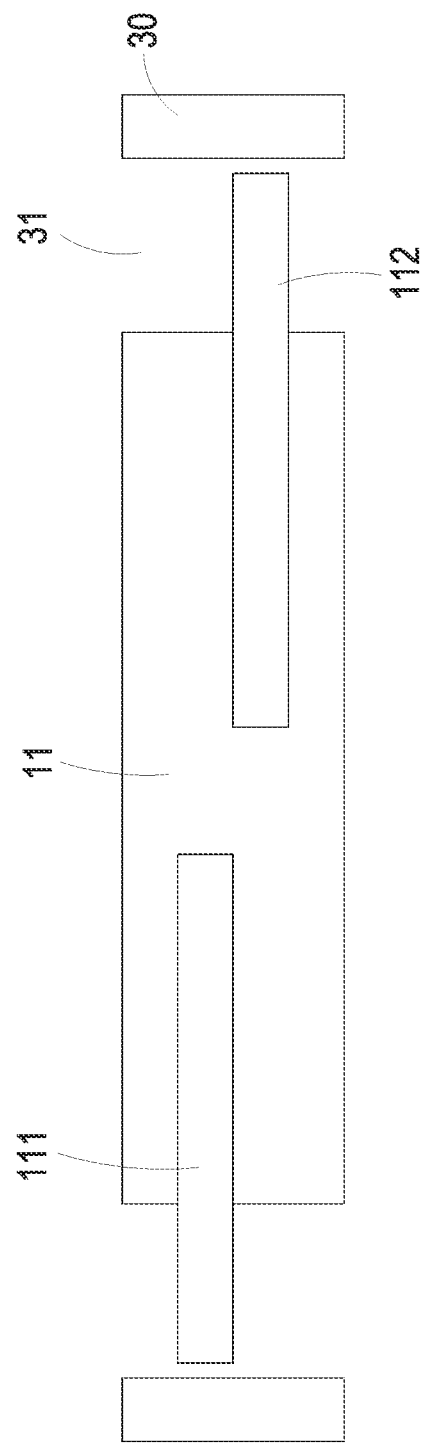
FIGS. 12A to 12E are schematic cross-sectional views illustrating a method of manufacturing a substrate according to an embodiment of the present disclosure.

Please refer to FIG. 12A. In a first step, a passive component 11 with at least one first conducting terminal 111 is provided. Optionally, a core plate 30 is provided. The thickness of the core plate 30 is substantially equal to the thickness of the passive component 11. After a portion of the core plate 30 is cut off to form a hollow portion 31, the passive component 11 is placed within the hollow portion 31. In addition, the bottom surface of the passive component 11 and the bottom surface of the core plate 30 are attached on a tape (not shown). Consequently, the passive component 11 and the core plate 30 are located at the same plane. In this embodiment, the passive component 11 further comprises at least one second conducting terminal 112.

Figure 12B:
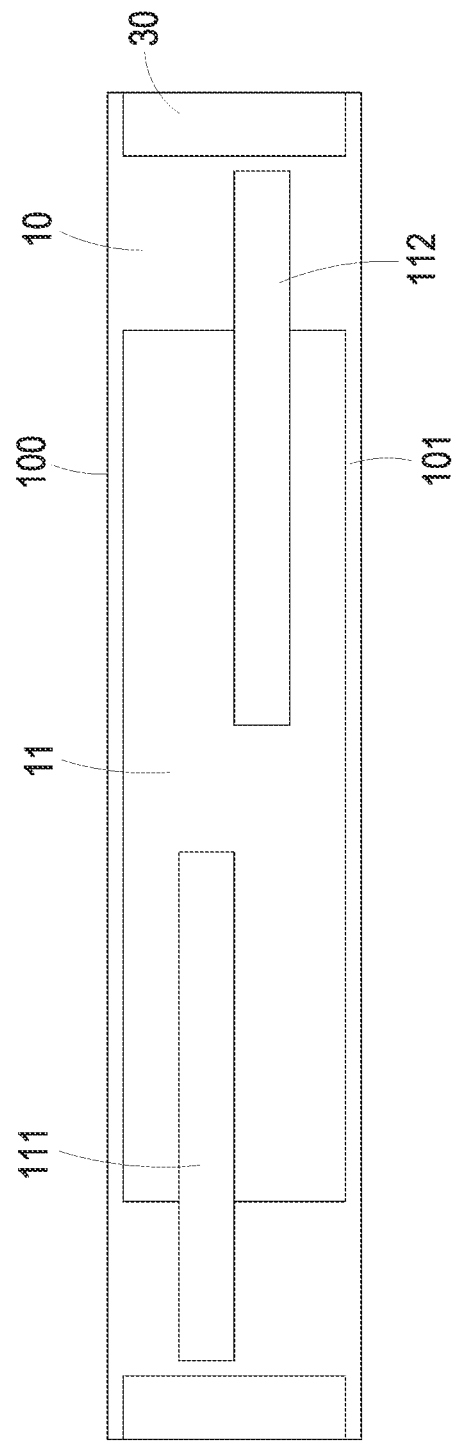

Please refer to FIG. 12B. In a second step, a first insulation layer 10 is formed around the passive component 11, so that the passive component 11 is embedded in the first insulation layer 10. The second step comprises the following sub-steps. Firstly, an insulation material is disposed on the top sides of the core plate 30 and the passive component 11 and filled into the gap between the core plate 30 and the passive component 11. Consequently, the top surface of the passive component 11 and the lateral surfaces of the passive component 11 are completely covered by the insulation material. After the above structure is heated to a specified temperature, the tape is removed from the bottom surface of the core plate 30 and the bottom surface of the passive component 11. Then, the insulation material is filled into the gap between the core plate 30 and the passive component 11 from the backside. Consequently, the bottom surface of the core plate 30 and the bottom surface of the passive component 11 are covered by the insulation material. Then, the above structure is heated to allow the insulation material around the passive component 11 to undergo a crosslinking reaction. Consequently, the passive component 11 and the core plate 30 are integrally formed as a one-piece structure through the insulation material. Meanwhile, the insulation material and the core plate 30 may be considered as the first insulation layer 10.

In a third step, at least one first hole is formed in the first insulation layer 10. The first hole runs through the first conducting terminal 111. In an embodiment, the first hole is a round hole that is formed by a flat drilling tool. In another embodiment, the first hole is a waist-shaped hole that is formed by groove milling method. It is noted that the shape of the first hole is not restricted.

In a fourth step, a first metal layer is formed on a top surface 100 of the first insulation layer 10, a bottom surface 101 of the first insulation layer 10 and an inner wall of the first hole. In an embodiment, the first metal layer is formed by using an electroplating process or an electroless plating process. Alternatively, the first metal layer is formed by using an electroless plating process and the thickness of the first metal layer is increased by an electroplating process. In an example of the electroplating process, a single electroplating procedure is performed to form the first metal layer with a predetermined thickness on the top surface 100 of the first insulation layer 10, the bottom surface 101 of the first insulation layer 10 and the inner wall of the first hole. In another example of the electroplating process, a method of only exposing the first hole is employed. Firstly, a first electroplating procedure is performed to form the first metal layer with the thickness smaller than the predetermined thickness on the top surface 100 of the first insulation layer 10, the bottom surface 101 of the first insulation layer 10 and the inner wall of the first hole. Then, a covering film covers the top surface 100 and the bottom surface 101 of the first insulation layer 10 and allows the first hole to be exposed through an opening thereof. Then, a second electroplating procedure is performed to form the first metal layer on the inner wall of the first hole through the opening of the covering film.

Figure 12C:
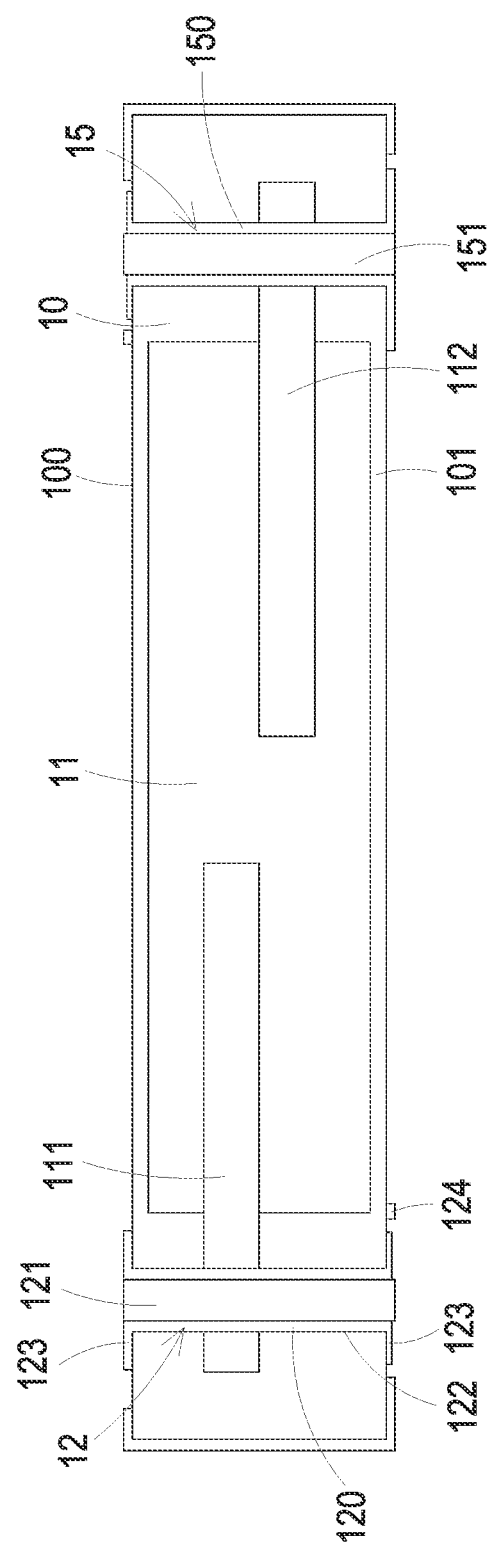

In a fifth step, a hole-plugging process is performed to fill an insulation material in the first hole, and a removing process is performed to remove a portion of the first metal layer. Consequently, a first through-hole structure 12 and a wiring layer 124 are produced. The first through-hole structure 12 includes a conductive part 120 and an insulation part 121. The insulation part 121 is disposed within the conductive part 120. The wiring layer 124 is separated from the conductive part 120 of the first through-hole structure 12 and formed on the bottom surface 101 of the first insulation layer 10. The conductive part 120 of the first through-hole structure 12 is in contact with the first conducting terminal 111 and formed as a first electrode. After the third step, the fourth step and the fifth step, the resulting structure is shown in FIG. 12C. In some embodiments, the hole-plugging process is a resin hole-plugging process or a green oil hole-plugging process.

Figure 12D:
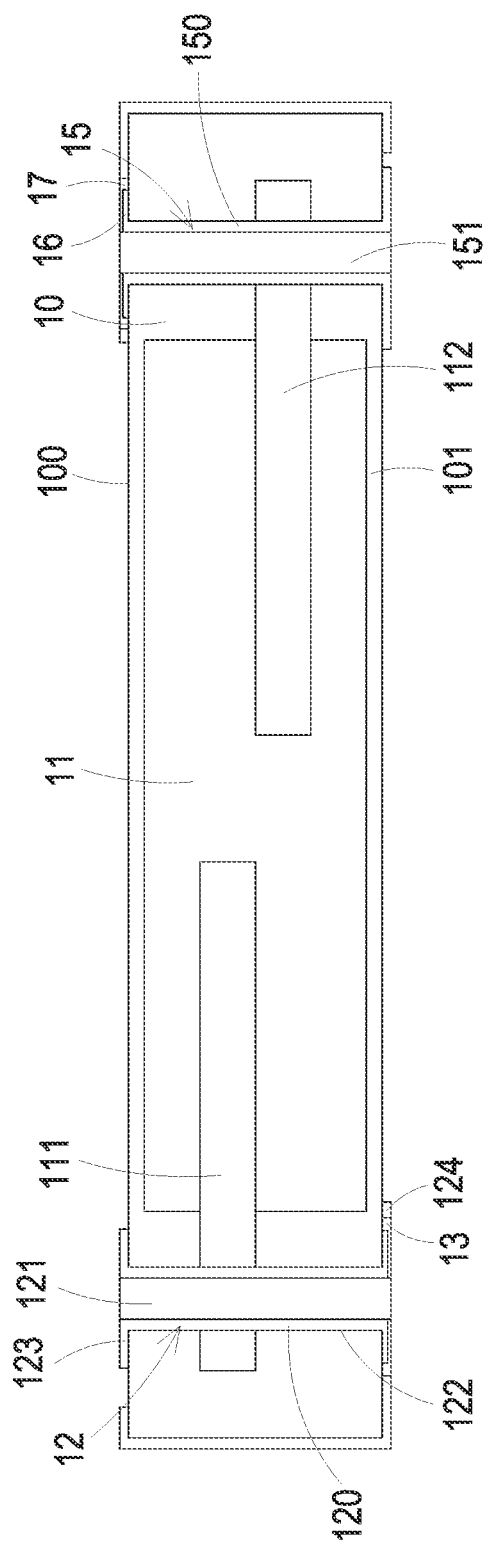

Please refer to FIG. 12D. In a sixth step, a second insulation layer 13 is disposed on portion of the conductive part 120 of the first through-hole structure 12 that is close to the bottom surface 101 of the first insulation layer 10. The second insulation layer 13 covers the portion of the conductive part 120.

Figure 12E:
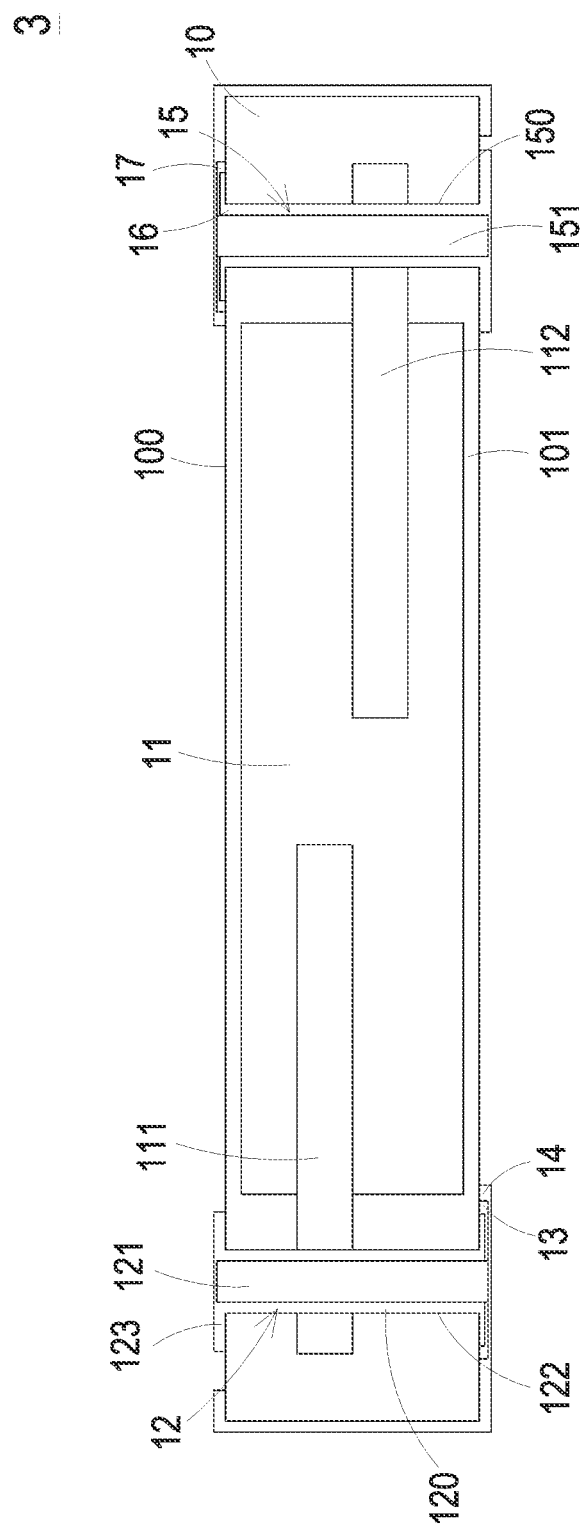

Please refer to FIG. 12E. In a seventh step, a second metal layer is disposed on the second insulation layer 13 and the wiring layer 124. The formation of the second metal layer increases the thickness of the wiring layer 124. Moreover, the second metal layer and the wiring layer 124 are collaboratively formed as a second electrode 14. The second electrode 14 is also in contact with the bottom surface 101 of the first insulation layer 10. The projected area of the second electrode 14 and the projected area of the first electrode along a direction perpendicular to the top surface 100 of the first insulation layer 10 are at least partially overlapped with each other. The second electrode 14 and the first electrode are different electrodes.

After the seventh step is completed, the substrate 3 is manufactured.

It is noted that numerous modifications and alterations may be made while retaining the teachings of the disclosure.

In a variant example of the fifth step, the removing process further includes a step of removing the first metal layer that is formed on the bottom surface 101 of the first insulation layer 10 and aligned with the first hole.

In another variant example of the fifth step, the removing process further includes a step of removing at least a portion of the first metal layer by a hole-drilling process and removing a portion of the first metal layer located in the first hole and near the bottom surface 101 of the first insulation layer 10 by the hole-drilling process.

Moreover, after the fifth step is completed, the conductive part 120 of the first through-hole structure 12 includes a lateral metal layer 122 and at least one surficial metal layer 123. The at least one surficial metal layer 123 is in contact with the lateral metal layer 122, and formed on the top surface 100 and/or the bottom surface 101 of the first insulation layer 10. Moreover, for disposing the second insulation layer 13 and the second electrode 14, the manufacturing method of the present disclosure further includes a first removing step between the fifth step and the sixth step. When the first removing step is performed, a portion of the surficial metal layer 123 disposed on the bottom surface 101 of the first insulation layer 10 and aligned with the first through-hole structure 12 is removed. Consequently, the surficial metal layer 123 disposed on the bottom surface 101 of the first insulation layer 10 and aligned with the first through-hole structure 12 is thinned. The first removing step may be applied to the method of manufacturing the substrate 1 of FIG. 1, the substrate 2 of FIG. 3 and the substrate 3 of FIG. 4. For example, the first removing step includes an etching process.

In some embodiments, the manufacturing method of the present disclosure further includes a second removing step between the fifth step and the sixth step. In the second removing step, the surficial metal layer 123 disposed on the bottom surface 101 of the first insulation layer 10 and aligned with the first through-hole structure 12 is partially or completely removed, and a portion of the lateral metal layer 122 disposed within the first through-hole structure 12 and arranged near the bottom surface 101 of the first insulation layer 10 is optionally removed. The second removing step may be applied to the method of manufacturing the substrate 5 of FIG. 6 or the substrate 7 of FIG. 8. For example, the second removing step includes an etching process or a hole-drilling process.

In some embodiments, the substrate 3 includes a plurality of first through-hole structures 12. For disposing the second insulation layer 13 and the second electrode 14, the manufacturing method of the present disclosure further includes a second removing step. In the second removing step, the surficial metal layer 123 disposed on the bottom surface 101 of the first insulation layer 10 and aligned with each first through-hole structure 12 is partially or completely removed, and a portion of the lateral metal layer 122 disposed within each first through-hole structure 12 and arranged near the bottom surface 101 of the first insulation layer 10 is removed. In case that the substrate 3 includes a plurality of first through-hole structures 12 and the second removing step includes a hole-drilling process, the hole-drilling process has some examples. Hereinafter, three examples of the hole-drilling process will be illustrated when the substrate 8 of FIG. 9 is taken as an example.

Figure 13:
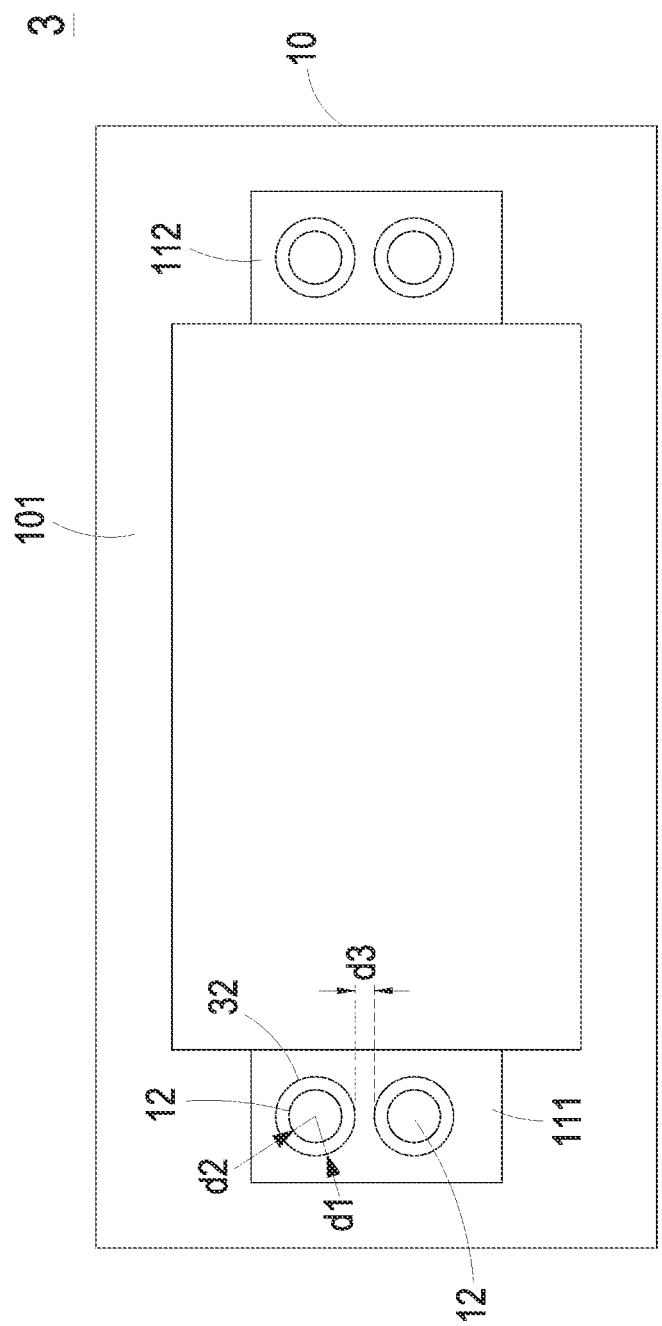
FIG. 13 is a schematic horizontally cross-sectional view illustrating a first example of the hole-drilling process in the second removing step of the method of manufacturing the substrate according to the embodiment of the present disclosure.

FIG. 13 is a schematic horizontally cross-sectional view illustrating a first example of the hole-drilling process in the second removing step of the method of manufacturing the substrate according to the embodiment of the present disclosure. As shown in FIG. 13, a single hole-drilling process is performed to form a plurality of openings 32 in the bottom surface 101 of the first insulation layer 10 corresponding to the plurality of first through-hole structures 12, respectively. The diameter d1 of each opening 32 is larger than the diameter d2 of the corresponding first through-hole structure 12. For avoiding the breakage of the opening, the spacing interval d3 between every two adjacent openings 32 is larger than a threshold value.

Figure 14:
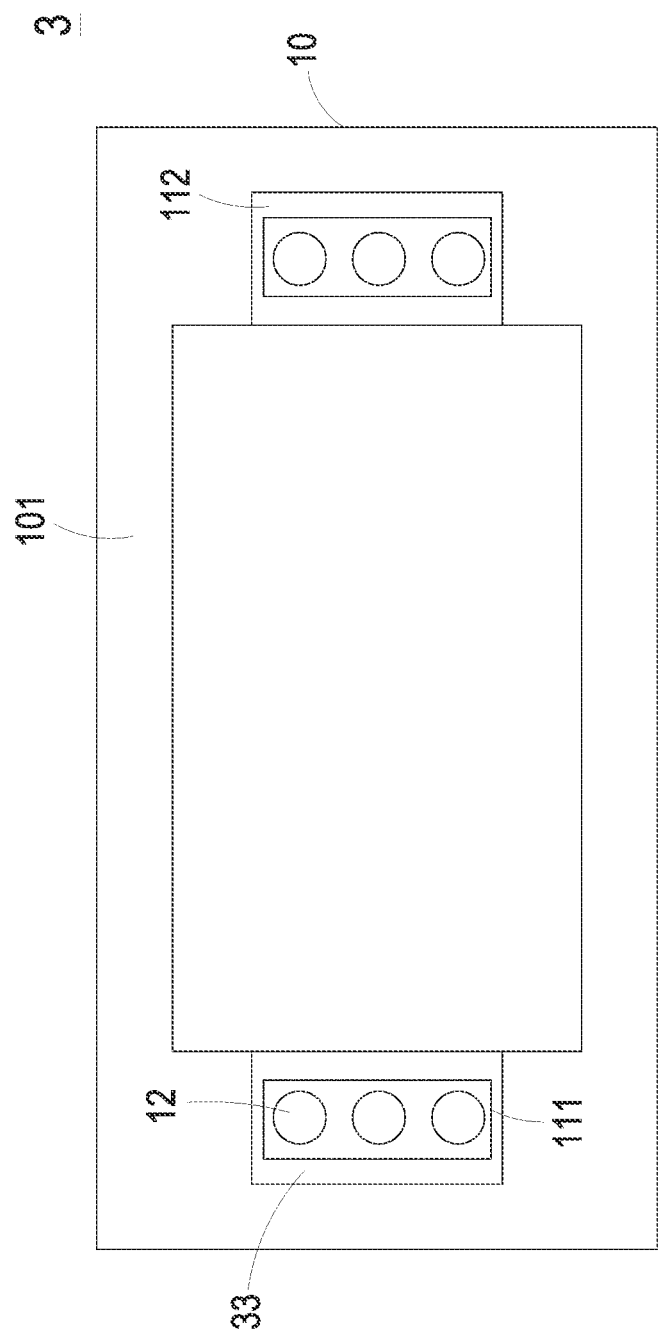
FIG. 14 is a schematic horizontally cross-sectional view illustrating a second example of the hole-drilling process in the second removing step of the method of manufacturing the substrate according to the embodiment of the present disclosure.

FIG. 14 is a schematic horizontally cross-sectional view illustrating a second example of the hole-drilling process in the second removing step of the method of manufacturing the substrate according to the embodiment of the present disclosure. As shown in FIG. 14, a single hole-drilling process is performed to form a recess 33 in the bottom surface 101 of the first insulation layer 10 corresponding to the plurality of first through-hole structures 12. That is, the plurality of first through-hole structures 12 is included in the recess 33. In case that the area of the conducting terminal of the passive component 11 is identical, the number of the first through-hole structures corresponding to the recess 33 is larger than the number of the first through-hole structures corresponding to the openings 32. Therefore, the way of forming the recess 33 can increase the current-flowing capacity.

FIGS. 15A and 15B are schematic horizontally cross-sectional views illustrating a third example of the hole-drilling process in the second removing step of the method of manufacturing the substrate according to the embodiment of the present disclosure. In this embodiment, a hole-drilling process is performed to form openings in the bottom surface 101 of the first insulation layer 10 corresponding to the plurality of first through-hole structures 12. As shown in FIG. 15A, four first through-hole structures that are discretely arranged are formed in the substrate 3. These first through-hole structures are designated by the symbols "1", "2", "3" and "4". As shown in FIG. 15A, a first hole-drilling process is performed to form openings in the bottom surface 101 of the first insulation layer 10 corresponding to the first through-hole structures "1" and "3". Then, as shown in FIG. 15B, a hole-plugging process is performed on the first through-hole structures "1" and "3". Then, a second hole-drilling process is performed to form openings in the bottom surface 101 of the first insulation layer 10 corresponding to the first through-hole structures "2" and "4". Then, a hole-plugging process is performed on the first through-hole structures "2" and "4". The way of using the two hole-drilling processes can avoid the breakage of the opening.

The substrate of the present disclosure can be applied to a power module. Hereinafter, some examples of the power module with the substrate will be described. Component parts and elements corresponding to those of the above embodiments are designated by identical numeral references, and detailed descriptions thereof are omitted.

Figure 16:
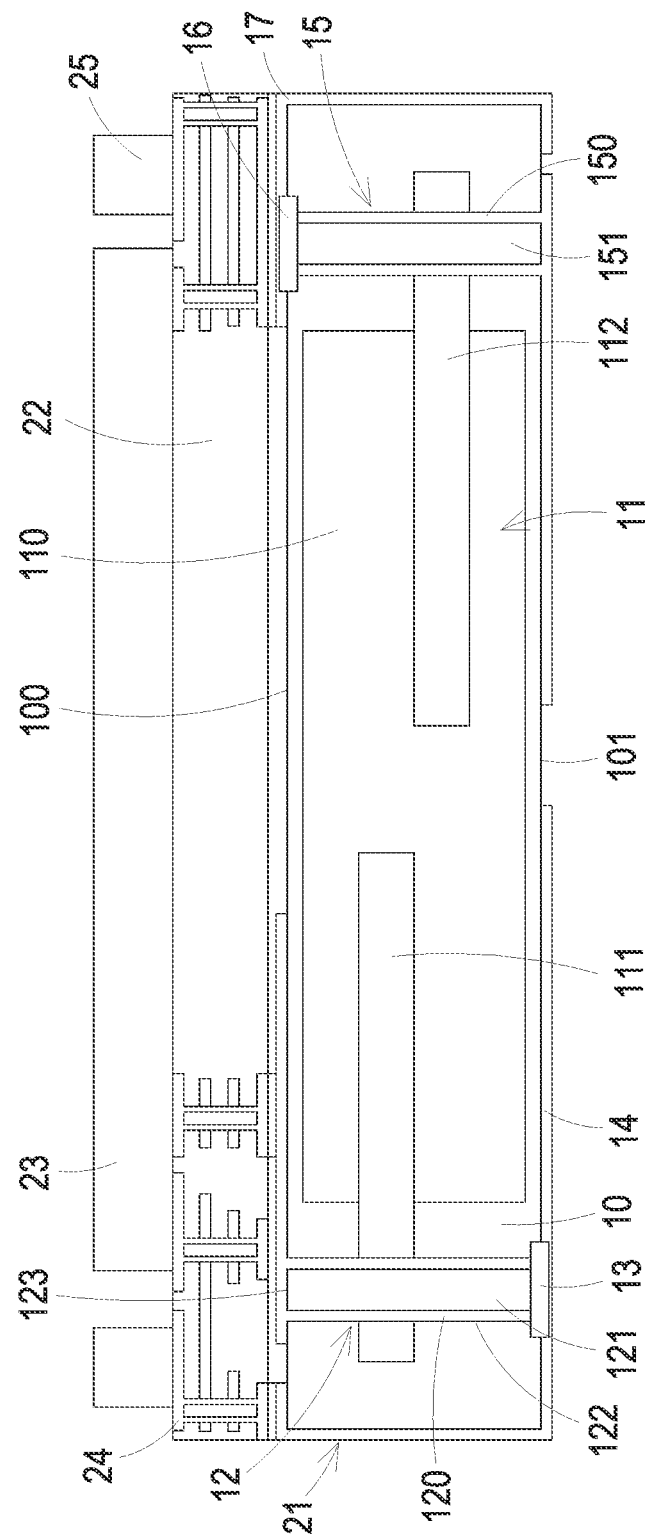
FIG. 16 is a schematic cross-sectional view illustrating a first example of a power module with the substrate of the present disclosure.

FIG. 16 is a schematic cross-sectional view illustrating a first example of a power module with the substrate of the present disclosure. In this embodiment, the power module 20 has the circuitry structure of a buck-type voltage conversion circuit 18 as shown in FIG. 2. The power module 20 includes a substrate 21, a first carrier plate 22 and at least one power unit 23. The structure of the substrate 21 is similar to the structure of the substrate as shown in one of FIG. 1 and FIGS. 3 to 11. For illustration, the substrate 21 has the structure of the substrate 8 as shown in FIG. 9. Component parts and elements corresponding to those of the substrate 8 of FIG. 9 are designated by identical numeral references, and detailed descriptions thereof are omitted. The power unit 23 is disposed on the substrate 21. For example, the power unit 23 is located over the substrate 21. The power unit 23 includes at least one half-bridge circuit as shown in FIG. 2. The half-bridge circuit includes a first power switch Q1 and a second power switch Q2. The first power switch Q1, the second power switch Q2 and the first electrode of the substrate 21 are connected to a node A. For example, the power unit 23 is a bare die or a package structure of a bare die.

The first carrier plate 22 is disposed between the power unit 23 and the substrate 21. The first electrode is connected with the node A between the first power switch Q1 and the second power switch Q2 of the power unit 23 through the first carrier plate 22. The first carrier plate 22 is fixed on the top side of the substrate 21 through solder paste. The power unit 23 is fixed on the first carrier plate 22 in a flip mounting manner.

In some embodiments, the first carrier plate 22 has a single-layer structure or a multi-layer structure. Moreover, the first carrier plate 22 includes a wiring layer 24. Consequently, the first electrode is connected with the node A between the first power switch Q1 and the second power switch Q2 of the power unit 23 through the wiring layer 24 of the first carrier plate 22.

In some embodiments, the electrode on the bottom surface 101 of the first insulation layer 10 of the substrate 21 (e.g., the second electrode and/or the fourth electrode) are welded on a system board (not shown) through solder paste. In some embodiments, the second electrode 14 is connected with the input terminal of the voltage conversion circuit 18, the fourth electrode is connected with the output terminal of the voltage conversion circuit 18, and the third electrode 17 is connected with the ground terminal. It is noted that the connection between the second electrode 14, the third electrode 17, the fourth electrode of the substrate 21 and the input terminal of the voltage conversion circuit 18, the ground terminal, the output terminal of the voltage conversion circuit 18 is not limited herein. Preferably, the third electrode 17 is extended from the top surface 100 of the first insulation layer 10 to the bottom surface 101 of the first insulation layer 10 through the lateral wall of the first insulation layer 10. In other words, the input terminal of the voltage conversion circuit 18, the ground terminal and the output terminal of the voltage conversion circuit 18 are in contact with the corresponding electrodes on the bottom surface 101 of the first insulation layer 10. Consequently, the power module 20 can be directly electrically connected with the system board.

In some embodiments, the power module 20 further includes at least one additional passive component 25. For example, the additional passive component 25 is a resistor or a capacitor. The additional passive component 25 is disposed on the top surface of the first carrier plate 22. Moreover, the additional passive component 25 is connected with the corresponding electrode of the substrate 21 through the wiring layer 24 of the first carrier plate 22.

In an embodiment, the second electrode 14 is connected with the input terminal of the voltage conversion circuit 18, and the third electrode 17 is connected with the ground terminal. Like the embodiment of FIG. 4, the second electrode 14 is extended from the bottom surface 101 of the first insulation layer 10 to the top surface 100 of the first insulation layer 10 through the lateral wall of the first insulation layer 10, and the third electrode 17 is extended from the top surface 100 of the first insulation layer 10 to the bottom surface 101 of the first insulation layer 10 through the lateral wall of the first insulation layer 10. Since the wiring parts of the second electrode 14 and the third electrode 17 are disposed in the lateral walls of the first insulation layer 10, the substrate 21 can be equipped with more first through-hole structures 12 and more second through-hole structures 15. Consequently, the current-flowing capacity is increased.

Figure 17:
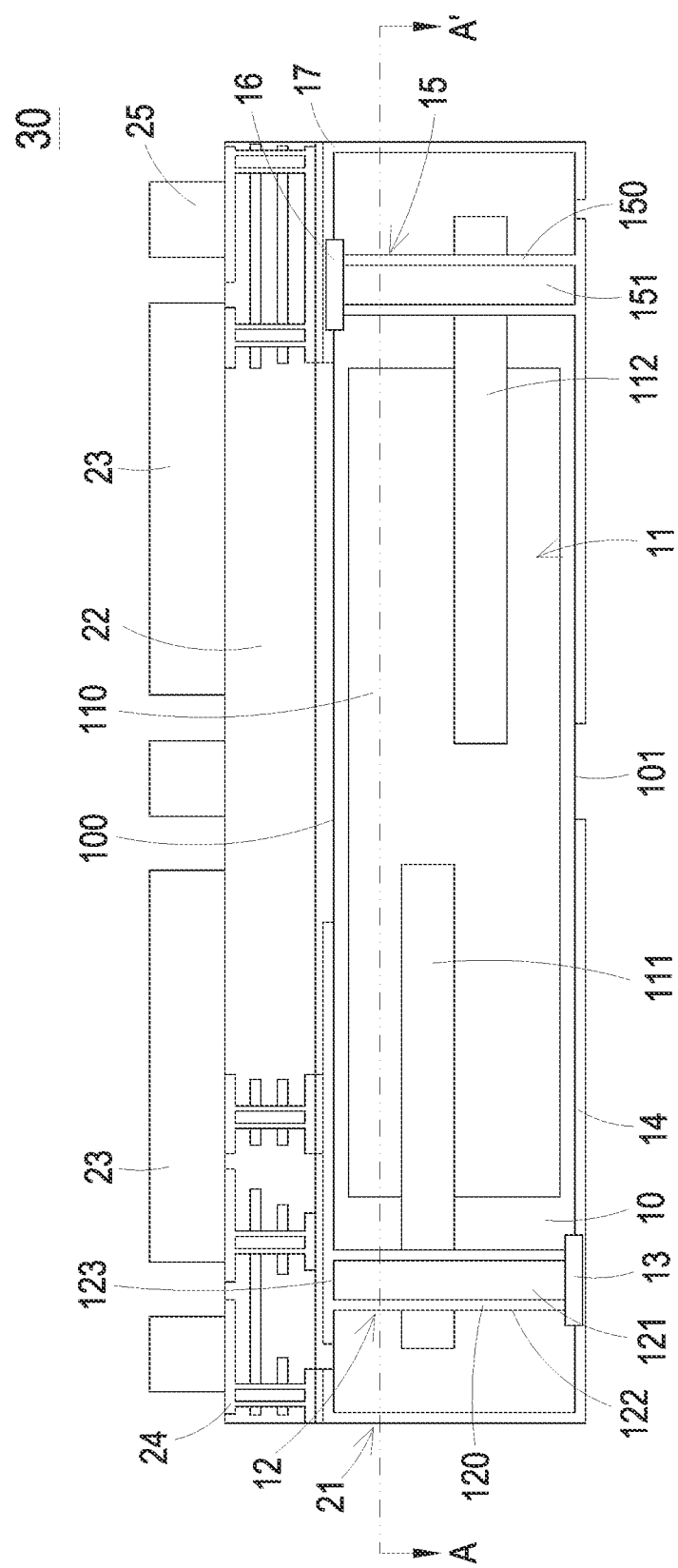
FIG. 17 is a schematic cross-sectional view illustrating a second example of a power module with the substrate of the present disclosure.
Figure 18A:
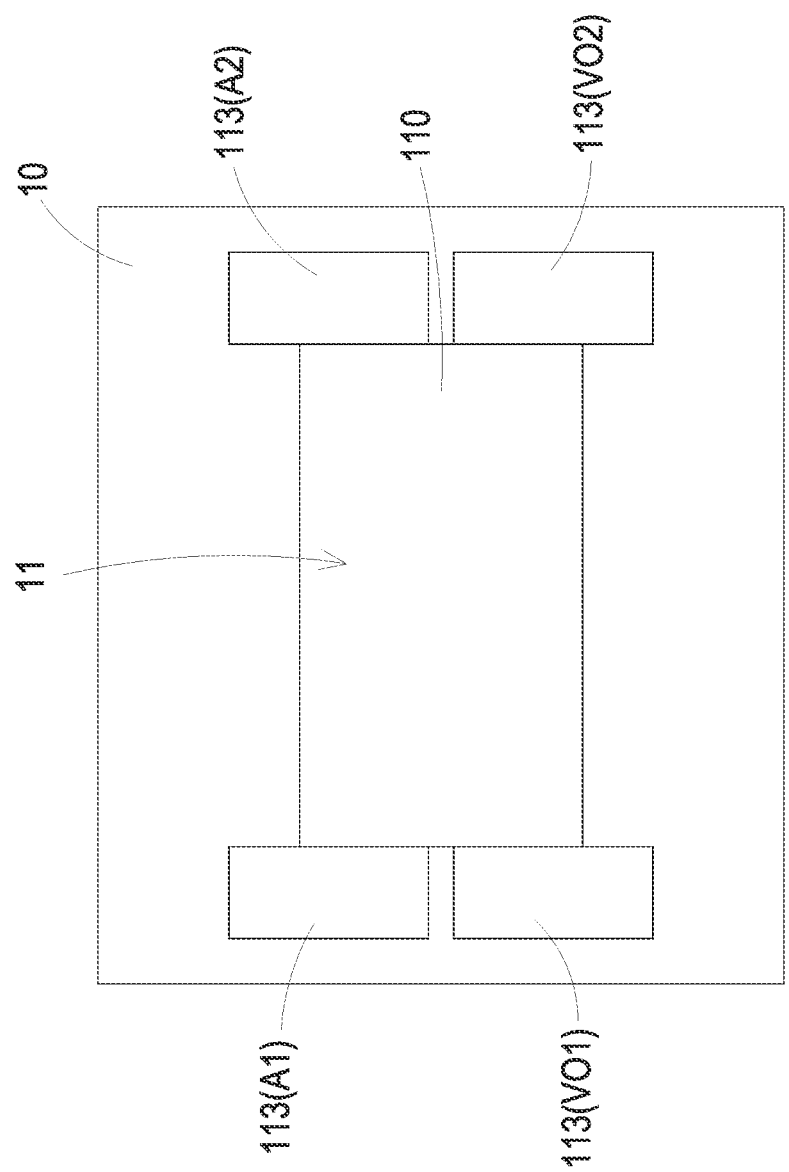
FIG. 18A is a cross-sectional view illustrating the power module of FIG. 17 and taken along the line A-A'.
Figure 18B:
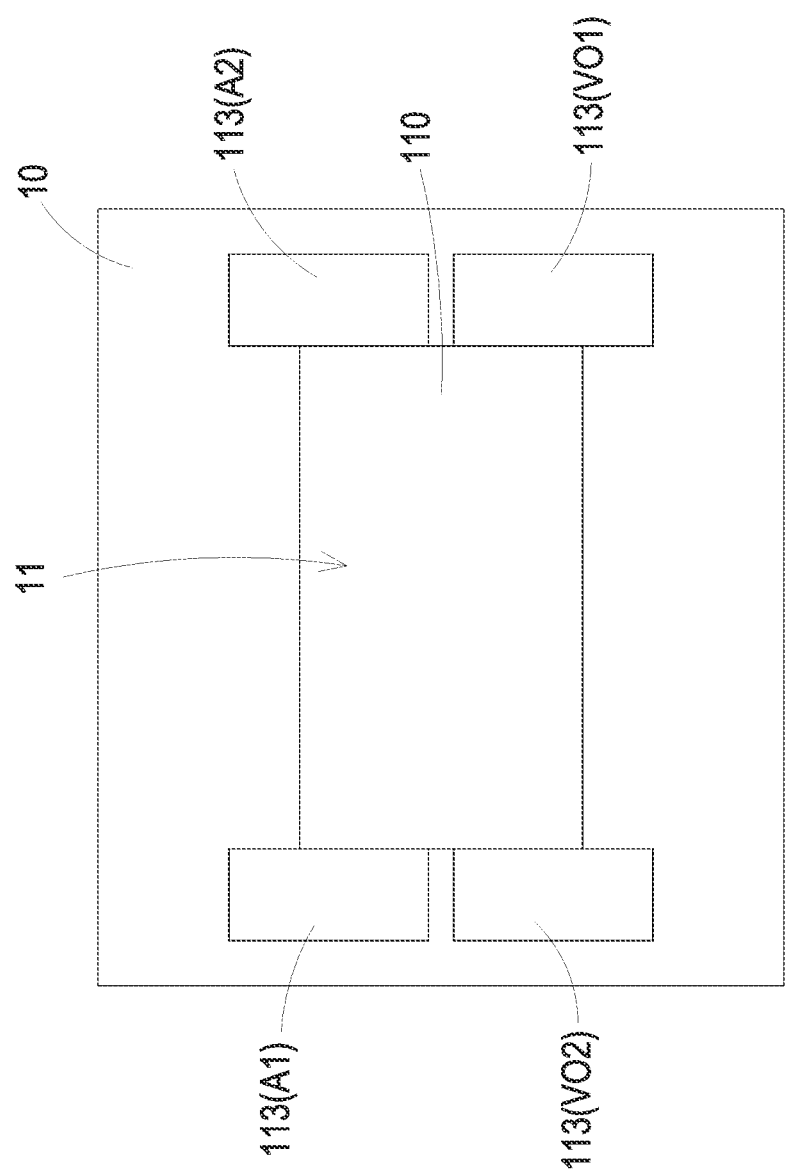
FIG. 18B is a cross-sectional view illustrating a variant example of the power module of FIG. 18A.
Figure 19:
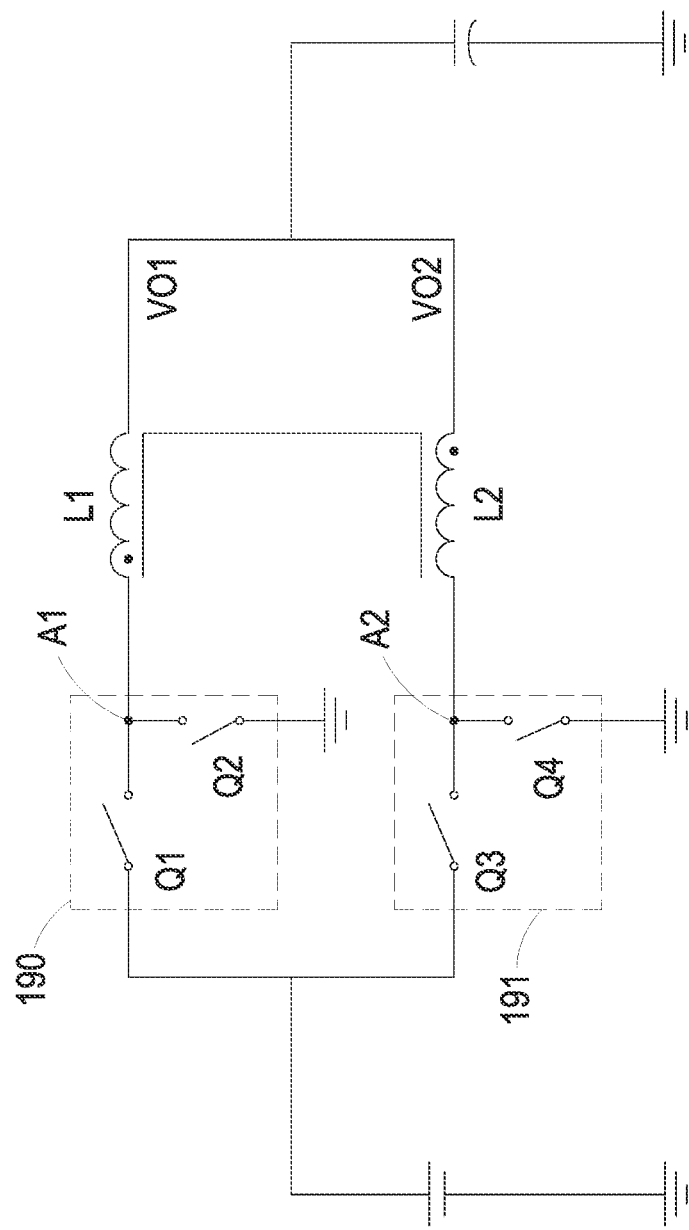
FIG. 19 is a schematic circuit diagram illustrating a voltage conversion circuit using the power module of FIG. 17.

It is noted that the circuitry structure of the voltage conversion circuit is not restricted to that of FIG. 2. Please refer to FIGS. 17, 18A, 18B and 19. FIG. 17 is a schematic cross-sectional view illustrating a second example of a power module with the substrate of the present disclosure. FIG. 18A is a cross-sectional view illustrating the power module of FIG. 17 and taken along the line A-A'. FIG. 18B is a cross-sectional view illustrating a variant example of the power module of FIG. 18A. FIG. 19 is a schematic circuit diagram illustrating a voltage conversion circuit using the power module of FIG. 17. The voltage conversion circuit 19 includes two power units 190, 191 and two inductors L1, L2. The two power units 190 and 191 are connected with an input terminal of the voltage conversion circuit 19. The inductor L1 is connected with the power unit 190 and an output terminal of the voltage conversion circuit 19. The inductor L2 is connected with the power unit 191 and the output terminal of the voltage conversion circuit 19. The power unit 190 includes a half-bridge circuit, which includes a first power switch Q1 and a second power switch Q2. The first power switch Q1, the second power switch Q2 and a first terminal of the inductor L1 are connected to a first node A1. A second terminal (VO1) of the inductor L1 is connected with the output terminal of the voltage conversion circuit 19. The power unit 191 includes a half-bridge circuit, which includes a first power switch Q3 and a second power switch Q4. The first power switch Q3, the second power switch Q4 and a first terminal of the inductor L2 are connected to a second node A2. A second terminal (VO2) of the inductor L2 is connected with the output terminal of the voltage conversion circuit 19.

The structure of the power module 30 of this embodiment is similar to that of the power module 20 as shown in FIG. 16. In comparison with the power module 20 of FIG. 16, the power module 30 of this embodiment includes two power units 23 according to the circuitry structure of the voltage conversion circuit 19 of FIG. 19. In addition, the power module 30 includes two inductors L1 and L2 according to the circuitry structure of the voltage conversion circuit 19. The two inductors L1 and L2 are inverse coupled. Each of the inductors L1 and L2 includes two conducting terminals. In other words, the passive component 11 of the substrate 21 is a multi-branch inverse coupling inductor with four conducting terminals 113 (see FIGS. 18A and 18B).

Please refer to FIG. 18A. Two conducting terminals 113 are located at a first side of the passive component 11. The other two conducting terminals 113 are located at a second side of the passive component 11. The two inductors L1 and L2 are defined by the four conducting terminals 113 and the main body 110 of the passive component 11 collaboratively. The two conducting terminals 113 at the first side of the passive component 11 are formed as the first terminal and the second terminal of the inductor L1 and connected with the first node A1 and the output terminal of the voltage conversion circuit 19 (VO1), respectively. The two conducting terminals 113 at the second side of the passive component 11 are formed as the first terminal and the second terminal of the inductor L2 and connected with the second node A2 and the output terminal of the voltage conversion circuit 19 (VO2), respectively.

The way of connecting the four conducting terminals 113 is not restricted. Please refer to FIG. 18B. Two conducting terminals 113 are opposed to each other and arranged along a first diagonal line of the main body 110 of the passive component 11. These two conducting terminals 113 are formed as the first terminal and the second terminal of the inductor L1 and connected with the first node A1 and the output terminal of the voltage conversion circuit 19 (VO1), respectively. The other two conducting terminals 113 are opposed to each other and arranged along a second diagonal line of the main body 110 of the passive component 11. These two conducting terminals 113 are formed as the first terminal and the second terminal of the inductor L2 and connected with the second node A2 and the output terminal of the voltage conversion circuit 19 (VO2), respectively.

In the power module 20 of FIG. 16 and the power module 30 of FIG. 17, the power units 23 are disposed on the outer side of the power module. In other words, the power units 23 can be directly in contact with the surroundings. Consequently, a great deal of heat can be dissipated to the surroundings. For enhancing the heat dissipating efficiency, a heat sink is attached on the top side of the power module or the power module is disposed in a liquid cooling environment.

Figure 20A:
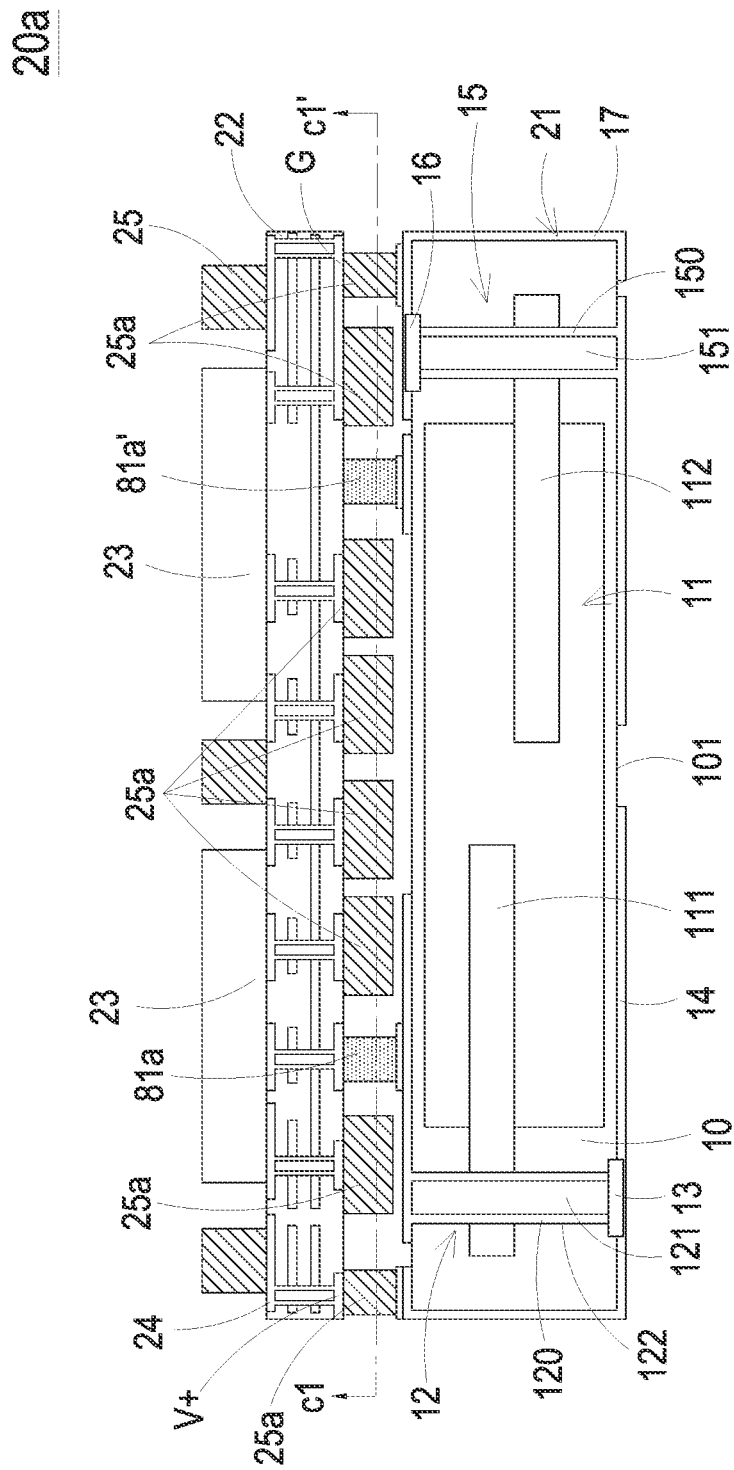
FIG. 20A is a schematic cross-sectional view illustrating a third example of a power module with the substrate of the present disclosure.
Figure 20C:
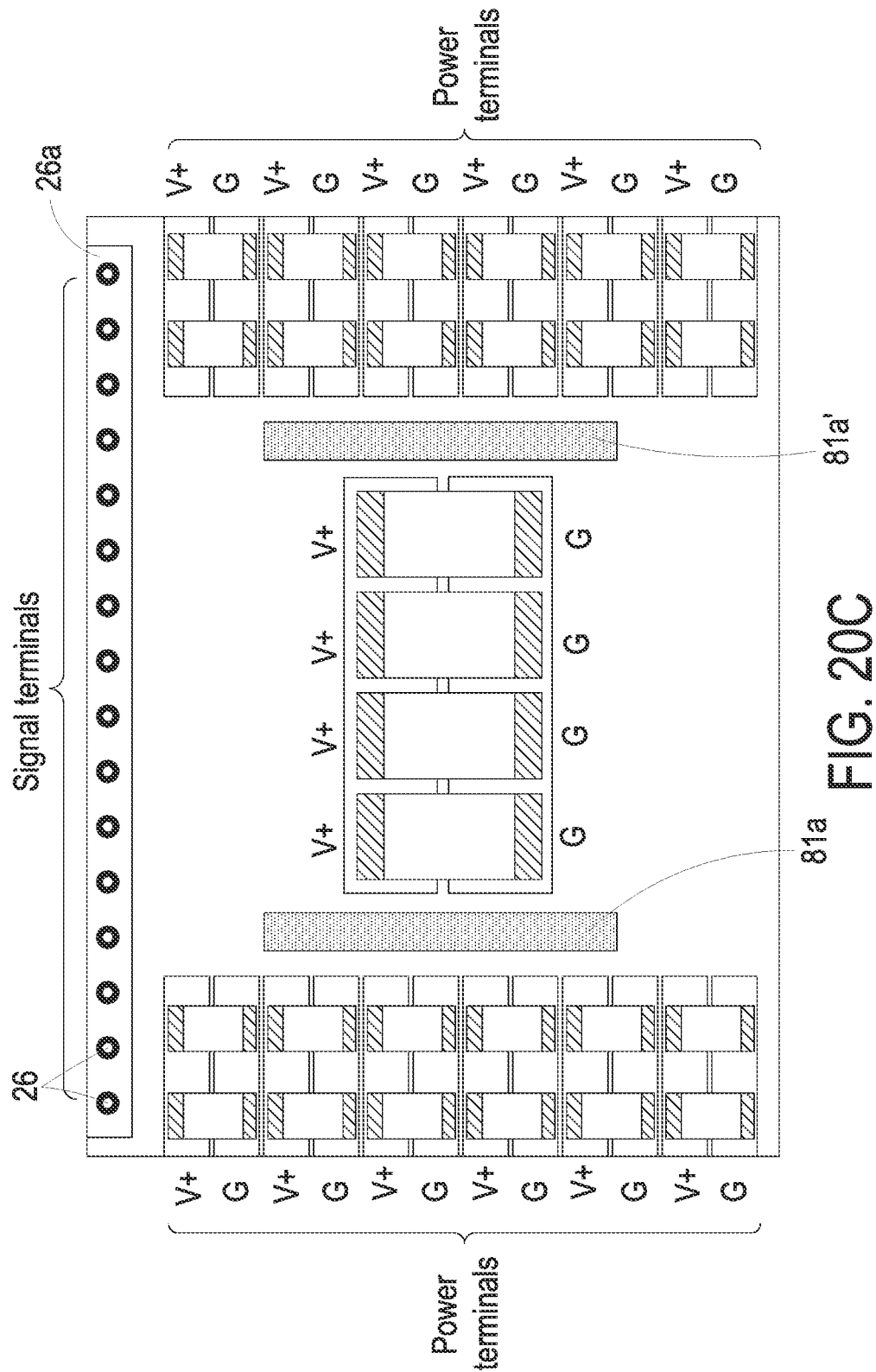
FIG. 20C is a cross-sectional view illustrating the power module of FIG. 20A and taken along the line c1-c1'.
Figure 20D:
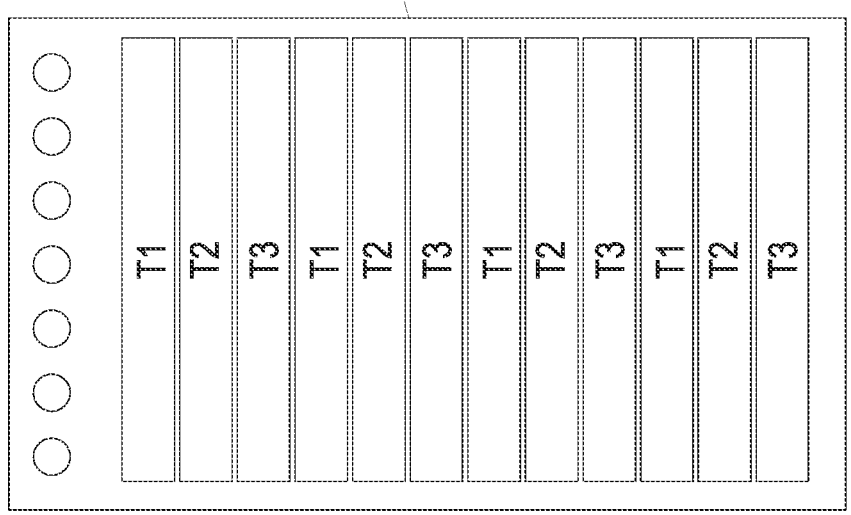
FIG. 20D shows the arrangement of the terminals of the power unit of the power module of FIG. 20A.

FIG. 20A is a schematic cross-sectional view illustrating a third example of a power module with the substrate of the present disclosure. FIG. 20B is a schematic perspective view illustrating an input capacitor between a first carrier plate and the substrate of the power module of FIG. 20A. FIG. 20C is a cross-sectional view illustrating the power module of FIG. 20A and taken along the line c1-c1'. FIG. 20D shows the arrangement of the terminals of the power unit of the power module of FIG. 20A. As shown in FIGS. 20A, 20B, 20C and 20D, in this embodiment, the power module 20a has the circuitry structure of a voltage conversion circuit 18 as shown in FIG. 2 or the circuitry structure of a voltage conversion circuit 19 as shown in FIG. 19. Moreover, the power module 20a of this embodiment is similar to the power module 30 as shown in FIG. 17. In this embodiment, portion of the passive components 25 are disposed on the top surface of the first carrier plate 22, and the other portion of the passive components 25 are disposed on the lower surface of the first carrier plate 22 and located between the first carrier plate 22 and the substrate 21 by attaching method. That is, the passive components 25 located between the power unit 23 and the substrate 21 and located between the first carrier plate 22 and the substrate 21 can be capacitors, which are served as input capacitors. In FIG. 20A, the passive component (i.e., input capacitor) located between the first carrier plate 22 and the substrate 21 is assigned with a reference number 25a. The input capacitor 25a is a capacitor with two terminals. That is, the input capacitor 25a has a first terminal and a second terminal. The first terminal of the input capacitor 25a is connected with the first terminal of the first power switch Q1, and the second terminal of the input capacitor 25a is connected with the second terminal of the second power switch Q2.

As shown in FIGS. 20A and 20B, the first carrier plate 22 has a plurality of first terminals V+ and a plurality of second terminals G. In this embodiment, a plurality of input capacitor 25a are located between the first carrier plate 22 and the substrate 21. A top surface 25b of the first terminal of each of the input capacitors 25a is connected with the first terminal V+ on the lower surface of the first carrier plate 22. A lower surface 25c of the first terminal of each of the input capacitors 25a is connected with the top surface of the substrate 21. A top surface 25b' of the second terminal of each of the input capacitors 25a is connected with the second terminal G on the lower surface of the first carrier plate 22. A lower surface 25c' of the second terminal of each of the input capacitors 25a is connected with the top surface of the substrate 21. In that, the current flows through the terminals of the input capacitors 25a to the first carrier plate 22 on the upper side and the substrate 21 on the lower side. In this embodiment, an electrode stacking direction (as the direction of arrow D shown in FIG. 20B) of the first terminal and the second terminal of the passive component 25 is parallel to the stacking direction of the first carrier plate 22 and the substrate 21.

Please refer to FIG. 20C and FIG. 20A. The current inside the power module 20a flows from the lower surface of the power module 20a (i.e., the lower surface of the substrate 21) through the wiring layer of the substrate 21 to the top surface of the substrate 21, flows through the lower surfaces 25c and the top surfaces 25b of the first terminals of the input capacitors 25a to the first terminals V+ on the lower surface of the first carrier plate 22, flows through the wiring layer of the first carrier plate 22 to the first terminal of the first power switch Q1 of the power unit 23, and then flows from the second terminal of the second power switch Q2 through the wiring layer of the first carrier plate 22 to the second terminals G on the lower surface of the first carrier plate 22, flows through the top surfaces 25b' and the lower surfaces 25c' of the second terminals of the input capacitors 25a to the top surface of the substrate 21, and flows through the wiring layer of the substrate 21 to the lower surface of the substrate 21 (i.e., the lower surface of the power module 20a). As mentioned above, in this embodiment, the input capacitors 25a are disposed between the substrate 21 and the first carrier plate 22. Furthermore, the substrate 21 and the first carrier plate 22 are connected through the two terminals of each of the input capacitors 25a, so that the current flows between the substrate 21 and the first carrier plate 22. In comparison with the structure of the power module 30 shown in FIG. 17, in the structure of the power module 20a of this embodiment, by disposing the input capacitors 25a between the first carrier plate 22 and the substrate 21 and electrically connecting the substrate 21 and the first carrier plate 22 through the two terminals of each of the input capacitors 25a, the current flows directly from the substrate 21 to the input capacitors 25a. It is unnecessary to convey current to the input capacitors 25a through the metallic wiring layer of the first carrier plate 22. Consequently, the current path from the substrate 21 to the input capacitors 25a is shortened, and thus the power loss is reduced.

In addition, as shown in FIG. 20A and FIG. 20C, in some embodiments, in case that the power module 20a has the circuitry structure of the voltage conversion circuit 19 as shown in FIG. 19, the power module 20a further includes at least one conductive column, e.g., copper block 81a or 81a'. Each copper block 81a or 81a' includes a top surface and a lower surface. The copper block 81a is electrically coupled with the first node A1. The copper block 81a' is electrically coupled with the second node A2. The copper block 81a is disposed between the first carrier plate 22 and the substrate 21 and connected to the first carrier plate 22 and the substrate 21. The top surface of the copper block 81a is connected to the lower surface of the first carrier plate 22, and connected to the first node A1 between the first power switch Q1 and the second power switch Q2 of the power unit 23 through the metallic wiring layer of the first carrier plate 22. The top surface of the copper block 81a' is connected to the lower surface of the first carrier plate 22, and connected to the second node A2 between the first power switch Q3 and the second power switch Q4 of the power unit 23 through the metallic wiring layer of the first carrier plate 22. In other embodiments, the power module 20a further includes a plurality of signal terminals 26. The signal terminals 26 are connected to the first carrier plate 22 and the substrate 21 through an adapter plate 26a. The adapter plate 26a is a printed circuit board or be formed by a metallization technology after a molding process, but not limited thereto.

As shown in FIG. 20C and FIG. 20D, in some embodiments, the first terminals V+ and the second terminals G on the lower surface of the first carrier plate 22 are alternately arranged in an array. Since the input capacitors 25a are disposed between the first carrier plate 22 and the substrate 21, the top surfaces 25b, 25b' of the input capacitors 25a connected with the lower surface of the first carrier plate 22 are alternately arranged in an array, and the lower surfaces 25c, 25c' of the input capacitors 25a are also alternately arranged in an array. In addition, as shown in FIG. 20D, the power unit 23 includes a plurality of first terminals T1, a plurality of second terminals T2 and a plurality of third terminals T3. Each of the first terminals T1 is electrically coupled with one of the first terminals V+ of the first carrier plate 22. Each of the second terminals T2 is electrically coupled with one of the second terminals G of the first carrier plate 22. Each of the third terminals T3 is electrically coupled with the first node A1 or the second node A2. The first terminals T1 and the second terminals T2 of the power unit 23 are alternately arranged in an array. The array arrangement of the first terminals T1 and the second terminals T2 of the power unit 23 is corresponding to the array arrangement of the first terminals V+ and second terminals G as shown in FIG. 20C. In that, the distances between the input capacitors 25a and the power unit 23 are approximately equal. Consequently, the efficacy of balancing the current is achieved, and the efficiency of the power module 20a is enhanced.

As mentioned above, the power module generally needs a certain number of input capacitors. In comparison with the conventional method of disposing the input capacitors on the system board, in this embodiment, the required input capacitors 25a are disposed on the power module 20a and located between the first carrier plate 22 and the substrate 21. Consequently, the distances between the input capacitors 25a and the power unit 23 are significantly reduced, and the paths of the input/output loops are shortened. Consequently, power loss is reduced, and the efficiency of the power module 20a is enhanced significantly. On the other hand, the current is conveyed through the terminals of the input capacitors 25a connected between the substrate 21 and the first carrier plate 22. It is unnecessary to dispose an additional component for transferring current. Consequently, reasonable use of space inside the power module 20a is achieved. In that, more of the input capacitors can be disposed in the power module 20a to meet various power requirements.

Figure 20E:
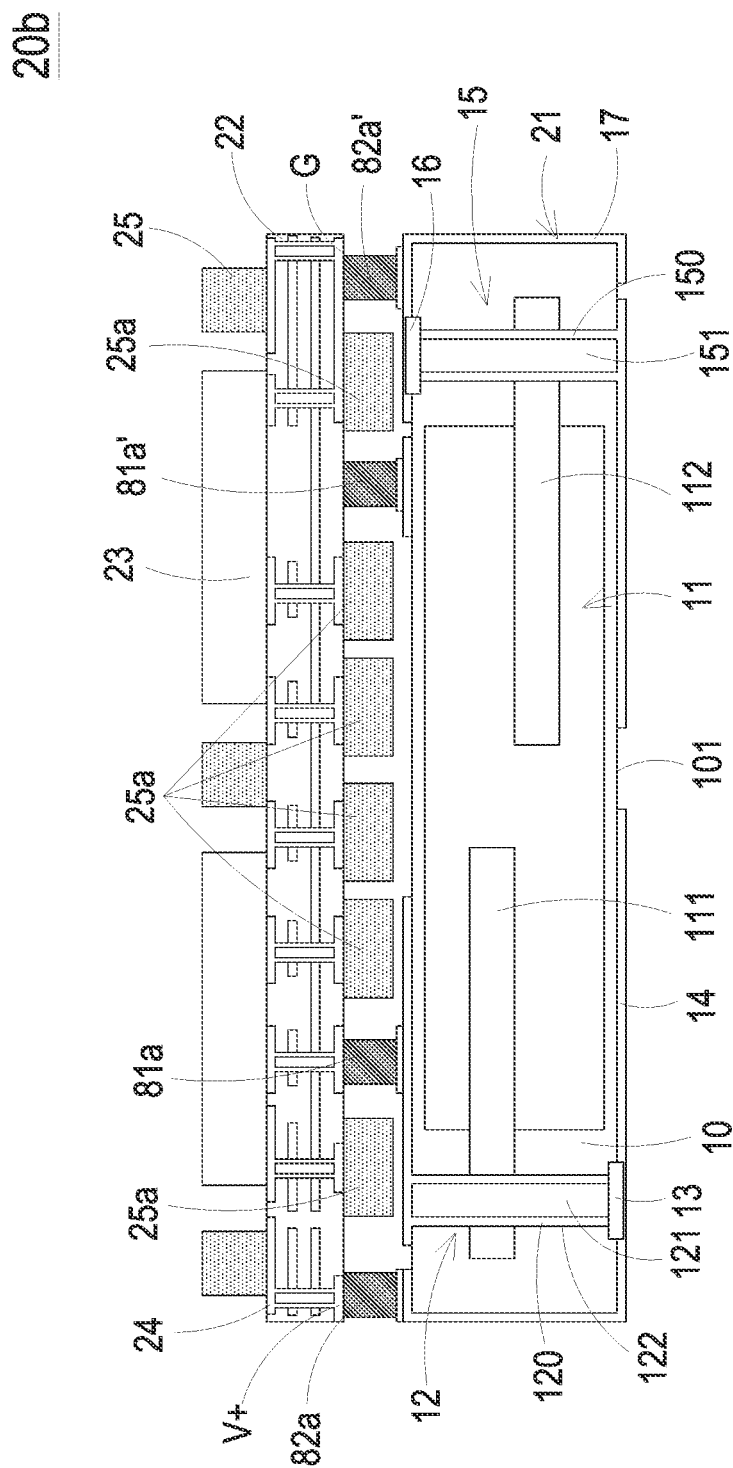
FIG. 20E is a schematic cross-sectional view illustrating a fourth example of a power module with the substrate of the present disclosure.

FIG. 20E is a schematic cross-sectional view illustrating a fourth example of a power module with the substrate of the present disclosure. As shown in FIG. 20E, in this embodiment, the structure of the power module 20b is similar to that of the power module 20a as shown in FIG. 20A. In comparison with the power module 20a of FIG. 20A, the power module 20b of this embodiment further includes a plurality of first conductive components, e.g., copper blocks 82a, 82a'. A top surface of the copper block 82a is connected to the first terminal V+ of the first carrier plate 22. A top surface of the copper block 82a' is connected to the second terminal G of the first carrier plate 22. The lower surfaces of the copper blocks 82a, 82a' are connected to the top surface of the substrate 21. Since the thickness of the terminals of the conventional capacitors are thin, e.g., 10 μm, the conventional power module cannot meet the requirement of high current-flowing capacity. In this embodiment, the copper blocks 82a, 82a' are disposed in the power module 20b and connected between the first carrier plate 22 and substrate 21 for improving the current transferring ability of the power module 20b. As shown in FIG. 20E, the current inside the power module 20b flows from the lower surface of the power module 20b (i.e., the lower surface of the substrate 21) through the wiring layer of the substrate 21 to the top surface of the substrate 21, flows through the copper block 82a to the first terminals V+ on the lower surface of the first carrier plate 22, flows through the wiring layer of the first carrier plate 22 to the first terminal of the first power switch Q1 of the power unit 23, and then flows from the second terminal of the second power switch Q2 through the wiring layer of the first carrier plate 22 to the second terminals G on the lower surface of the first carrier plate 22, flows through the copper block 82a' to the top surface of the substrate 21, and flows through the wiring layer of the substrate 21 to the lower surface of the substrate 21 (i.e., the lower surface of the power module 20b). It is obvious that the current flows through the wiring layer of the substrate 21 to the top surface of the substrate 21, flows through the copper block 82a to the lower surface of the first carrier plate 22, and then flows through the metallic wiring layer of the first carrier plate 22 to the first terminals of the input capacitors 25a. In comparison with the current path shown in FIG. 20A, the current path in this embodiment is increased. However, in FIG. 20A, the current flows from the substrate 21 through the terminals of the input capacitors 25a to the first carrier plate 22, and then flows through the metallic wiring layer of the first carrier plate 22 to the power unit 23. In comparison with the embodiment shown in FIG. 20A, a cross-sectional area of the copper block 81a is much greater than that of the terminal of the input capacitor 25a. Therefore, the current-flowing capacity of the power module 20b of this embodiment is significantly increased, and the efficacy of high current-flowing capacity is achieved. Consequently, the power loss is reduced, and the efficiency of the power module 20b is enhanced.

Optionally, a height of the copper block 81a protruding from the lower surface of the first carrier plate 22 is equal to a height of the input capacitor 25a protruding from the lower surface of the first carrier plate 22, or the height of the copper block 81a protruding from the lower surface of the first carrier plate 22 is greater than the height of the input capacitor 25a protruding from the lower surface of the first carrier plate 22. In case that the height of the copper block 81a protruding from the lower surface of the first carrier plate 22 is greater than the height of the input capacitor 25a protruding from the lower surface of the first carrier plate 22, the contact of the input capacitors 25a and the substrate 21 is avoided. Consequently, the reliability of the power module 20b is enhanced.

Figure 20F:
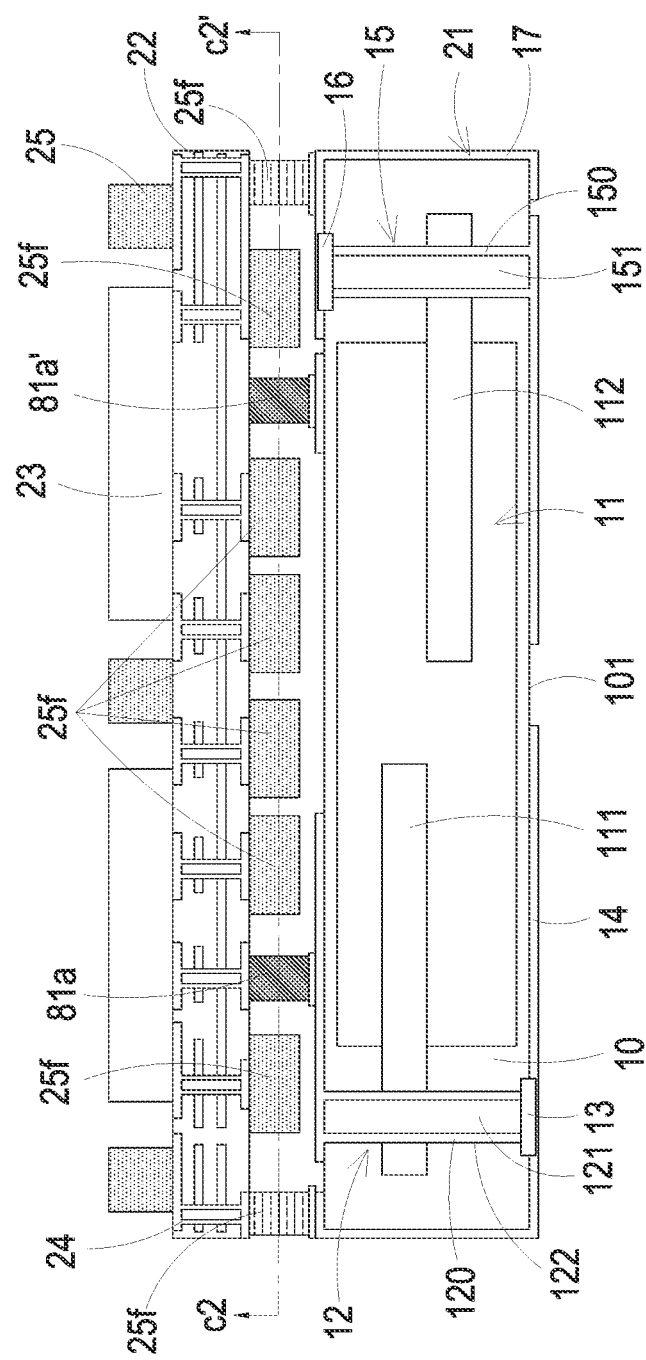
FIG. 20F is a schematic cross-sectional view illustrating a fifth example of a power module with the substrate of the present disclosure.
Figure 20H:
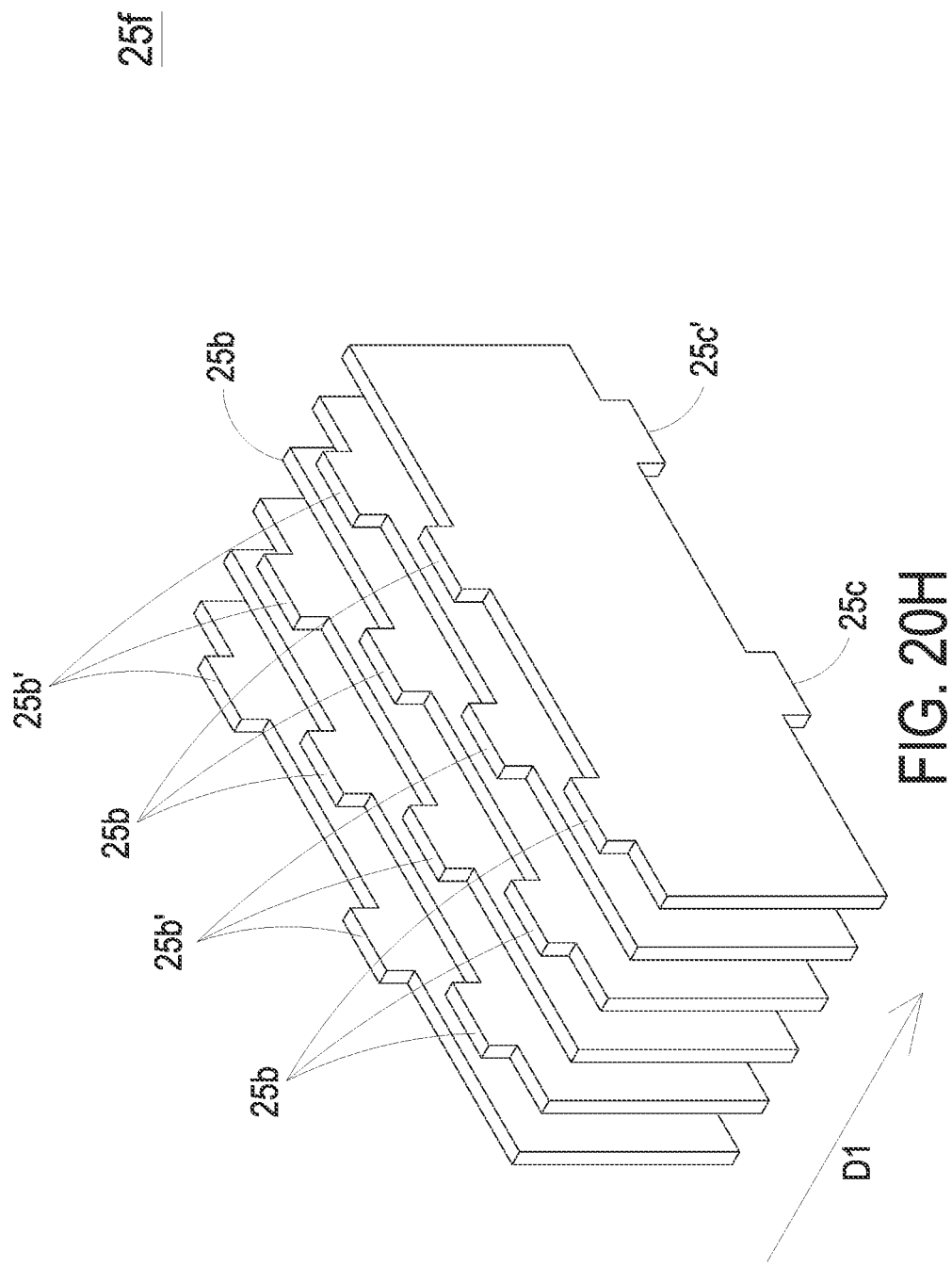
FIG. 20H is a schematic perspective view illustrating an input capacitor between a first carrier plate and the substrate of the power module of FIG. 20F.

FIG. 20F is a schematic cross-sectional view illustrating a fifth example of a power module with the substrate of the present disclosure. FIG. 20G is a cross-sectional view illustrating the power module of FIG. 20F and taken along the line c2-c2'. FIG. 20H is a schematic perspective view illustrating an input capacitor between a first carrier plate and the substrate of the power module of FIG. 20F. In the embodiment shown in FIG. 20E, the copper block 82a, 82a' is used to enhance the current-flowing capacity of the power module 20b. However, in this way, the number of the input capacitors 25a is correspondingly reduced due to the space limitation of the power module 20b. Therefore, in this embodiment, the power module 20c further includes a plurality of input capacitors 25f having specific structure (i.e., a multi-layer stacked structure) to replace the input capacitors 25a shown in FIG. 20E. An electrode stacking direction (as the direction of arrow D1 shown in FIG. 20H) of two terminals of each of the input capacitors 25f is perpendicular to the stacking direction of the first carrier plate 22 and the substrate 21. In this way, the current flows through the first terminals and the second terminals of the input capacitors 25a to the first carrier plate 22 on the upper side and the substrate 21 on the lower side. In comparison with the structure of the conventional capacitor, each of the multi-layer stacked structures of the input capacitors 25f is capable of conveying current. Therefore, the requirement of high current-flowing capacity is satisfied. In addition, in comparison with the embodiment shown in FIG. 20E, more of the input capacitors 25f are disposed in the limited space of the power module 20c of this embodiment, and the requirement of high current-flowing capacity is satisfied. Accordingly, the distances between the input capacitors 25f and the substrate 21 are significantly reduced, and the paths of the input/output loops are shortened. Consequently, power loss is reduced, and the efficiency of the power module 20a is significantly enhanced. Furthermore, the input capacitors 25f are disposed in the power module 20c and each of the multi-layer stacked structures of the input capacitors 25f can convey current, so that the copper blocks 81a, 81a' can be omitted. Consequently, the cost of the power module 20c of this embodiment is reduced.

In addition, similar to the input capacitor 25a described previously, in this embodiment, each of the input capacitors 25f includes a first terminal and a second terminal. A top surface 25b of the first terminal of each of the input capacitors 25f is connected with the first terminal V+ on the lower surface of the first carrier plate 22. A top surface 25b' of the second terminal of each of the input capacitors 25f is connected with the second terminal G on the lower surface of the first carrier plate 22. A lower surface 25c of the first terminal of each of the input capacitors 25f is connected with the top surface of the substrate 21. A lower surface 25c' of the second terminal of each of the input capacitors 25f is connected with the top surface of the substrate 21.

Referring to the power modules 20a, 20b and 20c, in some embodiments, at least a part of the input capacitors 25f are embedded in the first carrier plate 22. The first terminal of the input capacitor 25f is connected with the first terminal of the first power switch Q1 of the power unit 23 through the metallic wiring layer of the first carrier plate 22, and/or the second terminal of the input capacitor 25f is connected with the second terminal of the second power switch Q2 of the power unit 23 through the metallic wiring layer of the first carrier plate 22. By embedding the input capacitor 25f in the first carrier plate 22, the path between the input capacitor 25f and the power unit 23 is shortened in comparison with the power modules 20a, 20b and 20c. Consequently, the power loss is reduced. Moreover, in case that all of the input capacitors 25a or the input capacitors 25f disposed on the lower surface of the first carrier plate 22 are embedded in the first carrier plate 22, the lower surface of the first carrier plate 22 can be connected with the top surface of the substrate 21 directly. Consequently, the thickness of the power module is reduced, and the power density is enhanced.

Figure 20I:
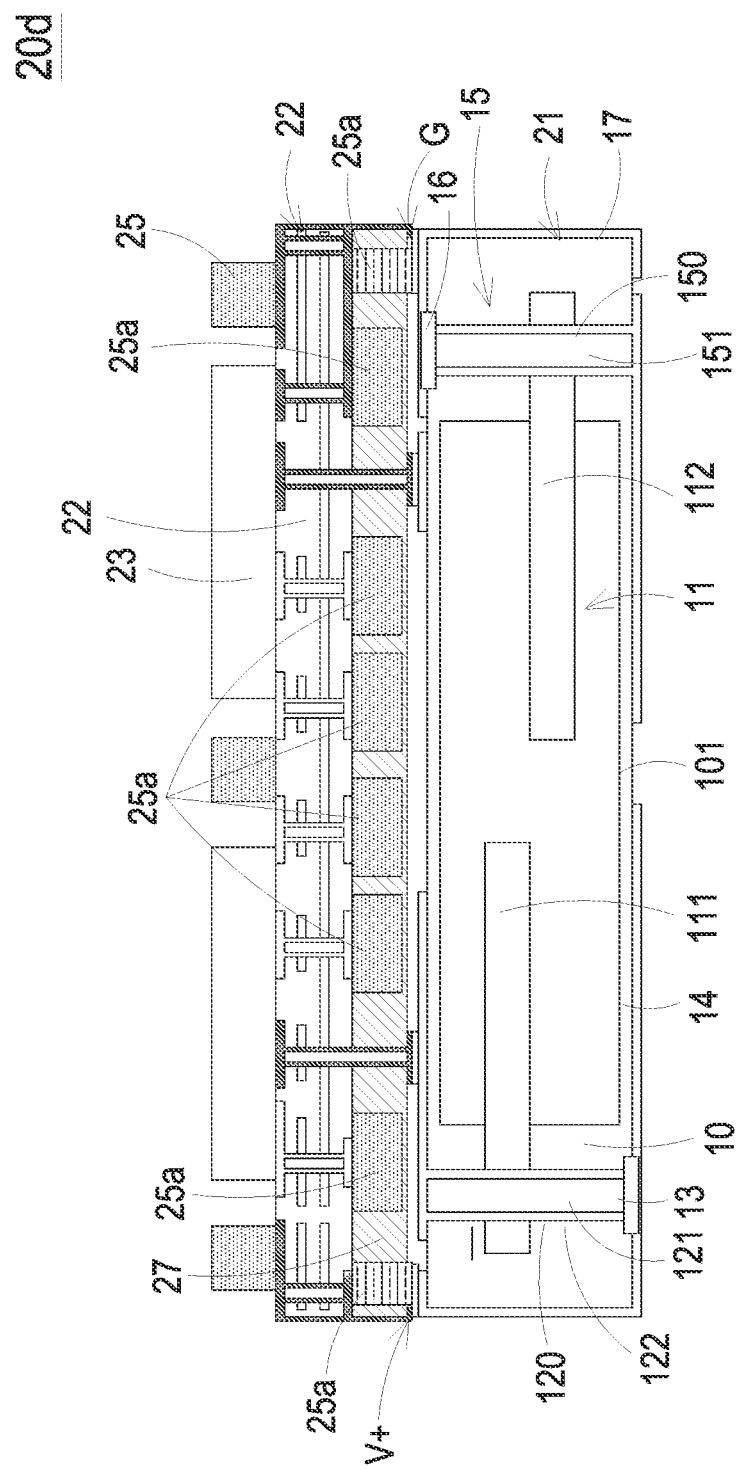
FIG. 20I is a schematic cross-sectional view illustrating a sixth example of a power module with the substrate of the present disclosure.

FIG. 20I is a schematic cross-sectional view illustrating a sixth example of a power module with the substrate of the present disclosure. As shown in FIG. 20I, for meeting the requirement of high current-flowing capacity, the power module 20d of this embodiment further includes a molding compound layer 27 in comparison with the structures shown in FIG. 20A, 20E or 20F. In the structure of FIG. 20I, the structure of FIG. 20A is used as an example for description. The molding compound layer 27 is utilized to perform a molding process on the first carrier plate 22 and the components attached to the lower surface of the first carrier plate 22. That is, the molding compound layer 27 covers the input capacitors 25a and at least a part of the first carrier plate 22. In addition, a molding unit is formed by the molding compound layer 27, the input capacitors 25a and the first carrier plate 22. A second conductive component is formed on the molding unit by the metallization technology. The second conductive component is extended from the top surface of the molding unit to the lower surface of the molding unit along the lateral side of the molding unit. A power terminal and/or a signal terminal are formed on the top surface and the lower surface of the molding unit, respectively. Consequently, terminals are formed on both of the two surfaces of the molding unit. In comparison with the power modules 20a, 20b and 20c, the number of the current paths is increased, and thus the total cross-sectional area of the current paths is increased. Consequently, the current-flowing capacity is further enhanced. Furthermore, in some embodiments, the second conductive component is extended from the top surface of the molding unit to the lower surface of the molding unit through the interior of the molding unit, e.g., by forming a connection hole, to form the terminals on the top surface and the lower surface of the molding unit. In the embodiment that the second conductive component is extended from the top surface of the molding unit to the lower surface of the molding unit along the lateral side of the molding unit, the space utilization ratio of the power module 20d is increased. According to the description above, in this embodiment, the adapter plate 26a, the copper block 81a or 81a' and the first conductive components 82a, 82a' of the above-mentioned embodiments are omitted in the power module 20d. Consequently, more of the input capacitors are disposed in the limited space of the power module 20d of this embodiment. The power loss is further reduced, and the efficiency of the power module 20d is enhanced.

Figure 20J:
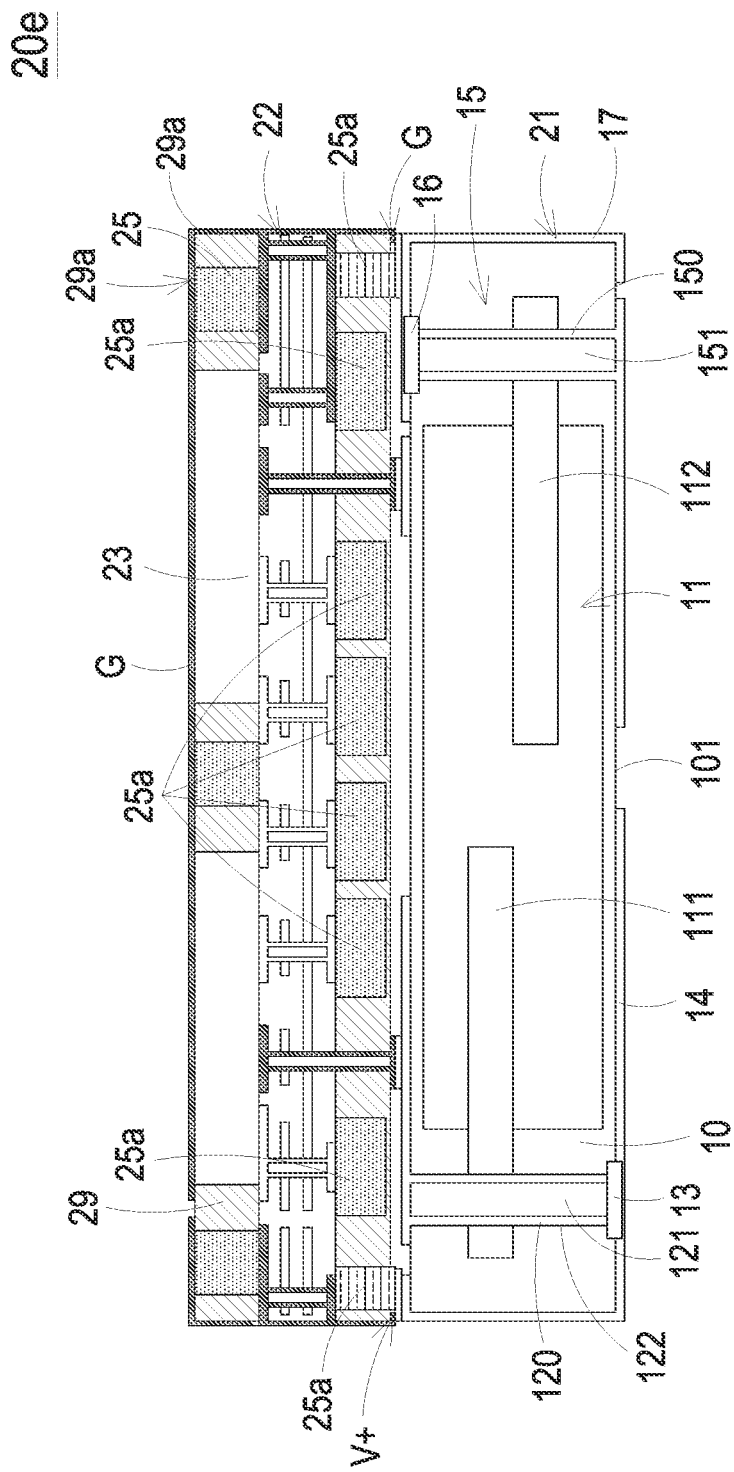
FIG. 20J is a schematic cross-sectional view illustrating a seventh example of a power module with the substrate of the present disclosure.

FIG. 20J is a schematic cross-sectional view illustrating a seventh example of a power module with the substrate of the present disclosure. The structure of the power module 20e of this embodiment is similar to that of the power module 20d as shown in FIG. 20I. In comparison with the power module 20d of FIG. 20I, the molding compound layer is distinguished. In the power module 20d of FIG. 20I, the molding compound layer 27 is utilized to perform the molding process on the first carrier plate 22 and the components attached to the lower surface of the first carrier plate 22. In this embodiment, the power module 20e includes a molding compound layer 29 to replace the molding compound layer 27. The molding compound layer 29 is utilized to perform the molding process on the components attached to the top surface and the lower surface of the first carrier plate 22 and at least a part of the first carrier plate 22. That is, the molding compound layer 29 covers the input capacitors 25a, at least a part of the first carrier plate 22 and the power unit 23. In addition, a molding unit is formed by the molding compound layer 29, the input capacitors 25a, the first carrier plate 22 and the power unit 23. Then, the metallization technology is performed to form the second conductive component connected between the top surface of the molding unit and the lower surface of the molding unit, and thus the terminals are formed on both of the two surfaces of the molding unit. Furthermore, in this embodiment, the arrangements of the terminals disposed on the top surface of the molding unit and the lower surface of the molding unit are same. In that, the top surface of the molding unit is connected with the top surface of the substrate 21, and the lower surface of the molding unit is connected with the top surface of the substrate 21 to form the power module. Consequently, the power module 20e of this embodiment is more flexible.

In some embodiments, the terminals disposed on the top surface of the molding unit (e.g., the terminal 29a shown in FIG. 20J) cover at least a part of the power unit 23 to reduce the thermal resistance along an upward direction, and thus the heat can be dissipated through the top surface of the molding unit more rapidly. Moreover, in some embodiments, a heat sink is disposed on the power module 20e. That is, the heat sink is disposed on the top surface of the molding unit (not shown). Since the power module 20e has the molding compound layer 29 which covers both of the top surface and the lower surface of the first carrier plate 22, the reliability of the power module 20e is enhanced, and the heat sink is prevented from contacting the power unit 23 by the molding compound layer 29. Consequently, damage of the power unit 23 is avoided, and the power module 20e can operate normally.

Figure 21:
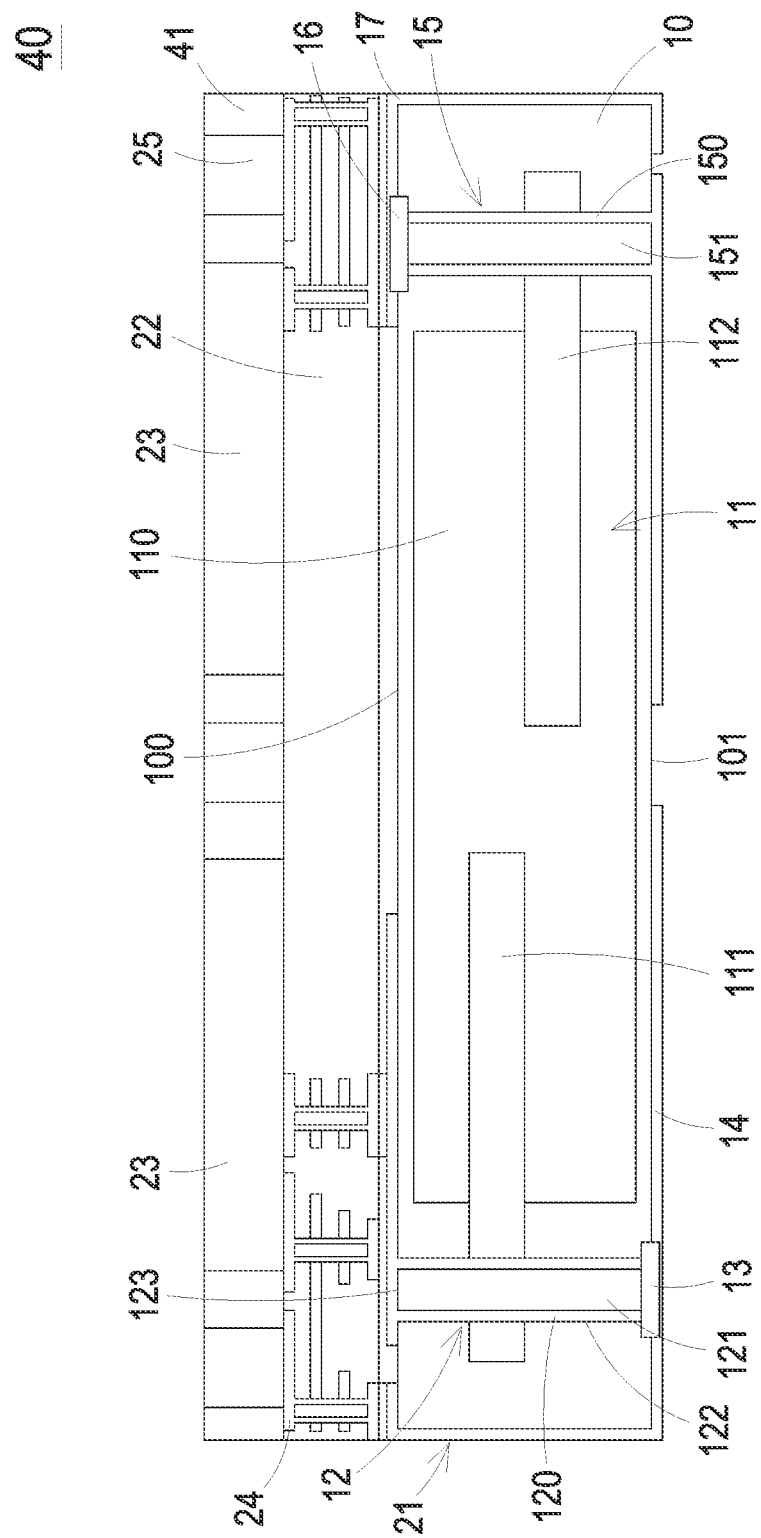
FIG. 21 is a schematic cross-sectional view illustrating an eighth example of a power module with the substrate of the present disclosure.

FIG. 21 is a schematic cross-sectional view illustrating an eighth example of a power module with the substrate of the present disclosure. The structure of the power module 40 of this embodiment is similar to that of the power module 30 as shown in FIG. 17. In comparison with the power module 30 of FIG. 17, the power module 40 of this embodiment further includes a molding compound layer 41. The molding compound layer 41 is disposed on the top surface of the first carrier plate 22. The power units 23 and the at least one additional passive component 25 on the top surface of the first carrier plate 22 are encapsulated by the molding compound layer 41. The molding compound layer 41 can prevent the moisture from entering the power module 40. Moreover, the heat from the first carrier plate 22 can be dissipated to the surroundings through the molding compound layer 41. Consequently, the heat dissipating efficiency of the power module 40 is enhanced, the possibility of causing damage of the power units 23 is minimized, and the insulation efficacy is increased. In some embodiments, the top surface of the power unit 23 is exposed outside the top surface of the molding compound layer 41 and located at the same level with the top surface of the molding compound layer 41. Consequently, the heat dissipating efficacy of the power unit 23 is further enhanced.

Figure 22:
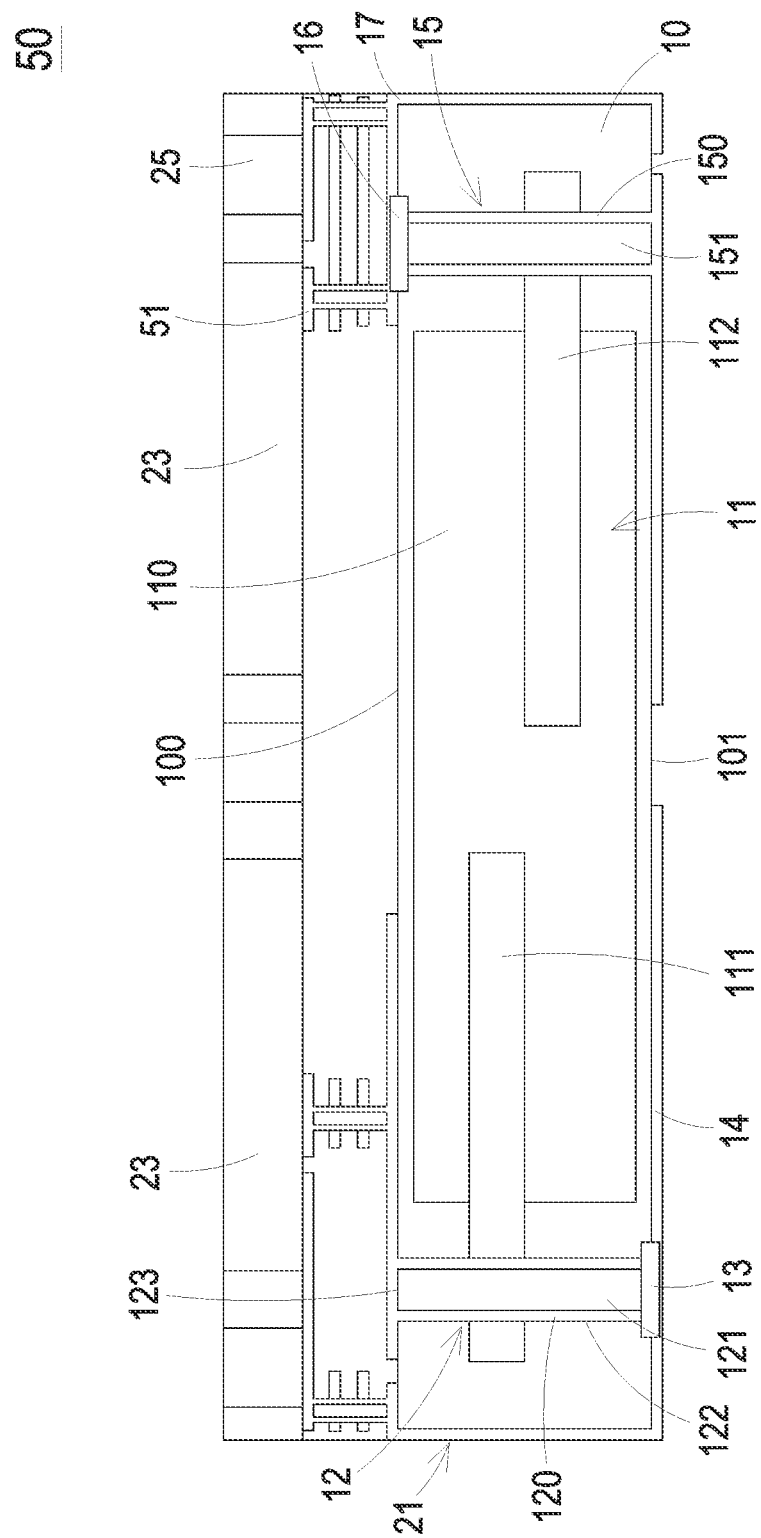
FIG. 22 is a schematic cross-sectional view illustrating a ninth example of a power module with the substrate of the present disclosure.

FIG. 22 is a schematic cross-sectional view illustrating a ninth example of a power module with the substrate of the present disclosure. The structure of the power module 50 of this embodiment is similar to that of the power module 40 as shown in FIG. 21. In comparison with the power module 40 of FIG. 21, the power module 50 of this embodiment omits the first carrier plate 22 on the substrate 21 as shown in FIG. 21. In this embodiment, an insulating medium layer made of the same material as the first insulation layer 10 is formed on the top surface 100 of the first insulation layer 10 of the substrate 21. In other words, the insulating medium layer is integrated with the first insulation layer 10. Moreover, at least one wiring layer 51 is formed in the insulating medium layer by using the metallization technology. The electrodes of the substrate 21 are connected with the top surface of the insulating medium layer through the wiring layer 51. The power unit 23 is disposed on the wiring layer 51. The node between the first power switch and the second power switch of each power unit 23 is connected with the electrode (e.g., the first electrode) on the top surface 100 of the first insulation layer 10 through the wiring layer 51.

In some embodiments, the power module includes a plurality of wiring layers 51, and a plurality of conductive holes are formed in the insulating medium layer. Moreover, the plurality of wiring layers 51 are electrically connected with each other through the plurality of conductive holes. In case that the conductive holes are located over the main body 110 of the passive component 11, the conductive holes are blind holes. Consequently, the formation of the conductive holes will not damage the main body 110 of the passive component 11. In an embodiment, the blind holes are formed by using a depth-controlled drilling process.

As mentioned above, the insulating medium layer is directly formed on the top side of the first insulation layer 10, and the at least one wiring layer 51 is formed in the insulating medium layer. Moreover, the node between the first power switch and the second power switch of each power unit 23 is connected with the electrode on the top surface 100 of the first insulation layer 10 through the wiring layer 51. Due to this structural design, the thickness of the power module 50 can be reduced. Since the path of the overall power module 50 is shortened, the power density and the operating efficient are enhanced.

Figure 23:
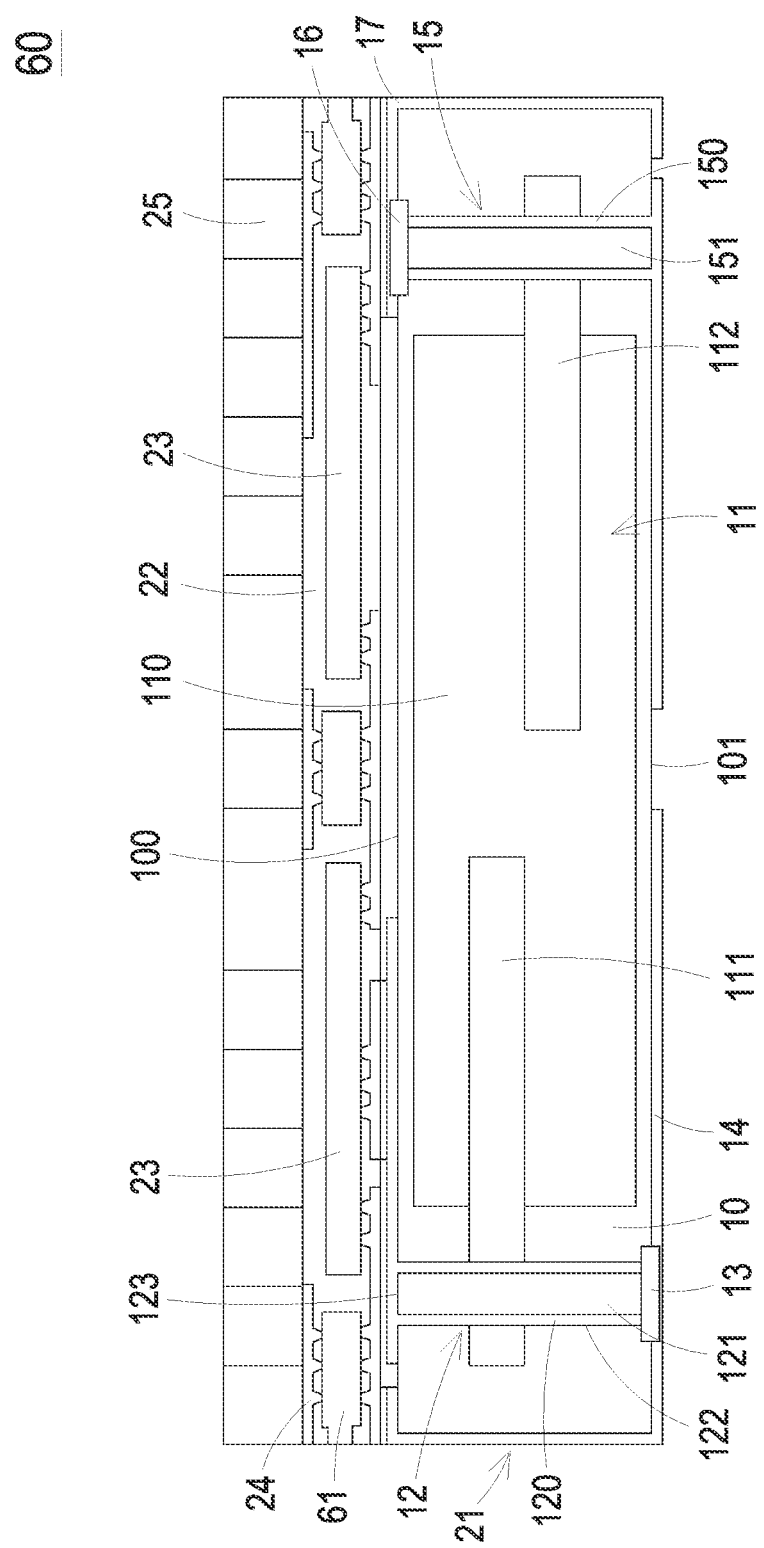
FIG. 23 is a schematic cross-sectional view illustrating a tenth example of a power module with the substrate of the present disclosure.

FIG. 23 is a schematic cross-sectional view illustrating a tenth example of a power module with the substrate of the present disclosure. The structure of the power module 60 of this embodiment is similar to that of the power module 40 as shown in FIG. 21. In comparison with the power module 40 of FIG. 21, the power unit 23 of the power module 60 of this embodiment is embedded in the first carrier plate 22. Since the power unit 23 is embedded in the first carrier plate 22, the power module 60 further includes a lead frame as a foundation frame. The lead frame is embedded in the first carrier plate 22 in order to implement the conduction along the vertical direction of the first carrier plate 22. Alternatively, a printed circuit board is embedded in the first carrier plate 22 and formed as the foundation frame. The printed circuit board is used to implement the conduction along the vertical direction of the first carrier plate 22. Since power unit 23 is embedded in the first carrier plate 22 of the power module 60, the top surface of the first carrier plate 22 has more space for disposing the at least one additional passive component 25. Consequently, the performance of the power module 60 is increased.

Alternatively, the technology of the embedded power unit 23 of the embodiment shown in FIG. 22 can be utilized in the embodiment shown in FIG. 23. That is, the power unit 23 is embedded in the wiring layer 51 as shown in FIG. 22.

Figure 24:
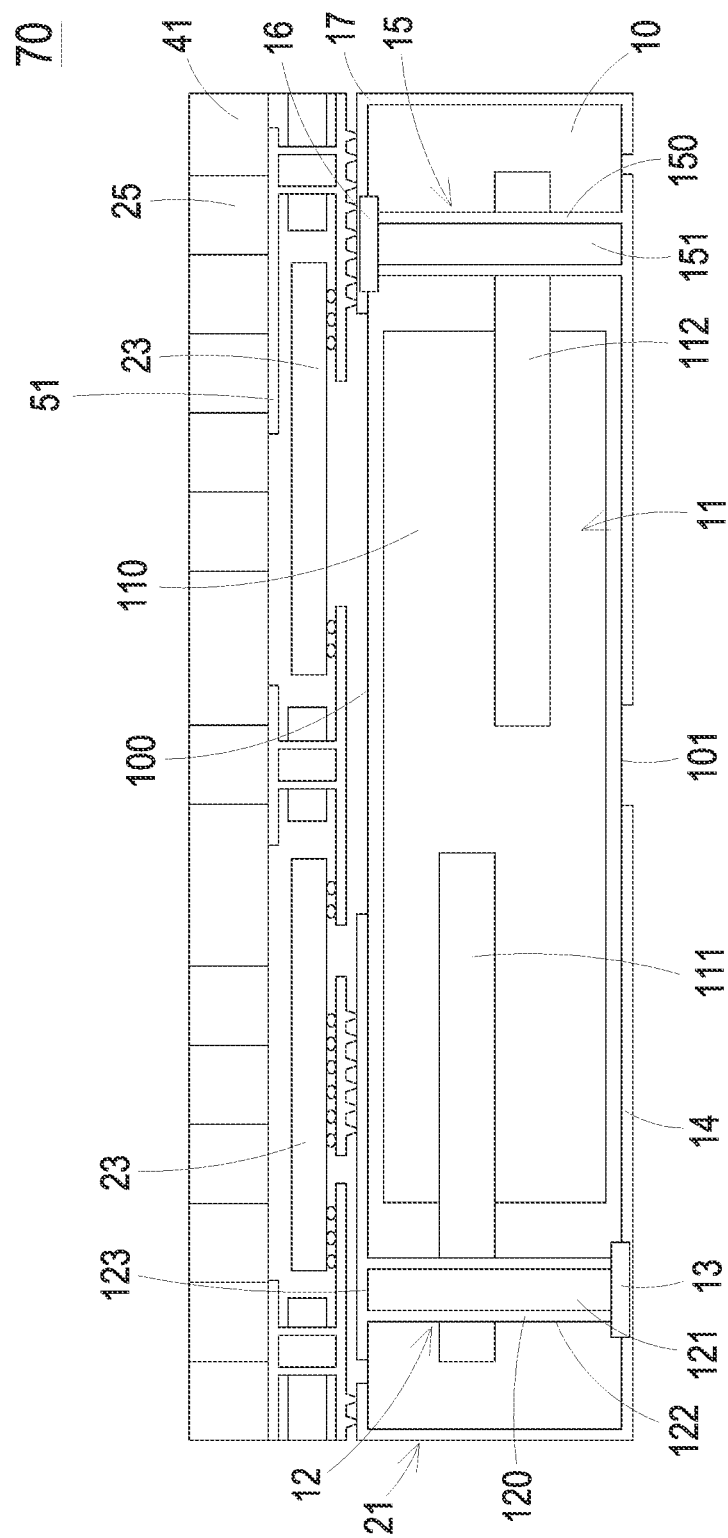
FIG. 24 is a schematic cross-sectional view illustrating an eleventh example of a power module with the substrate of the present disclosure.

FIG. 24 is a schematic cross-sectional view illustrating an eleventh example of a power module with the substrate of the present disclosure. The structure of the power module 70 of this embodiment is similar to that of the power module 50 as shown in FIG. 22. In comparison with the power module 50 of FIG. 22, the power unit 23 of the power module 70 of this embodiment is embedded in the at least one wiring layer 51. For example, the power unit 23 is embedded in the at least one wiring layer 51 through a flip chip technology, wherein bumps or solder balls are used as the pins.

Figure 25:
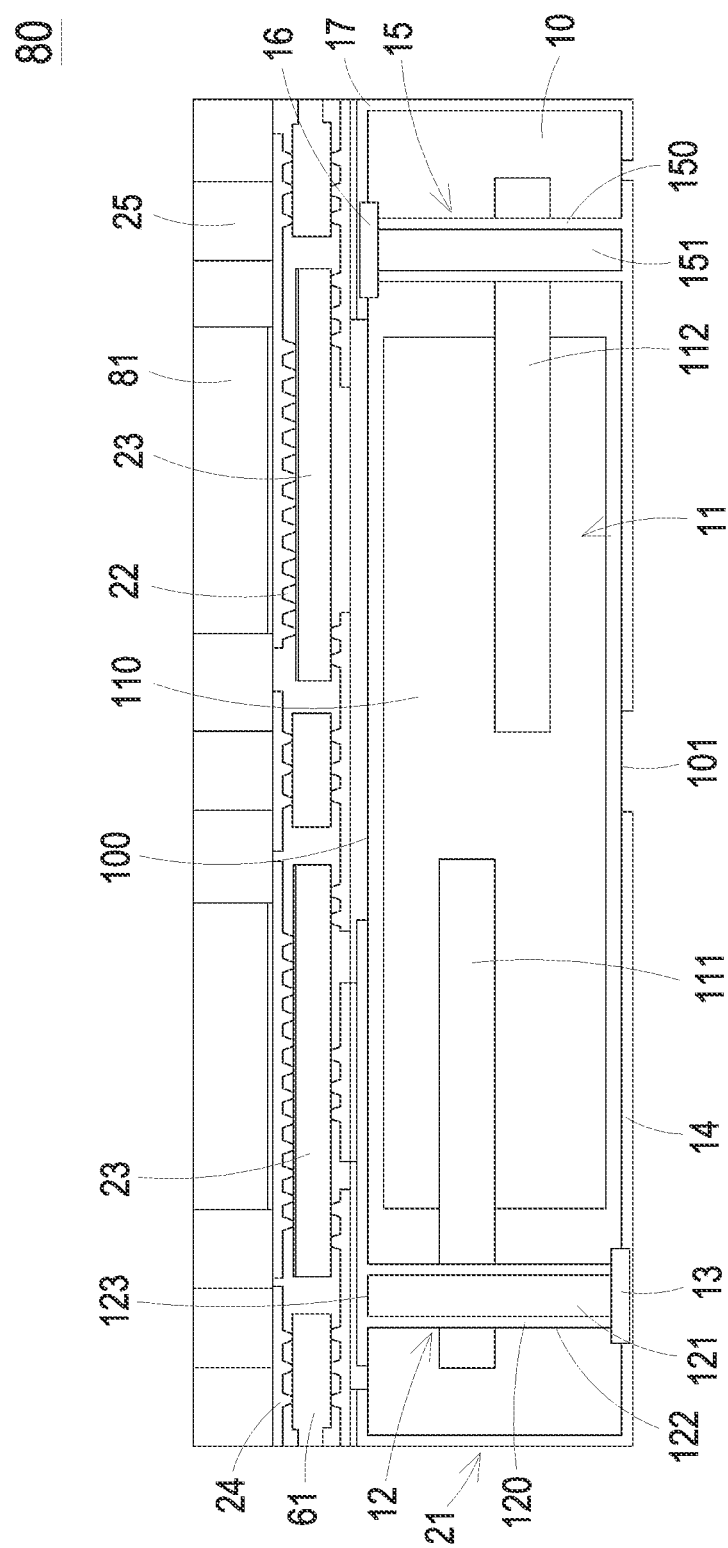
FIG. 25 is a schematic cross-sectional view illustrating a twelfth example of a power module with the substrate of the present disclosure.

FIG. 25 is a schematic cross-sectional view illustrating a twelfth example of a power module with the substrate of the present disclosure. The structure of the power module 80 of this embodiment is similar to that of the power module 60 as shown in FIG. 23. In comparison with the power module 60 of FIG. 23, the power module 80 of this embodiment further includes at least one copper block 81. The at least one copper block 81 is disposed on the top surface of the first carrier plate 22 and aligned with the corresponding power unit 23. Due to the copper block 81, the heat dissipating efficiency of the power module 80 is increased.

Figure 26:
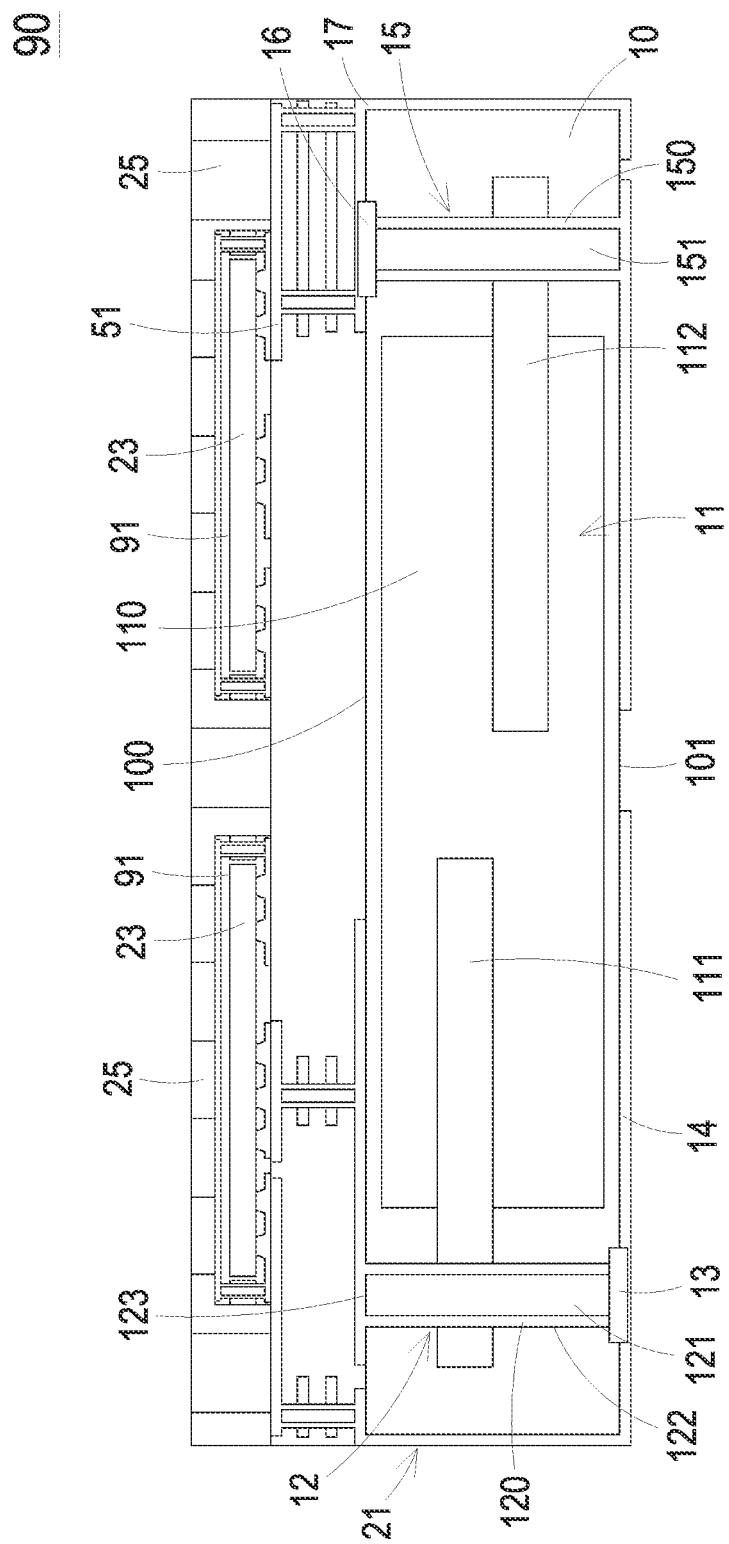
FIG. 26 is a schematic cross-sectional view illustrating a thirteenth example of a power module with the substrate of the present disclosure.

FIG. 26 is a schematic cross-sectional view illustrating a thirteenth example of a power module with the substrate of the present disclosure. The structure of the power module 90 of this embodiment is similar to that of the power module 50 as shown in FIG. 22. In comparison with the power module 50 of FIG. 22, the power module 90 of this embodiment further includes a second carrier plate 91. The second carrier plate 91 is disposed on the wiring layer 51. Moreover, the power unit 23 is embedded in the second carrier plate 91. The node between the first power switch and the second power switch of each power unit 23 is connected with the electrode on the top surface 100 of the first insulation layer 10 through the second carrier plate 91 and the wiring layer 51.

In some embodiments, at least one additional passive component 25 is disposed on the top surface of the second carrier plate 91. The additional passive component 25 on the top surface of the second carrier plate 91 is thinner than the passive component 25 on the top surface of the wiring layer 51. Moreover, the thickness of the power unit 23 embedded in the second carrier plate 91 is close to the thickness of the passive component 25 on the top surface of the wiring layer 51. Optionally, a metallic wiring layer is formed on the top surface of the power unit 23. The metallic wiring layer is extended to the top surface of the second carrier plate 91. Moreover, a copper block (not shown) is welded on the metallic wiring layer.

Figure 27A:
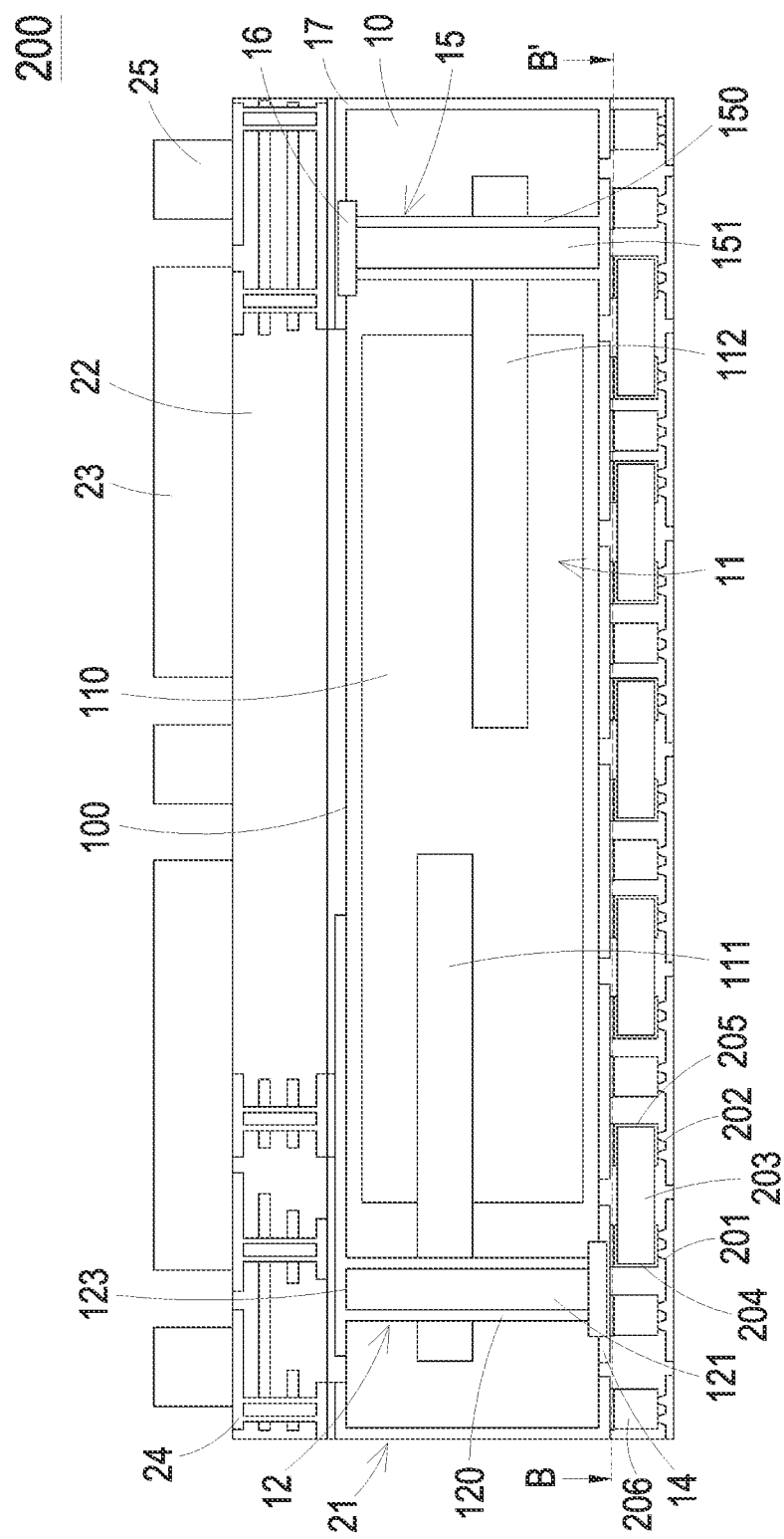
FIG. 27A is a schematic cross-sectional view illustrating a fourteenth example of a power module with the substrate of the present disclosure.
Figure 27B:
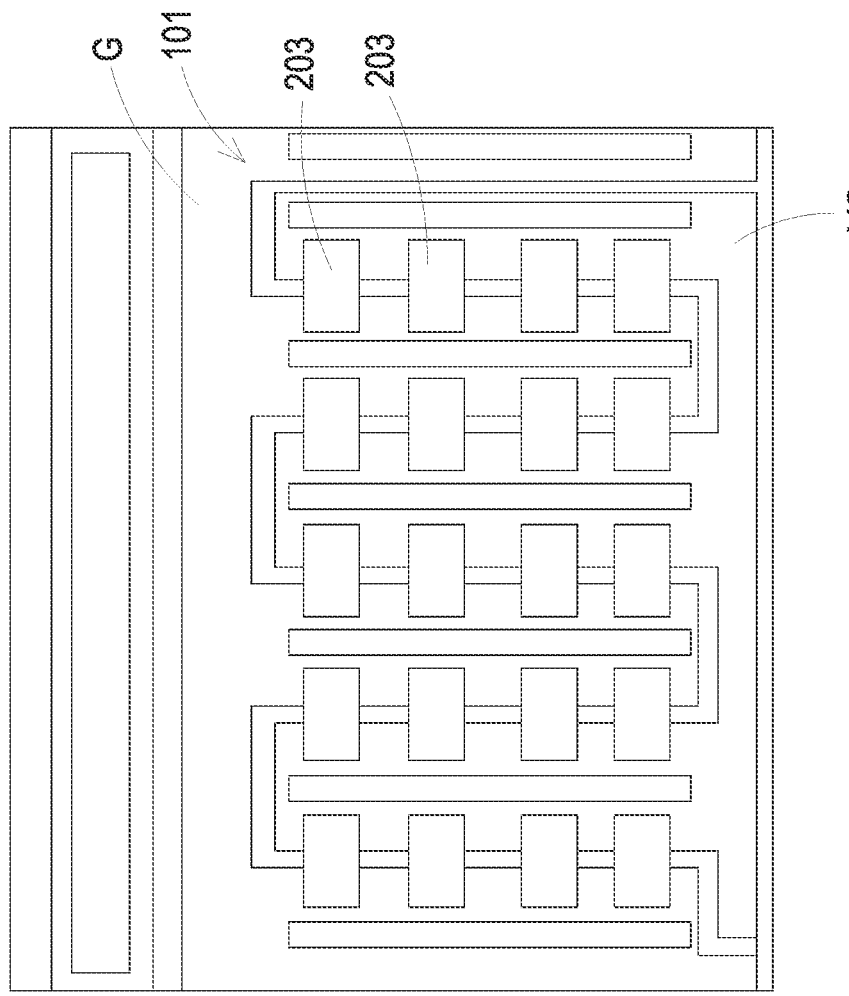
FIG. 27B is a cross-sectional view illustrating the power module of FIG. 27A and taken along the line B-B'.

Please refer to FIGS. 27A and 27B. FIG. 27A is a schematic cross-sectional view illustrating a fourteenth example of a power module with the substrate of the present disclosure. FIG. 27B is a schematic cross-sectional view illustrating the power module of FIG. 27A and taken along the line B-B'. The structure of the power module 200 of this embodiment is similar to that of the power module 30 as shown in FIG. 16. In comparison with the power module 30 of FIG. 16, the substrate 21 of the power module 200 of this embodiment further includes at least one first pin 201 and at least one second pin 202. The first pin 201 and the second pin 202 are located under the bottom surface 101 of the first insulation layer 10. Moreover, the power module 200 further includes at least one output capacitor 203. The output capacitor 203 can be applied to the output capacitor Co of FIG. 2. As shown in FIG. 2, the output capacitor 203 is connected with the output terminal of the voltage conversion circuit 18 and the ground terminal. The output capacitor 203 is located under the passive component 11. For example, the output capacitor 203 is disposed within the substrate 21 or disposed on the bottom surface 101 of the first insulation layer 10 of the substrate 21, and thus the output capacitor 203 is located under the passive component 11. The output capacitor 203 has a first terminal 204 and a second terminal 205 along the horizontal direction. The top side of the first terminal 204 of the output capacitor 203 is connected with the ground terminal of the voltage conversion circuit 18 (i.e., the ground terminal G as shown in FIG. 27B). The bottom side of the first terminal 204 of the output capacitor 203 is connected with the first pin 201. The top side of the second terminal 205 of the output capacitor 203 is connected with the output terminal of the voltage conversion circuit 18 (i.e., the output terminal VO as shown in FIG. 27B). The bottom side of the second terminal 205 of the output capacitor 203 is connected with the second pin 202. In the embodiment of FIG. 27B, the power module 200 includes a plurality of output capacitors. Since the power module 200 integrates the output capacitors 203, the layout space of the system board is saved. Moreover, since the distance between the power module 200 and the terminal load is very short, the connection impedance between the power module 200 and the terminal load is reduced. The output capacitors 203 can be used as energy storage elements. Moreover, the output capacitors 203 are helpful for flowing currents along the vertical direction. Alternatively, the capacitor structure shown in FIG. 20H can be utilized as the input capacitor, so as to convey current along the vertical direction and meet the requirement of high current-flowing capacity.

Optionally, the power module 200 of this embodiment further includes at least one copper block 206. The at least one copper block 206 is disposed on the bottom surface 101 of the first insulation layer 10. Due to the copper block 206, the heat dissipating efficiency and the current-flowing capacity of the power module 200 are increased.

From the above descriptions, the present disclosure provides a substrate, a manufacturing method of the substrate and a power module with the substrate. The first electrode connected with the node between the first power switch and the second power switch is disposed on the top surface of the first insulation layer of the substrate. Consequently, it is not necessary to retain a space on the system board for connecting the first electrode with the node. In such way, the layout area of the system board is saved. Moreover, since the node between the first power switch and the second power switch is a jumper point, the use of the substrate is capable of avoiding the influence of electromagnetic interference effectively. The passive component is embedded in the first insulation layer of the substrate. The first conducting terminal and the second conducting terminal of the inductor are protruded along the horizontal direction and arranged between the top surface and the bottom surface of the main body of the inductor. Since the thickness of the first insulation layer is small, the substrate is thin. Moreover, since the second electrode is in contact with the bottom surface of the first insulation layer, the thickness of the substrate is further reduced and the connection impedance is reduced. Moreover, since the substrate is slim and the top surface and the bottom surface of the first insulation layer are connected with each other through the first through-hole structure, the substrate has a good heat transfer path and the heat dissipation efficiency is enhanced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module, comprising:

a substrate comprising a first insulation layer, at least one passive component, at least one first through-hole structure, a second insulation layer, a first electrode and a second electrode, wherein the first insulation layer has a top surface and a bottom surface, the at least one passive component is embedded in the first insulation layer, each passive component comprises a first conducting terminal, the at least one first through-hole structure is formed in the first insulation layer and arranged beside a first side of the passive component, the first through-hole structure runs through the first insulation layer, the first through-hole structure comprises a conductive part and an insulation part, the insulation part is disposed within the conductive part, the conductive part of the first through-hole structure is in contact with the first conducting terminal and formed as the first electrode, the second insulation layer is disposed on portion of the conductive part of the first through-hole structure that is close to the bottom surface of the first insulation layer, at least part of the second electrode is disposed on the second insulation layer, and the second electrode is in contact with the bottom surface of the first insulation layer, wherein a projected area of the second electrode and a projected area of the first electrode along a direction perpendicular to the top surface of the first insulation layer are at least partially overlapped with each other, wherein the second electrode and the first electrode are different electrodes; and at least one power unit disposed on the substrate, wherein the at least one power unit comprises at least one half-bridge circuit, and the half-bridge circuit comprises a first power switch and a second power switch connected in series, wherein a second terminal of the first power switch and a first terminal of the second power switch are connected to a node;

a first carrier plate arranged between the at least one power unit and the substrate, wherein the first electrode is connected with the node through the first carrier plate; and at least one input capacitor comprising a first terminal and a second terminal, wherein a top surface of the first terminal of the at least one input capacitor is connected with a first terminal of the first power switch, a top surface of the second terminal of the at least one input capacitor is connected with a second terminal of the second power switch, and the at least one input capacitor is disposed between the at least one power unit and the substrate.

2. The power module according to claim 1, wherein the at least one input capacitor is disposed on a lower surface of the first carrier plate and located between the first carrier plate and the substrate.

3. The power module according to claim 1, wherein an electrode stacking direction of the first terminal and the second terminal of the at least one input capacitor is parallel to a stacking direction of the first carrier plate and the substrate.

4. The power module according to claim 2, wherein the top surface of the first terminal of the at least one input capacitors is connected with the lower surface of the first carrier plate, the top surface of the second terminal of the at least one input capacitors is connected with the lower surface of the first carrier plate, a lower surface of the first terminal of the at least one input capacitors is connected with the substrate, and a lower surface of the second terminal of the at least one input capacitors is connected with the substrate.

5. The power module according to claim 2, wherein the power module further comprises at least one first conductive component, wherein the at least one first conductive component is disposed between the first carrier plate and the substrate and connected to the first carrier plate and the substrate, wherein the at least one first conductive component is electrically coupled with the first terminal of the first power switch or the second terminal of the second power switch.

6. The power module according to claim 1, wherein the first carrier plate comprises a first terminal and a second terminal, and the first terminal and the second terminal of the first carrier plate are located on a lower surface of the first carrier plate, wherein the first terminal of the first carrier plate is connected to the first terminal of the first power switch, the second terminal of the first carrier plate is connected to the second terminal of the second power switch, and the first terminal and the second terminal of the first carrier plate are alternately arranged.

7. The power module according to claim 1, wherein an electrode stacking direction of the first terminal and the second terminal of the at least one input capacitor is perpendicular to a stacking direction of the first carrier plate and the substrate.

8. The power module according to claim 1, wherein the at least one input capacitor is embedded in the first carrier plate.

9. The power module according to claim 1, wherein the power module further comprises a molding compound layer, the molding compound layer covers the at least one input capacitor and at least a part of the first carrier plate, and a molding unit is formed by the molding compound layer, the at least one input capacitor and the first carrier plate, wherein the molding unit comprises a second conductive component, the second conductive component is extended from a lower surface of the molding unit to a top surface of the molding unit and forms terminals on the top surface and the lower surface of the molding unit.

10. The power module according to claim 9, wherein the molding compound layer covers the at least one power unit located on a top surface of the first carrier plate.

* * * * *